United States Patent
Shaw et al.

(10) Patent No.: US 10,963,087 B2
(45) Date of Patent: Mar. 30, 2021

(54) PRESSURE SENSITIVE KEYS

(71) Applicant: Microsoft Technology Licensing, LLC, Redmond, WA (US)

(72) Inventors: Timothy C. Shaw, Austin, TX (US); Jim Tom Belesiu, Kirkland, WA (US); Paul Henry Dietz, Redmond, WA (US); Christopher Harry Stoumbos, Sammamish, WA (US); Dennis J. Mathias, Kenmore, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/249,952

(22) Filed: Aug. 29, 2016

(65) Prior Publication Data
US 2017/0131819 A1    May 11, 2017

Related U.S. Application Data

(63) Continuation of application No. 13/468,882, filed on May 10, 2012, now Pat. No. 9,460,029.
(Continued)

(51) Int. Cl.
*H01H 13/70* (2006.01)
*H01H 13/702* (2006.01)
(Continued)

(52) U.S. Cl.
CPC ........ *G06F 3/0414* (2013.01); *E05D 11/1064* (2013.01); *E05F 5/08* (2013.01);
(Continued)

(58) Field of Classification Search
CPC .................. G06F 3/0414; G06F 3/045; G06F 2203/04105; H01H 13/702; H01H 13/785;
(Continued)

(56) References Cited

U.S. PATENT DOCUMENTS

| 578,325 A | | 3/1897 | Fleming |
|---|---|---|---|
| 3,145,924 A | * | 8/1964 | Rosener ................. 235/60 MT |

(Continued)

FOREIGN PATENT DOCUMENTS

| CA | 990023 | 6/1976 |
|---|---|---|
| CH | S87757 A5 | 2/1997 |

(Continued)

OTHER PUBLICATIONS

"Accessing Device Sensors", retrieved from <https://developer.palm.com/content/api/dev-guide/pdk/accessing-device-sensors.html> on May 25, 2012, 2011, 4 pages.
(Continued)

*Primary Examiner* — Michael J Eurice

(57) ABSTRACT

Pressure sensitive key techniques are described. In one or more implementations, a device includes at least one pressure sensitive key having a flexible contact layer spaced apart from a sensor substrate by a spacer layer, the flexible contact layer configured to flex responsive to pressure to contact the sensor substrate to initiate an input, for a computing device, associated with the pressure sensitive key. At least one of the flexible contact layer or the sensor substrate are configured to at least partially normalize an output resulting from pressure applied at a first location of the flexible contact layer with an output resulting from pressure applied at a second location of the flexible contact layer that has lesser flexibility than the first location.

20 Claims, 6 Drawing Sheets

Related U.S. Application Data

(60) Provisional application No. 61/613,745, filed on Mar. 21, 2012, provisional application No. 61/607,451, filed on Mar. 6, 2012, provisional application No. 61/606,321, filed on Mar. 2, 2012, provisional application No. 61/606,336, filed on Mar. 2, 2012, provisional application No. 61/606,313, filed on Mar. 2, 2012, provisional application No. 61/606,301, filed on Mar. 2, 2012, provisional application No. 61/606,333, filed on Mar. 2, 2012.

(51) Int. Cl.
| | | |
|---|---|---|
| H01H 13/703 | (2006.01) | |
| H01H 13/78 | (2006.01) | |
| G06F 3/041 | (2006.01) | |
| G06F 1/16 | (2006.01) | |
| H04M 1/02 | (2006.01) | |
| G06F 3/02 | (2006.01) | |
| H04M 1/72409 | (2021.01) | |
| H05K 5/02 | (2006.01) | |
| G06F 3/023 | (2006.01) | |
| E05D 11/10 | (2006.01) | |
| E05F 5/08 | (2006.01) | |
| F16M 11/38 | (2006.01) | |
| G06F 13/10 | (2006.01) | |
| H01H 11/00 | (2006.01) | |
| H01H 13/807 | (2006.01) | |
| H01H 13/82 | (2006.01) | |
| G06F 3/0488 | (2013.01) | |
| H01H 9/26 | (2006.01) | |

(52) U.S. Cl.
CPC ............. *F16M 11/38* (2013.01); *G06F 1/166* (2013.01); *G06F 1/1616* (2013.01); *G06F 1/1618* (2013.01); *G06F 1/1637* (2013.01); *G06F 1/1654* (2013.01); *G06F 1/1656* (2013.01); *G06F 1/1662* (2013.01); *G06F 1/1669* (2013.01); *G06F 1/1681* (2013.01); *G06F 1/1684* (2013.01); *G06F 3/02* (2013.01); *G06F 3/0202* (2013.01); *G06F 3/023* (2013.01); *G06F 3/0219* (2013.01); *G06F 3/0416* (2013.01); *G06F 3/04886* (2013.01); *G06F 13/102* (2013.01); *H01H 11/00* (2013.01); *H01H 13/807* (2013.01); *H01H 13/82* (2013.01); *H04M 1/0216* (2013.01); *H04M 1/0254* (2013.01); *H04M 1/72409* (2021.01); *H05K 5/0226* (2013.01); *H05K 5/0234* (2013.01); *H01H 9/26* (2013.01); *H01H 2201/036* (2013.01); *H01H 2203/02* (2013.01); *H01H 2203/036* (2013.01); *H01H 2203/058* (2013.01); *H01H 2205/006* (2013.01); *H01H 2211/004* (2013.01); *H01H 2211/006* (2013.01); *H01H 2213/016* (2013.01); *H01H 2217/006* (2013.01); *H01H 2227/032* (2013.01); *H04M 1/0245* (2013.01); *Y02D 10/00* (2018.01); *Y10T 16/5401* (2015.01); *Y10T 16/551* (2015.01); *Y10T 29/49826* (2015.01)

(58) Field of Classification Search
CPC .... H01H 13/703; H01H 13/807; H01H 13/78; H01H 13/79; H01H 2201/036; H01H 2217/01; H01H 2217/004; H01H 2203/058; H01H 2239/078; H01H 2229/038

See application file for complete search history.

(56) References Cited

U.S. PATENT DOCUMENTS

| | | | |
|---|---|---|---|
| 3,542,453 A | | 11/1970 | Kantor |
| 3,600,528 A | * | 8/1971 | Leposavic .................. B41J 5/12 200/308 |
| 3,777,082 A | * | 12/1973 | Hatley ........................ B41J 5/08 200/275 |
| 3,879,586 A | * | 4/1975 | DuRocher ............ H01H 13/702 200/5 A |
| 3,968,336 A | | 7/1976 | Johnson |
| 4,046,975 A | | 9/1977 | Seeger, Jr. |
| 4,065,649 A | | 12/1977 | Carter et al. |
| 4,086,451 A | | 4/1978 | Boulanger |
| 4,237,347 A | | 12/1980 | Burundukov et al. |
| 4,239,338 A | | 12/1980 | Borrelli et al. |
| 4,243,861 A | | 1/1981 | Strandwitz |
| 4,251,791 A | | 2/1981 | Yanagisawa et al. |
| 4,261,042 A | | 4/1981 | Ishiwatari et al. |
| 4,279,021 A | | 7/1981 | See et al. |
| 4,294,507 A | | 10/1981 | Johnson |
| 4,302,648 A | | 11/1981 | Sado et al. |
| 4,317,011 A | | 2/1982 | Mazurk |
| 4,317,013 A | | 2/1982 | Larson |
| 4,323,740 A | * | 4/1982 | Balash .................. H01H 13/702 200/5 A |
| 4,326,193 A | | 4/1982 | Markley et al. |
| 4,365,130 A | | 12/1982 | Christensen |
| 4,375,018 A | | 2/1983 | Petersen |
| 4,451,113 A | | 5/1984 | Zuniga |
| 4,492,829 A | | 1/1985 | Rodrique |
| 4,503,294 A | | 3/1985 | Matsumaru |
| 4,527,021 A | * | 7/1985 | Morikawa ............ H01H 13/702 200/5 A |
| 4,559,426 A | | 12/1985 | Van Zeeland et al. |
| 4,576,436 A | | 3/1986 | Daniel |
| 4,577,822 A | | 3/1986 | Wilkerson |
| 4,588,187 A | | 5/1986 | Dell |
| 4,602,135 A | | 7/1986 | Phalen |
| 4,607,147 A | | 8/1986 | Ono et al. |
| 4,615,579 A | | 10/1986 | Whitehead |
| 4,643,604 A | | 2/1987 | Enrico |
| 4,651,133 A | | 3/1987 | Ganesan et al. |
| 4,652,704 A | * | 3/1987 | Franklin .............. H01H 13/702 200/275 |
| 4,684,767 A | | 8/1987 | Phalen |
| 4,724,605 A | | 2/1988 | Fiorella |
| 4,735,394 A | | 4/1988 | Facco |
| 4,735,495 A | | 4/1988 | Henkes |
| 4,758,087 A | | 7/1988 | Hicks, Jr. |
| 4,795,977 A | | 1/1989 | Frost et al. |
| 4,799,752 A | | 1/1989 | Carome |
| 4,801,771 A | | 1/1989 | Mizuguchi et al. |
| 4,824,268 A | | 4/1989 | Diernisse |
| 4,864,084 A | | 9/1989 | Cardinale |
| 4,983,787 A | | 1/1991 | Kunikane |
| 4,990,900 A | | 2/1991 | Kikuchi |
| 4,996,511 A | | 2/1991 | Ohkawa et al. |
| 5,004,673 A | | 4/1991 | Vlannes |
| 5,008,497 A | | 4/1991 | Asher |
| 5,019,898 A | | 5/1991 | Chao et al. |
| 5,021,638 A | | 6/1991 | Nopper et al. |
| 5,053,585 A | * | 10/1991 | Yaniger ................. G06F 3/023 178/18.05 |
| 5,067,573 A | | 11/1991 | Uchida |
| 5,106,181 A | | 4/1992 | Rockwell, III |
| 5,107,401 A | | 4/1992 | Youn |
| 5,111,223 A | | 5/1992 | Omura |
| 5,128,829 A | | 7/1992 | Loew |
| 5,138,119 A | | 8/1992 | Demeo |
| 5,149,923 A | | 9/1992 | Demeo |
| 5,204,517 A | | 4/1993 | Cates et al. |
| 5,218,177 A | | 6/1993 | Coleman et al. |
| 5,220,318 A | | 6/1993 | Staley |
| 5,220,521 A | | 6/1993 | Kikinis |
| 5,235,495 A | | 8/1993 | Blair et al. |
| 5,243,162 A | | 9/1993 | Kobayashi |

(56) References Cited

U.S. PATENT DOCUMENTS

| | | |
|---|---|---|
| 5,249,978 A | 10/1993 | Gazda et al. |
| 5,253,362 A | 10/1993 | Nolan et al. |
| 5,283,559 A | 2/1994 | Kalendra et al. |
| 5,313,535 A | 5/1994 | Williams |
| 5,319,455 A | 6/1994 | Hoarty et al. |
| 5,331,443 A | 7/1994 | Stanisci |
| 5,339,382 A | 8/1994 | Whitehead |
| 5,340,528 A | 8/1994 | Machida et al. |
| 5,349,403 A | 9/1994 | Lo |
| 5,363,075 A | 11/1994 | Fanucchi |
| 5,375,076 A | 12/1994 | Goodrich et al. |
| 5,404,133 A | 4/1995 | Moriike et al. |
| 5,406,415 A | 4/1995 | Kelly |
| 5,480,118 A | 1/1996 | Cross |
| 5,491,313 A | 2/1996 | Bartley et al. |
| 5,510,783 A | 4/1996 | Findlater et al. |
| 5,546,271 A | 8/1996 | Gut et al. |
| 5,548,477 A | 8/1996 | Kumar et al. |
| 5,549,212 A | 8/1996 | Kanoh et al. |
| 5,558,577 A | 9/1996 | Kato |
| 5,576,981 A | 11/1996 | Parker et al. |
| 5,581,682 A | 12/1996 | Anderson et al. |
| 5,584,713 A | 12/1996 | Kato et al. |
| 5,596,700 A | 1/1997 | Darnell et al. |
| 5,617,343 A | 4/1997 | Danielson et al. |
| 5,618,232 A | 4/1997 | Martin |
| 5,621,494 A | 4/1997 | Kazumi et al. |
| 5,648,643 A | 7/1997 | Knowles et al. |
| 5,661,279 A | 8/1997 | Kenmochi |
| 5,666,112 A * | 9/1997 | Crowley .............. G06F 3/0202 200/5 A |
| 5,675,361 A | 10/1997 | Santilli |
| 5,681,220 A | 10/1997 | Bertram et al. |
| 5,712,995 A | 1/1998 | Cohn |
| 5,737,183 A | 4/1998 | Kobayashi et al. |
| 5,745,376 A | 4/1998 | Barker et al. |
| 5,748,114 A | 5/1998 | Koehn |
| 5,750,939 A | 5/1998 | Makinwa et al. |
| 5,771,042 A | 6/1998 | Santos-Gomez |
| 5,772,903 A | 6/1998 | Hirsch |
| 5,781,406 A | 7/1998 | Hunte |
| 5,803,748 A | 9/1998 | Maddrell et al. |
| 5,806,955 A | 9/1998 | Parkyn, Jr. et al. |
| 5,807,175 A | 9/1998 | Davis et al. |
| 5,808,713 A | 9/1998 | Broer et al. |
| 5,818,361 A | 10/1998 | Acevedo |
| 5,825,982 A | 10/1998 | Wright et al. |
| 5,828,770 A | 10/1998 | Leis et al. |
| 5,838,403 A | 11/1998 | Jannson et al. |
| 5,842,027 A | 11/1998 | Oprescu et al. |
| 5,850,135 A | 12/1998 | Kuki et al. |
| 5,861,990 A | 1/1999 | Tedesco |
| 5,874,697 A | 2/1999 | Selker et al. |
| 5,880,725 A | 3/1999 | Southgate |
| 5,886,675 A | 3/1999 | Aye et al. |
| 5,905,485 A | 5/1999 | Podoloff |
| 5,909,211 A | 6/1999 | Combs et al. |
| 5,920,315 A | 7/1999 | Santos-Gomez |
| 5,920,317 A | 7/1999 | McDonald |
| 5,921,652 A | 7/1999 | Parker et al. |
| 5,924,555 A | 7/1999 | Sadamori et al. |
| 5,926,170 A | 7/1999 | Oba |
| 5,929,946 A | 7/1999 | Sharp et al. |
| 5,948,990 A | 9/1999 | Hashida |
| 5,957,191 A | 9/1999 | Okada et al. |
| 5,967,637 A | 10/1999 | Ishikawa et al. |
| 5,971,635 A | 10/1999 | Wise |
| 5,973,677 A | 10/1999 | Gibbons |
| 5,982,612 A * | 11/1999 | Roylance ............. G06F 1/1622 361/679.08 |
| 5,991,087 A | 11/1999 | Rallison |
| 5,995,026 A | 11/1999 | Sellers |
| 5,995,081 A | 11/1999 | Kato |
| 5,995,084 A | 11/1999 | Chan et al. |
| 5,999,147 A | 12/1999 | Teitel |
| 6,002,389 A | 12/1999 | Kasser |
| 6,002,581 A | 12/1999 | Lindsey |
| 6,005,209 A | 12/1999 | Burleson et al. |
| 6,012,714 A | 1/2000 | Worley et al. |
| 6,014,800 A | 1/2000 | Lee |
| 6,040,823 A * | 3/2000 | Seffernick ............. G06F 3/0213 341/34 |
| 6,042,075 A | 3/2000 | Burch, Jr. |
| 6,044,717 A | 4/2000 | Biegelsen et al. |
| 6,046,857 A | 4/2000 | Morishima et al. |
| 6,055,705 A | 5/2000 | Komatsu et al. |
| 6,061,644 A | 5/2000 | Leis |
| 6,072,551 A | 6/2000 | Jannson et al. |
| 6,108,200 A | 8/2000 | Fullerton |
| 6,111,527 A * | 8/2000 | Susel .................... G06F 3/0221 341/20 |
| 6,112,797 A | 9/2000 | Colson et al. |
| 6,124,906 A | 9/2000 | Kawada et al. |
| 6,128,007 A | 10/2000 | Seybold |
| 6,129,444 A | 10/2000 | Tognoni |
| 6,141,388 A | 10/2000 | Servais et al. |
| 6,144,439 A | 11/2000 | Carollo |
| 6,147,859 A | 11/2000 | Abboud |
| 6,151,486 A | 11/2000 | Holshouser et al. |
| 6,160,264 A | 12/2000 | Rebiere |
| 6,169,829 B1 | 1/2001 | Laming et al. |
| 6,172,807 B1 | 1/2001 | Akamatsu |
| 6,178,085 B1 | 1/2001 | Leung |
| 6,178,443 B1 | 1/2001 | Lin |
| 6,181,852 B1 | 1/2001 | Adams et al. |
| 6,188,391 B1 | 2/2001 | Seely et al. |
| 6,195,136 B1 | 2/2001 | Handschy et al. |
| 6,215,590 B1 | 4/2001 | Okano |
| 6,228,926 B1 | 5/2001 | Golumbic |
| 6,232,934 B1 | 5/2001 | Heacock et al. |
| 6,234,820 B1 | 5/2001 | Perino et al. |
| 6,238,078 B1 | 5/2001 | Hed |
| 6,254,105 B1 | 7/2001 | Rinde et al. |
| 6,256,447 B1 | 7/2001 | Laine |
| 6,266,685 B1 | 7/2001 | Danielson et al. |
| 6,278,490 B1 | 8/2001 | Fukuda et al. |
| 6,279,060 B1 | 8/2001 | Luke et al. |
| 6,300,986 B1 | 10/2001 | Travis |
| 6,305,073 B1 | 10/2001 | Badders |
| 6,323,949 B1 | 11/2001 | Lading et al. |
| 6,329,617 B1 | 12/2001 | Burgess |
| 6,342,871 B1 | 1/2002 | Takeyama |
| 6,344,791 B1 | 2/2002 | Armstrong |
| 6,351,273 B1 | 2/2002 | Lemelson et al. |
| 6,353,503 B1 | 3/2002 | Spitzer et al. |
| 6,362,861 B1 | 3/2002 | Hertz et al. |
| 6,366,440 B1 | 4/2002 | Kung |
| 6,377,685 B1 * | 4/2002 | Krishnan ............. G06F 3/0202 379/433.07 |
| 6,380,497 B1 | 4/2002 | Hashimoto et al. |
| 6,411,266 B1 | 6/2002 | Maguire, Jr. |
| 6,417,892 B1 | 7/2002 | Sharp et al. |
| 6,437,682 B1 * | 8/2002 | Vance .................... H01H 13/70 200/5 A |
| 6,441,362 B1 | 8/2002 | Ogawa |
| 6,442,764 B1 | 9/2002 | Badillo et al. |
| 6,450,046 B1 | 9/2002 | Maeda |
| 6,468,672 B1 | 10/2002 | Donova et al. |
| 6,469,755 B1 | 10/2002 | Adachi et al. |
| 6,483,580 B1 | 11/2002 | Xu et al. |
| 6,506,983 B1 | 1/2003 | Babb et al. |
| 6,511,378 B1 | 1/2003 | Bhatt et al. |
| 6,529,179 B1 | 3/2003 | Hashimoto et al. |
| 6,532,035 B1 | 3/2003 | Saari et al. |
| 6,532,147 B1 | 3/2003 | Christ, Jr. |
| 6,543,949 B1 | 4/2003 | Ritchey et al. |
| 6,545,577 B2 | 4/2003 | Yap |
| 6,553,165 B1 | 4/2003 | Temkin et al. |
| 6,555,024 B2 | 4/2003 | Ueda et al. |
| 6,565,439 B2 | 5/2003 | Shinohara et al. |
| 6,574,030 B1 | 6/2003 | Mosier |
| 6,585,435 B2 | 7/2003 | Fang |
| 6,597,347 B1 | 7/2003 | Yasutake |
| 6,600,121 B1 | 7/2003 | Olodort et al. |

(56) References Cited

U.S. PATENT DOCUMENTS

| | | |
|---|---|---|
| 6,603,408 B1 | 8/2003 | Gaba |
| 6,603,461 B2 | 8/2003 | Smith, Jr. et al. |
| 6,608,664 B1 | 8/2003 | Hasegawa |
| 6,617,536 B2 | 9/2003 | Kawaguchi |
| 6,648,485 B1 | 11/2003 | Colgan et al. |
| 6,651,943 B2 | 11/2003 | Cho et al. |
| 6,661,436 B2 | 12/2003 | Barksdale et al. |
| 6,675,865 B1 | 1/2004 | Yoshida |
| 6,681,333 B1 | 1/2004 | Cho |
| 6,684,166 B2 | 1/2004 | Bellwood et al. |
| 6,685,369 B2 | 2/2004 | Lien |
| 6,687,614 B2 | 2/2004 | Ihara et al. |
| 6,695,273 B2 | 2/2004 | Iguchi |
| 6,700,617 B1 | 3/2004 | Hamamura et al. |
| 6,704,005 B2 | 3/2004 | Kato et al. |
| 6,704,864 B1 | 3/2004 | Philyaw |
| 6,721,019 B2 | 4/2004 | Kono et al. |
| 6,725,318 B1 | 4/2004 | Sherman et al. |
| 6,738,049 B2 | 5/2004 | Kiser et al. |
| 6,753,920 B1 | 6/2004 | Momose et al. |
| 6,758,615 B2 | 7/2004 | Monney et al. |
| 6,774,888 B1 | 8/2004 | Genduso |
| 6,776,546 B2 | 8/2004 | Kraus et al. |
| 6,780,019 B1 | 8/2004 | Ghosh et al. |
| 6,781,819 B2 | 8/2004 | Yang et al. |
| 6,784,869 B1 | 8/2004 | Clark et al. |
| 6,790,054 B1 | 9/2004 | Boonsue |
| 6,792,328 B2 | 9/2004 | Laughery et al. |
| 6,795,146 B2 | 9/2004 | Dozov et al. |
| 6,798,887 B1 | 9/2004 | Andre |
| 6,813,143 B2 | 11/2004 | Makela |
| 6,819,082 B2 | 11/2004 | Yang |
| 6,819,316 B2 | 11/2004 | Schulz et al. |
| 6,819,547 B2 | 11/2004 | Minaguchi et al. |
| 6,833,955 B2 | 12/2004 | Niv |
| 6,847,488 B2 | 1/2005 | Travis |
| 6,856,506 B2 | 2/2005 | Doherty et al. |
| 6,856,789 B2 | 2/2005 | Pattabiraman et al. |
| 6,859,565 B2 | 2/2005 | Baron |
| 6,861,961 B2 | 3/2005 | Sandbach et al. |
| 6,864,573 B2 | 3/2005 | Robertson et al. |
| 6,867,828 B2 | 3/2005 | Taira et al. |
| 6,870,671 B2 | 3/2005 | Travis |
| 6,880,132 B2 | 4/2005 | Uemura |
| 6,882,337 B2 | 4/2005 | Shetter |
| 6,895,164 B2 | 5/2005 | Saccomanno |
| 6,898,315 B2 | 5/2005 | Guha |
| 6,902,214 B2 | 6/2005 | Smith |
| 6,909,354 B2 | 6/2005 | Baker et al. |
| 6,914,197 B2 | 7/2005 | Doherty et al. |
| 6,916,584 B2 | 7/2005 | Sreenivasan et al. |
| 6,922,333 B2 | 7/2005 | Weng et al. |
| 6,929,291 B2 | 8/2005 | Chen |
| 6,948,136 B2 | 9/2005 | Trewin |
| 6,950,950 B2 | 9/2005 | Sawyers et al. |
| 6,962,454 B1 | 11/2005 | Costello |
| 6,970,957 B1 | 11/2005 | Oshins et al. |
| 6,976,799 B2 | 12/2005 | Kim et al. |
| 6,976,999 B2 | 12/2005 | Charlebois et al. |
| 6,977,352 B2 | 12/2005 | Oosawa |
| 6,979,799 B2 | 12/2005 | Centner |
| 6,980,177 B2 | 12/2005 | Struyk |
| 6,981,792 B2 | 1/2006 | Nagakubo et al. |
| 6,981,887 B1 | 1/2006 | Mese et al. |
| 7,002,624 B1 | 2/2006 | Uchino et al. |
| 7,006,080 B2 | 2/2006 | Gettemy |
| 7,007,238 B2 | 2/2006 | Glaser |
| 7,018,678 B2 | 3/2006 | Gronbeck et al. |
| 7,019,491 B2 | 3/2006 | Bozzone et al. |
| 7,023,430 B2 | 4/2006 | Liu et al. |
| 7,025,908 B1 | 4/2006 | Hayashi et al. |
| 7,031,894 B2 | 4/2006 | Niu et al. |
| 7,051,149 B2 | 5/2006 | Wang et al. |
| 7,058,252 B2 | 6/2006 | Woodgate et al. |
| 7,066,634 B2 | 6/2006 | Kitamura et al. |
| 7,068,496 B2 | 6/2006 | Wong et al. |
| 7,073,933 B2 | 7/2006 | Gotoh et al. |
| 7,083,295 B1 | 8/2006 | Hanna |
| 7,091,436 B2 | 8/2006 | Serban |
| 7,091,955 B2 | 8/2006 | Kramer |
| 7,095,404 B2 | 8/2006 | Vincent et al. |
| 7,099,005 B2 | 8/2006 | Fabrikant et al. |
| 7,099,149 B2 | 8/2006 | Krieger et al. |
| 7,101,048 B2 | 9/2006 | Travis |
| 7,102,683 B2 | 9/2006 | Perry et al. |
| 7,104,679 B2 | 9/2006 | Shin et al. |
| 7,106,222 B2 | 9/2006 | Ward et al. |
| 7,116,309 B1 | 10/2006 | Kimura et al. |
| 7,123,241 B2 | 10/2006 | Bathiche |
| 7,123,292 B1 | 10/2006 | Seeger et al. |
| 7,129,979 B1 | 10/2006 | Lee |
| 7,136,282 B1 | 11/2006 | Rebeske |
| 7,151,635 B2 | 12/2006 | Bidnyk et al. |
| 7,152,985 B2 | 12/2006 | Benitez et al. |
| 7,153,017 B2 | 12/2006 | Yamashita et al. |
| D535,292 S | 1/2007 | Shi et al. |
| 7,159,132 B2 | 1/2007 | Takahashi et al. |
| 7,162,153 B2 | 1/2007 | Harter, Jr. et al. |
| 7,169,460 B1 | 1/2007 | Chen et al. |
| 7,181,699 B2 | 2/2007 | Morrow et al. |
| 7,189,362 B2 | 3/2007 | Nordin et al. |
| 7,194,662 B2 | 3/2007 | Do et al. |
| 7,196,758 B2 | 3/2007 | Crawford et al. |
| 7,199,554 B2 | 4/2007 | Kim et al. |
| 7,199,931 B2 | 4/2007 | Boettiger et al. |
| 7,201,508 B2 | 4/2007 | Misaras |
| 7,202,837 B2 | 4/2007 | Ihara |
| 7,212,709 B2 | 5/2007 | Hosoi |
| 7,212,723 B2 | 5/2007 | McLeod et al. |
| 7,213,323 B2 | 5/2007 | Baker et al. |
| 7,213,991 B2 | 5/2007 | Chapman et al. |
| 7,218,830 B2 | 5/2007 | Iimura |
| 7,224,830 B2 | 5/2007 | Nefian et al. |
| 7,239,505 B2 | 7/2007 | Keely et al. |
| 7,252,512 B2 | 8/2007 | Tai et al. |
| 7,260,221 B1 | 8/2007 | Atsmon |
| 7,260,823 B2 | 8/2007 | Schlack et al. |
| 7,261,827 B2 | 8/2007 | Ootsu et al. |
| 7,277,087 B2 | 10/2007 | Hill et al. |
| 7,280,348 B2 | 10/2007 | Ghosh |
| 7,283,353 B1 | 10/2007 | Jordan et al. |
| 7,287,738 B2 | 10/2007 | Pitlor |
| 7,295,720 B2 | 11/2007 | Raskar |
| 7,301,759 B2 | 11/2007 | Hsiung |
| 7,311,526 B2 | 12/2007 | Rohrbach et al. |
| 7,331,793 B2 | 2/2008 | Hernandez et al. |
| 7,333,690 B1 | 2/2008 | Peale et al. |
| 7,348,513 B2 | 3/2008 | Lin |
| 7,364,343 B2 | 4/2008 | Keuper et al. |
| 7,365,967 B2 | 4/2008 | Zheng |
| 7,370,342 B2 | 5/2008 | Ismail et al. |
| 7,372,565 B1 | 5/2008 | Holden et al. |
| 7,374,312 B2 | 5/2008 | Feng et al. |
| 7,375,885 B2 | 5/2008 | Ijzerman et al. |
| 7,379,094 B2 | 5/2008 | Yoshida et al. |
| 7,384,178 B2 | 6/2008 | Sumida et al. |
| 7,400,377 B2 | 7/2008 | Evans et al. |
| 7,400,452 B2 | 7/2008 | Detro et al. |
| 7,400,805 B2 | 7/2008 | Abu-Ageel |
| 7,400,817 B2 | 7/2008 | Lee et al. |
| 7,401,992 B1 | 7/2008 | Lin |
| 7,410,286 B2 | 8/2008 | Travis |
| 7,415,676 B2 | 8/2008 | Fujita |
| 7,417,564 B2 | 8/2008 | Tolonen et al. |
| 7,417,626 B2 | 8/2008 | Bhesania et al. |
| 7,423,557 B2 | 9/2008 | Kang |
| 7,431,489 B2 | 10/2008 | Yeo et al. |
| 7,437,193 B2 | 10/2008 | Parramon et al. |
| 7,437,678 B2 | 10/2008 | Awada et al. |
| 7,443,443 B2 | 10/2008 | Raskar et al. |
| 7,447,922 B1 | 11/2008 | Asbury et al. |
| 7,447,934 B2 | 11/2008 | Dasari et al. |
| 7,453,376 B2 | 11/2008 | De |
| 7,454,712 B2 | 11/2008 | Schultz |

(56) References Cited

U.S. PATENT DOCUMENTS

| | | |
|---|---|---|
| 7,457,108 B2 | 11/2008 | Ghosh |
| 7,467,948 B2 | 12/2008 | Lindberg et al. |
| 7,469,386 B2 | 12/2008 | Bear et al. |
| 7,486,165 B2 | 2/2009 | Ligtenberg et al. |
| 7,486,276 B2 | 2/2009 | Yajima et al. |
| 7,499,037 B2 | 3/2009 | Lube |
| 7,499,216 B2 | 3/2009 | Niv et al. |
| 7,502,803 B2 | 3/2009 | Culter et al. |
| 7,503,684 B2 | 3/2009 | Ueno et al. |
| 7,509,042 B2 | 3/2009 | Mori et al. |
| 7,513,627 B2 | 4/2009 | Larson et al. |
| 7,515,143 B2 | 4/2009 | Keam et al. |
| 7,528,337 B2 | 5/2009 | Tanabe et al. |
| 7,528,374 B2 | 5/2009 | Smitt et al. |
| 7,532,227 B2 | 5/2009 | Nakajima et al. |
| 7,539,882 B2 | 5/2009 | Jessup et al. |
| 7,541,907 B2 | 6/2009 | Wang et al. |
| 7,542,052 B2 | 6/2009 | Solomon et al. |
| 7,545,429 B2 | 6/2009 | Travis |
| 7,558,594 B2 | 7/2009 | Wilson |
| 7,559,834 B1 | 7/2009 | York |
| 7,561,131 B2 | 7/2009 | Ijzerman et al. |
| 7,572,045 B2 | 8/2009 | Hoelen et al. |
| RE40,891 E | 9/2009 | Yasutake |
| 7,594,638 B2 | 9/2009 | Chan et al. |
| 7,612,882 B2 | 11/2009 | Wu et al. |
| 7,620,244 B1 | 11/2009 | Collier |
| 7,622,907 B2 | 11/2009 | Vranish |
| 7,623,121 B2 | 11/2009 | Dodge |
| 7,626,358 B2 | 12/2009 | Lam et al. |
| 7,626,582 B1 | 12/2009 | Nicolas et al. |
| 7,629,966 B2 | 12/2009 | Anson |
| 7,631,327 B2 | 12/2009 | Dempski et al. |
| 7,636,921 B2 | 12/2009 | Louie |
| 7,639,329 B2 | 12/2009 | Takeda et al. |
| 7,639,876 B2 | 12/2009 | Clary et al. |
| 7,643,213 B2 | 1/2010 | Boettiger et al. |
| 7,656,392 B2 | 2/2010 | Bolender |
| 7,660,047 B1 | 2/2010 | Travis et al. |
| 7,675,598 B2 | 3/2010 | Hong |
| 7,686,066 B2 | 3/2010 | Hirao |
| 7,686,694 B2 | 3/2010 | Cole |
| 7,693,654 B1 | 4/2010 | Dietsch et al. |
| 7,705,558 B2 | 4/2010 | Silverman |
| 7,715,187 B2 | 5/2010 | Hotelling et al. |
| 7,716,003 B1 | 5/2010 | Wack et al. |
| 7,719,769 B2 | 5/2010 | Sugihara et al. |
| 7,722,358 B2 | 5/2010 | Chatterjee et al. |
| 7,722,792 B2 | 5/2010 | Uezaki et al. |
| 7,724,952 B2 | 5/2010 | Shum et al. |
| 7,728,923 B2 | 6/2010 | Kim et al. |
| 7,728,933 B2 | 6/2010 | Kim et al. |
| 7,729,493 B2 | 6/2010 | Krieger et al. |
| 7,731,147 B2 | 6/2010 | Rha |
| 7,733,326 B1 | 6/2010 | Adiseshan |
| 7,761,119 B2 | 7/2010 | Patel |
| 7,773,076 B2 | 8/2010 | Pittel et al. |
| 7,773,121 B1 | 8/2010 | Huntsberger et al. |
| 7,774,155 B2 | 8/2010 | Sato et al. |
| 7,775,567 B2 | 8/2010 | Ligtenberg et al. |
| 7,777,972 B1 | 8/2010 | Chen et al. |
| 7,782,341 B2 | 8/2010 | Kothandaraman |
| 7,782,342 B2 | 8/2010 | Koh |
| 7,788,474 B2 | 8/2010 | Switzer et al. |
| 7,800,708 B2 | 9/2010 | Brott et al. |
| 7,813,715 B2 | 10/2010 | McKillop et al. |
| 7,815,358 B2 | 10/2010 | Inditsky |
| 7,817,428 B2 | 10/2010 | Greer, Jr. et al. |
| 7,822,338 B2 | 10/2010 | Wernersson |
| 7,826,508 B2 | 11/2010 | Reid et al. |
| 7,844,985 B2 | 11/2010 | Hendricks et al. |
| 7,852,621 B2 | 12/2010 | Lin et al. |
| 7,855,716 B2 | 12/2010 | McCreary et al. |
| 7,865,639 B2 | 1/2011 | McCoy et al. |
| 7,871,811 B2 | 1/2011 | Fang et al. |
| 7,884,807 B2 | 2/2011 | Hovden et al. |
| 7,890,882 B1 | 2/2011 | Nelson |
| 7,893,921 B2 | 2/2011 | Sato |
| 7,898,797 B2 | 3/2011 | Fan et al. |
| 7,904,832 B2 | 3/2011 | Ubillos |
| 7,907,394 B2 | 3/2011 | Richardson et al. |
| D636,397 S | 4/2011 | Green |
| 7,918,559 B2 | 4/2011 | Tesar |
| 7,927,654 B2 | 4/2011 | Hagood et al. |
| 7,928,964 B2 | 4/2011 | Kolmykov-Zotov et al. |
| 7,932,890 B2 | 4/2011 | Onikiri et al. |
| 7,936,501 B2 | 5/2011 | Smith et al. |
| 7,944,520 B2 | 5/2011 | Ichioka et al. |
| 7,945,717 B2 | 5/2011 | Rivalsi |
| 7,957,082 B2 | 6/2011 | Mi et al. |
| 7,965,268 B2 | 6/2011 | Gass et al. |
| 7,967,462 B2 | 6/2011 | Ogiro et al. |
| 7,970,246 B2 | 6/2011 | Travis et al. |
| 7,973,771 B2 | 7/2011 | Geaghan |
| 7,976,393 B2 | 7/2011 | Haga et al. |
| 7,978,281 B2 | 7/2011 | Vergith et al. |
| 7,991,257 B1 | 8/2011 | Coleman |
| 8,007,158 B2 | 8/2011 | Woo et al. |
| 8,014,644 B2 | 9/2011 | Morimoto et al. |
| 8,016,255 B2 | 9/2011 | Lin |
| 8,018,386 B2 | 9/2011 | Qi et al. |
| 8,018,579 B1 | 9/2011 | Krah |
| 8,026,904 B2 | 9/2011 | Westerman |
| 8,035,614 B2 | 10/2011 | Bell et al. |
| 8,035,624 B2 | 10/2011 | Bell et al. |
| 8,053,688 B2 | 11/2011 | Conzola et al. |
| 8,059,384 B2 | 11/2011 | Park et al. |
| 8,059,391 B2 | 11/2011 | Chang et al. |
| 8,065,624 B2 | 11/2011 | Morin et al. |
| 8,069,356 B2 | 11/2011 | Rathi et al. |
| RE42,992 E | 12/2011 | David |
| 8,077,160 B2 | 12/2011 | Land et al. |
| 8,090,885 B2 | 1/2012 | Callaghan et al. |
| 8,098,233 B2 | 1/2012 | Hotelling et al. |
| 8,102,362 B2 | 1/2012 | Ricks et al. |
| 8,115,499 B2 | 2/2012 | Osoinach et al. |
| 8,115,718 B2 | 2/2012 | Chen et al. |
| 8,117,362 B2 | 2/2012 | Rodriguez et al. |
| 8,118,274 B2 | 2/2012 | McClure et al. |
| 8,118,681 B2 | 2/2012 | Mattice et al. |
| 8,120,166 B2 | 2/2012 | Koizumi et al. |
| 8,128,800 B2 | 3/2012 | Seo et al. |
| 8,130,203 B2 | 3/2012 | Westerman |
| 8,149,219 B2 | 4/2012 | Lii et al. |
| 8,149,272 B2 | 4/2012 | Evans et al. |
| 8,150,893 B2 | 4/2012 | Bohannon et al. |
| 8,154,524 B2 | 4/2012 | Wilson et al. |
| 8,159,372 B2 | 4/2012 | Sherman |
| 8,162,282 B2 | 4/2012 | Hu et al. |
| 8,162,524 B2 | 4/2012 | Van Ostrand et al. |
| 8,165,988 B2 | 4/2012 | Shau et al. |
| D659,139 S | 5/2012 | Gengler |
| 8,169,185 B2 | 5/2012 | Partovi et al. |
| 8,169,421 B2 | 5/2012 | Wright et al. |
| 8,176,436 B2 | 5/2012 | Arend et al. |
| 8,179,236 B2 | 5/2012 | Weller et al. |
| 8,184,190 B2 | 5/2012 | Dosluoglu |
| 8,189,973 B2 | 5/2012 | Travis et al. |
| 8,216,074 B2 | 7/2012 | Sakuma |
| 8,220,929 B2 | 7/2012 | Miyawaki et al. |
| 8,223,489 B2 | 7/2012 | Shih |
| 8,229,509 B2 | 7/2012 | Paek et al. |
| 8,229,522 B2 | 7/2012 | Kim et al. |
| 8,231,099 B2 | 7/2012 | Chen |
| 8,240,007 B2 | 8/2012 | Duan et al. |
| 8,243,027 B2 | 8/2012 | Hotelling et al. |
| 8,243,432 B2 | 8/2012 | Duan et al. |
| 8,244,667 B1 | 8/2012 | Weinberger et al. |
| 8,245,354 B2 | 8/2012 | Duan et al. |
| 8,246,170 B2 | 8/2012 | Yamamoto et al. |
| 8,248,791 B2 | 8/2012 | Wang et al. |
| 8,249,263 B2 | 8/2012 | Cragun |
| 8,251,563 B2 | 8/2012 | Papakonstantinou et al. |
| 8,255,708 B1 | 8/2012 | Zhang |

(56) References Cited

U.S. PATENT DOCUMENTS

| | | |
|---|---|---|
| 8,259,091 B2 | 9/2012 | Yeh |
| 8,263,730 B2 | 9/2012 | Shimizu |
| 8,264,310 B2 | 9/2012 | Lauder et al. |
| 8,267,368 B2 | 9/2012 | Torii et al. |
| 8,269,093 B2 | 9/2012 | Naik et al. |
| 8,269,731 B2 | 9/2012 | Molne |
| 8,274,784 B2 | 9/2012 | Franz et al. |
| 8,279,589 B2 | 10/2012 | Kim |
| 8,281,041 B2 | 10/2012 | Butterfield |
| 8,289,115 B2 | 10/2012 | Cretella, Jr. et al. |
| 8,310,508 B2 | 11/2012 | Hekstra et al. |
| 8,310,768 B2 | 11/2012 | Lin et al. |
| 8,322,290 B1 | 12/2012 | Mignano |
| 8,325,416 B2 | 12/2012 | Lesage et al. |
| 8,332,402 B2 | 12/2012 | Forstall et al. |
| 8,342,857 B2 | 1/2013 | Palli et al. |
| 8,345,920 B2 | 1/2013 | Ferren et al. |
| 8,346,206 B1 | 1/2013 | Andrus et al. |
| 8,354,806 B2 | 1/2013 | Travis et al. |
| 8,358,400 B2 | 1/2013 | Escuti |
| 8,362,975 B2 | 1/2013 | Uehara |
| 8,363,014 B2 | 1/2013 | Leung et al. |
| 8,363,036 B2 | 1/2013 | Liang |
| 8,371,174 B2 | 2/2013 | Chen et al. |
| 8,373,664 B2 | 2/2013 | Wright |
| 8,384,566 B2 | 2/2013 | Bocirnea |
| 8,387,078 B2 | 2/2013 | Memmott |
| 8,387,938 B2 | 3/2013 | Lin |
| 8,389,078 B2 | 3/2013 | Lin et al. |
| 8,403,576 B2 | 3/2013 | Merz |
| 8,416,206 B2 | 4/2013 | Carpendale et al. |
| 8,416,559 B2 | 4/2013 | Agata et al. |
| 8,421,757 B2 | 4/2013 | Suzuki et al. |
| 8,424,160 B2 | 4/2013 | Chen |
| 8,434,019 B2 | 4/2013 | Nelson |
| 8,446,359 B2 | 5/2013 | Doczy et al. |
| 8,464,079 B2 | 6/2013 | Chueh et al. |
| 8,466,902 B2 | 6/2013 | Boer et al. |
| 8,466,954 B2 | 6/2013 | Ko et al. |
| 8,467,133 B2 | 6/2013 | Miller |
| 8,472,119 B1 | 6/2013 | Kelly |
| 8,477,100 B2 | 7/2013 | Wang et al. |
| 8,497,657 B2 | 7/2013 | Franks et al. |
| 8,498,100 B1 | 7/2013 | Whitt, III et al. |
| 8,513,547 B2 | 8/2013 | Ooi |
| 8,514,568 B2 | 8/2013 | Qiao et al. |
| 8,515,501 B2 | 8/2013 | Lee et al. |
| 8,520,371 B2 | 8/2013 | Peng et al. |
| 8,526,993 B2 | 9/2013 | Bria et al. |
| 8,538,351 B2 | 9/2013 | Wilson et al. |
| 8,543,227 B1 | 9/2013 | Perek et al. |
| 8,548,608 B2 | 10/2013 | Perek et al. |
| 8,560,004 B1 | 10/2013 | Tsvetkov et al. |
| 8,564,944 B2 | 10/2013 | Whitt, III et al. |
| 8,565,560 B2 | 10/2013 | Popovich et al. |
| 8,569,640 B2 | 10/2013 | Yamada et al. |
| 8,570,725 B2 | 10/2013 | Whitt, III et al. |
| 8,571,539 B1 | 10/2013 | Ranganathan et al. |
| 8,576,031 B2 | 11/2013 | Lauder et al. |
| 8,576,143 B1 | 11/2013 | Kelly |
| 8,582,206 B2 | 11/2013 | Travis |
| 8,582,280 B2 | 11/2013 | Ryu |
| 8,587,701 B2 | 11/2013 | Tatsuzawa |
| 8,589,341 B2 | 11/2013 | Golde et al. |
| 8,594,702 B2 | 11/2013 | Naaman et al. |
| D696,253 S | 12/2013 | Akana et al. |
| 8,596,881 B2 | 12/2013 | Umeno |
| 8,599,542 B1 | 12/2013 | Healey et al. |
| 8,600,120 B2 | 12/2013 | Gonion et al. |
| 8,600,526 B2 | 12/2013 | Nielsen et al. |
| 8,610,015 B2 | 12/2013 | Whitt et al. |
| 8,614,666 B2 | 12/2013 | Whitman et al. |
| 8,627,228 B2 | 1/2014 | Yosef et al. |
| 8,629,815 B2 | 1/2014 | Brin et al. |
| 8,633,898 B2 * | 1/2014 | Westerman ............ G06F 3/0235 345/173 |
| 8,646,999 B2 | 2/2014 | Shaw et al. |
| 8,654,030 B1 | 2/2014 | Mercer |
| 8,674,941 B2 | 3/2014 | Casparian et al. |
| 8,692,212 B1 | 4/2014 | Craft |
| 8,698,845 B2 | 4/2014 | Lemay |
| 8,699,215 B2 | 4/2014 | Whitt, III et al. |
| 8,700,931 B2 | 4/2014 | Gudlavenkatasiva et al. |
| 8,705,229 B2 | 4/2014 | Ashcraft et al. |
| D704,702 S | 5/2014 | Akana et al. |
| 8,717,664 B2 | 5/2014 | Wang et al. |
| 8,719,603 B2 | 5/2014 | Belesiu |
| 8,723,842 B2 | 5/2014 | Kaneda et al. |
| 8,724,302 B2 | 5/2014 | Whitt et al. |
| 8,738,090 B2 | 5/2014 | Kanda et al. |
| 8,744,070 B2 | 6/2014 | Zhang et al. |
| 8,744,391 B2 | 6/2014 | Tenbrook et al. |
| 8,749,529 B2 | 6/2014 | Powell et al. |
| 8,754,854 B1 | 6/2014 | Hamburgen et al. |
| 8,757,374 B2 | 6/2014 | Kaiser |
| 8,762,746 B1 | 6/2014 | Lachwani et al. |
| 8,767,388 B2 | 7/2014 | Ahn et al. |
| 8,769,431 B1 | 7/2014 | Prasad |
| 8,780,540 B2 | 7/2014 | Whitt, III et al. |
| 8,780,541 B2 | 7/2014 | Whitt et al. |
| 8,786,767 B2 | 7/2014 | Rihn et al. |
| 8,791,382 B2 | 7/2014 | Whitt, III et al. |
| 8,797,765 B2 | 8/2014 | Lin et al. |
| 8,823,652 B2 | 9/2014 | Linegar et al. |
| 8,825,187 B1 | 9/2014 | Hamrick et al. |
| 8,830,668 B2 | 9/2014 | Whitt, III et al. |
| 8,836,662 B2 | 9/2014 | Liu |
| 8,850,241 B2 | 9/2014 | Oler et al. |
| 8,854,799 B2 | 10/2014 | Whitt, III et al. |
| 8,873,227 B2 | 10/2014 | Whitt et al. |
| 8,891,232 B2 | 11/2014 | Wang |
| 8,896,993 B2 | 11/2014 | Belesiu et al. |
| 8,903,517 B2 | 12/2014 | Perek et al. |
| 8,908,858 B2 | 12/2014 | Chiu et al. |
| 8,918,546 B2 | 12/2014 | Cheah et al. |
| 8,922,996 B2 | 12/2014 | Yeh et al. |
| 8,934,221 B2 | 1/2015 | Guo |
| 8,935,774 B2 | 1/2015 | Belesiu et al. |
| 8,939,422 B2 | 1/2015 | Liu et al. |
| 8,947,353 B2 | 2/2015 | Boulanger et al. |
| 8,947,864 B2 | 2/2015 | Whitt, III et al. |
| 8,949,477 B2 | 2/2015 | Drasnin |
| 8,952,892 B2 | 2/2015 | Chai |
| 8,964,376 B2 | 2/2015 | Chen |
| 8,964,379 B2 | 2/2015 | Rihn et al. |
| 8,991,473 B2 | 3/2015 | Bomemann et al. |
| 8,997,983 B2 | 4/2015 | Sajid |
| 9,001,028 B2 | 4/2015 | Baker |
| 9,019,615 B2 | 4/2015 | Travis |
| 9,027,631 B2 | 5/2015 | Bomemann et al. |
| 9,047,207 B2 | 6/2015 | Belesiu et al. |
| 9,052,414 B2 | 6/2015 | Travis et al. |
| 9,063,693 B2 | 6/2015 | Raken et al. |
| 9,064,654 B2 | 6/2015 | Whitt, III et al. |
| 9,073,123 B2 | 7/2015 | Campbell et al. |
| 9,075,566 B2 | 7/2015 | Whitt, III et al. |
| 9,098,117 B2 | 8/2015 | Lutz, III et al. |
| 9,098,304 B2 | 8/2015 | Young et al. |
| 9,111,005 B1 * | 8/2015 | Ross ..................... G06F 3/038 |
| 9,111,703 B2 | 8/2015 | Whit et al. |
| 9,116,550 B2 | 8/2015 | Siddiqui et al. |
| 9,134,807 B2 | 9/2015 | Shaw et al. |
| 9,134,808 B2 | 9/2015 | Siddiqui et al. |
| 9,146,620 B2 | 9/2015 | Whitt et al. |
| 9,152,173 B2 | 10/2015 | Lee et al. |
| 9,158,383 B2 | 10/2015 | Shaw et al. |
| 9,158,384 B2 | 10/2015 | Whitt, III et al. |
| 9,176,538 B2 | 11/2015 | Boulanger |
| 9,176,900 B2 | 11/2015 | Whitt, III et al. |
| 9,176,901 B2 | 11/2015 | Whitt, III et al. |
| 9,189,428 B2 | 11/2015 | Pollmann et al. |
| 9,201,185 B2 | 12/2015 | Large |
| 9,246,487 B2 | 1/2016 | Casparian et al. |

(56) References Cited

U.S. PATENT DOCUMENTS

| | | |
|---|---|---|
| 9,256,089 B2 | 2/2016 | Emerton et al. |
| 9,268,373 B2 | 2/2016 | Whitt et al. |
| 9,275,809 B2 | 3/2016 | Panay et al. |
| 9,298,236 B2 | 3/2016 | Oler et al. |
| 9,304,549 B2 | 4/2016 | Siddiqui |
| 9,304,948 B2 | 4/2016 | Whitman et al. |
| 9,304,949 B2 | 4/2016 | Whitman et al. |
| 9,317,072 B2 | 4/2016 | Park et al. |
| 9,329,729 B2 * | 5/2016 | Kim ..................... G06F 3/044 |
| 9,348,605 B2 | 5/2016 | Drasnin |
| 9,354,748 B2 | 5/2016 | Lutian et al. |
| 9,355,345 B2 | 5/2016 | Powell |
| 9,360,893 B2 | 6/2016 | Bathiche et al. |
| 9,360,977 B2 * | 6/2016 | Åberg .................. G06F 3/0488 |
| 9,411,751 B2 | 8/2016 | Whitt et al. |
| 9,426,905 B2 | 8/2016 | Bathiche et al. |
| 9,447,620 B2 | 9/2016 | Park et al. |
| 9,460,029 B2 | 10/2016 | Shaw et al. |
| 9,465,412 B2 | 10/2016 | Belesiu et al. |
| 9,519,591 B2 | 12/2016 | Lomet et al. |
| 9,618,977 B2 | 4/2017 | Whitt et al. |
| 9,619,071 B2 | 4/2017 | Perek et al. |
| 9,678,542 B2 | 6/2017 | Whitt et al. |
| 9,706,089 B2 | 7/2017 | Beck et al. |
| 9,710,093 B2 | 7/2017 | Shaw et al. |
| 9,766,663 B2 | 9/2017 | Siddiqui et al. |
| 9,793,073 B2 | 10/2017 | Marwah et al. |
| 9,852,855 B2 * | 12/2017 | Shaw .................... G06F 1/1618 |
| 9,870,066 B2 | 1/2018 | Whit et al. |
| 9,904,327 B2 | 2/2018 | Whit et al. |
| 2001/0020455 A1 | 9/2001 | Schifferl |
| 2001/0023818 A1 | 9/2001 | Masaru et al. |
| 2001/0035859 A1 | 11/2001 | Kiser |
| 2002/0000977 A1 | 1/2002 | Vranish |
| 2002/0005108 A1 * | 1/2002 | Ludwig ..................... G10H 1/00 |
| | | 84/600 |
| 2002/0008854 A1 | 1/2002 | Leigh Travis |
| 2002/0035455 A1 | 3/2002 | Niu et al. |
| 2002/0038196 A1 | 3/2002 | Johnson et al. |
| 2002/0044216 A1 | 4/2002 | Cha |
| 2002/0070883 A1 | 6/2002 | Dosch |
| 2002/0093436 A1 | 7/2002 | Lien |
| 2002/0103616 A1 | 8/2002 | Park et al. |
| 2002/0113882 A1 | 8/2002 | Pollard et al. |
| 2002/0126445 A1 | 9/2002 | Minaguchi et al. |
| 2002/0126446 A1 | 9/2002 | Miyako et al. |
| 2002/0134828 A1 * | 9/2002 | Sandbach ............. G06F 1/1632 |
| | | 235/60.12 |
| 2002/0135457 A1 * | 9/2002 | Sandbach ............... G06F 3/023 |
| | | 338/47 |
| 2002/0138772 A1 | 9/2002 | Crawford et al. |
| 2002/0154099 A1 | 10/2002 | Oh |
| 2002/0163510 A1 | 11/2002 | Williams et al. |
| 2002/0171939 A1 | 11/2002 | Song |
| 2002/0188721 A1 | 12/2002 | Lemel et al. |
| 2002/0190823 A1 | 12/2002 | Yap |
| 2002/0191028 A1 | 12/2002 | Senechalle et al. |
| 2002/0195177 A1 | 12/2002 | Hinkley et al. |
| 2003/0000821 A1 | 1/2003 | Takahashi et al. |
| 2003/0007648 A1 | 1/2003 | Currell |
| 2003/0009518 A1 | 1/2003 | Harrow et al. |
| 2003/0011576 A1 * | 1/2003 | Sandbach ............ H01H 13/702 |
| | | 345/173 |
| 2003/0016282 A1 | 1/2003 | Koizumi |
| 2003/0028688 A1 | 2/2003 | Tiphane et al. |
| 2003/0036365 A1 | 2/2003 | Kuroda |
| 2003/0044215 A1 | 3/2003 | Monney et al. |
| 2003/0044216 A1 | 3/2003 | Fang |
| 2003/0051983 A1 | 3/2003 | Lahr |
| 2003/0067450 A1 | 4/2003 | Thursfield et al. |
| 2003/0100338 A1 * | 5/2003 | Lee ..................... G06F 1/1626 |
| | | 455/556.2 |
| 2003/0108720 A1 | 6/2003 | Kashino |
| 2003/0128285 A1 | 7/2003 | Itoh |
| 2003/0132916 A1 | 7/2003 | Kramer |
| 2003/0137706 A1 | 7/2003 | Rmanujam et al. |
| 2003/0137821 A1 | 7/2003 | Gotoh et al. |
| 2003/0148740 A1 | 8/2003 | Yau et al. |
| 2003/0160712 A1 * | 8/2003 | Levy .................... H01H 13/702 |
| | | 341/22 |
| 2003/0163611 A1 | 8/2003 | Nagao |
| 2003/0165017 A1 | 9/2003 | Amitai |
| 2003/0173195 A1 | 9/2003 | Federspiel |
| 2003/0179453 A1 | 9/2003 | Mori et al. |
| 2003/0195937 A1 | 10/2003 | Kircher et al. |
| 2003/0197687 A1 | 10/2003 | Shetter |
| 2003/0197806 A1 | 10/2003 | Perry et al. |
| 2003/0198008 A1 | 10/2003 | Leapman et al. |
| 2003/0231243 A1 | 12/2003 | Shibutani |
| 2004/0005184 A1 | 1/2004 | Kim et al. |
| 2004/0039862 A1 | 2/2004 | Hunt et al. |
| 2004/0042724 A1 | 3/2004 | Gombert et al. |
| 2004/0046796 A1 | 3/2004 | Fujita |
| 2004/0048941 A1 | 3/2004 | Raffel et al. |
| 2004/0052506 A1 | 3/2004 | Togino |
| 2004/0056843 A1 | 3/2004 | Lin et al. |
| 2004/0085716 A1 | 5/2004 | Uke |
| 2004/0090417 A1 * | 5/2004 | Amiri ..................... G06F 3/0202 |
| | | 345/156 |
| 2004/0095333 A1 | 5/2004 | Morag et al. |
| 2004/0100457 A1 | 5/2004 | Mandle |
| 2004/0113956 A1 | 6/2004 | Bellwood et al. |
| 2004/0115994 A1 | 6/2004 | Wulff et al. |
| 2004/0150631 A1 | 8/2004 | Fleck et al. |
| 2004/0151466 A1 | 8/2004 | Crossman-bosworth et al. |
| 2004/0156168 A1 | 8/2004 | LeVasseur et al. |
| 2004/0160734 A1 | 8/2004 | Yim |
| 2004/0169641 A1 | 9/2004 | Bean et al. |
| 2004/0174670 A1 | 9/2004 | Huang et al. |
| 2004/0174709 A1 | 9/2004 | Buelow et al. |
| 2004/0189822 A1 | 9/2004 | Shimada |
| 2004/0190239 A1 | 9/2004 | Weng et al. |
| 2004/0209489 A1 | 10/2004 | Clapper |
| 2004/0212553 A1 | 10/2004 | Wang et al. |
| 2004/0212598 A1 | 10/2004 | Kraus et al. |
| 2004/0212601 A1 | 10/2004 | Cake et al. |
| 2004/0231969 A1 | 11/2004 | Kitano et al. |
| 2004/0239533 A1 * | 12/2004 | Bollman ............... G06F 1/1626 |
| | | 341/22 |
| 2004/0258924 A1 | 12/2004 | Berger et al. |
| 2004/0267323 A1 | 12/2004 | Dupelle |
| 2004/0268000 A1 | 12/2004 | Barker et al. |
| 2005/0001957 A1 | 1/2005 | Amimori et al. |
| 2005/0002073 A1 | 1/2005 | Nakamura et al. |
| 2005/0030728 A1 | 2/2005 | Kawashima et al. |
| 2005/0042013 A1 | 2/2005 | Lee |
| 2005/0047773 A1 | 3/2005 | Satake et al. |
| 2005/0052831 A1 | 3/2005 | Chen |
| 2005/0055498 A1 | 3/2005 | Beckert et al. |
| 2005/0057515 A1 | 3/2005 | Bathiche |
| 2005/0057521 A1 | 3/2005 | Aull et al. |
| 2005/0057891 A1 * | 3/2005 | Madsen ................ G06F 1/1622 |
| | | 361/679.2 |
| 2005/0059489 A1 | 3/2005 | Kim |
| 2005/0062715 A1 | 3/2005 | Tsuji et al. |
| 2005/0064765 A1 | 3/2005 | Simpson et al. |
| 2005/0068460 A1 | 3/2005 | Lin |
| 2005/0084212 A1 | 4/2005 | Fein |
| 2005/0094895 A1 | 5/2005 | Baron |
| 2005/0099400 A1 | 5/2005 | Lee |
| 2005/0100272 A1 | 5/2005 | Gilman |
| 2005/0100690 A1 | 5/2005 | Mayer et al. |
| 2005/0134717 A1 | 6/2005 | Misawa |
| 2005/0146512 A1 | 7/2005 | Hill et al. |
| 2005/0153753 A1 | 7/2005 | Cheng |
| 2005/0157459 A1 | 7/2005 | Yin et al. |
| 2005/0190159 A1 | 9/2005 | Skarine |
| 2005/0206737 A1 | 9/2005 | Gim et al. |
| 2005/0231156 A1 | 10/2005 | Yan |
| 2005/0236848 A1 | 10/2005 | Kim et al. |
| 2005/0240949 A1 | 10/2005 | Liu et al. |
| 2005/0264653 A1 | 12/2005 | Starkweather et al. |
| 2005/0264988 A1 | 12/2005 | Nicolosi |

(56) References Cited

U.S. PATENT DOCUMENTS

| | | |
|---|---|---|
| 2005/0265035 A1 | 12/2005 | Brass et al. |
| 2005/0283731 A1 | 12/2005 | Saint-Hilaire et al. |
| 2005/0285703 A1 | 12/2005 | Wheeler et al. |
| 2006/0002101 A1 | 1/2006 | Wheatley et al. |
| 2006/0007645 A1 | 1/2006 | Chen et al. |
| 2006/0010400 A1 | 1/2006 | Dehlin et al. |
| 2006/0012567 A1 | 1/2006 | Sicklinger |
| 2006/0012767 A1 | 1/2006 | Komatsuda et al. |
| 2006/0020903 A1 | 1/2006 | Wang et al. |
| 2006/0028400 A1 | 2/2006 | Lapstun et al. |
| 2006/0028476 A1 | 2/2006 | Sobel |
| 2006/0028838 A1 | 2/2006 | Imade |
| 2006/0030295 A1 | 2/2006 | Adams et al. |
| 2006/0049920 A1 | 3/2006 | Sadler et al. |
| 2006/0049993 A1 | 3/2006 | Lin et al. |
| 2006/0061555 A1 | 3/2006 | Mullen |
| 2006/0061597 A1 | 3/2006 | Hui |
| 2006/0070384 A1 | 4/2006 | Ertel |
| 2006/0082973 A1 | 4/2006 | Egbert et al. |
| 2006/0083004 A1 | 4/2006 | Cok |
| 2006/0085658 A1 | 4/2006 | Allen et al. |
| 2006/0089171 A1 | 4/2006 | Yoo et al. |
| 2006/0092139 A1 | 5/2006 | Sharma |
| 2006/0092379 A1 | 5/2006 | Cho et al. |
| 2006/0096392 A1 | 5/2006 | Inkster et al. |
| 2006/0102020 A1 | 5/2006 | Takada et al. |
| 2006/0102914 A1 | 5/2006 | Smits et al. |
| 2006/0103633 A1 | 5/2006 | Gioeli |
| 2006/0110537 A1 | 5/2006 | Huang et al. |
| 2006/0125799 A1 | 6/2006 | Hillis et al. |
| 2006/0132423 A1 | 6/2006 | Travis |
| 2006/0132456 A1 | 6/2006 | Anson |
| 2006/0132806 A1 | 6/2006 | Shchegrov et al. |
| 2006/0132914 A1 | 6/2006 | Weiss et al. |
| 2006/0146573 A1 | 7/2006 | Iwauchi et al. |
| 2006/0152499 A1 | 7/2006 | Roberts |
| 2006/0154725 A1 | 7/2006 | Glaser et al. |
| 2006/0155391 A1 | 7/2006 | Pistemaa et al. |
| 2006/0156415 A1 | 7/2006 | Rubinstein et al. |
| 2006/0174143 A1 | 8/2006 | Sawyers et al. |
| 2006/0176377 A1 | 8/2006 | Miyasaka |
| 2006/0181514 A1 | 8/2006 | Newman |
| 2006/0181521 A1 | 8/2006 | Perreault et al. |
| 2006/0183331 A1 | 8/2006 | Hofmann |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0197755 A1 | 9/2006 | Bawany |
| 2006/0215244 A1 | 9/2006 | Yosha et al. |
| 2006/0220465 A1 | 10/2006 | Kingsmore et al. |
| 2006/0221448 A1 | 10/2006 | Nivon et al. |
| 2006/0227393 A1 | 10/2006 | Herloski |
| 2006/0228073 A1 | 10/2006 | Mukawa et al. |
| 2006/0238510 A1 | 10/2006 | Panotopoulos et al. |
| 2006/0238550 A1 | 10/2006 | Page |
| 2006/0239006 A1 | 10/2006 | Chaves et al. |
| 2006/0248597 A1 | 11/2006 | Keneman |
| 2006/0250381 A1 | 11/2006 | Geaghan |
| 2006/0254042 A1 | 11/2006 | Chou et al. |
| 2006/0261778 A1 | 11/2006 | Elizalde Rodarte |
| 2006/0262185 A1 | 11/2006 | Cha et al. |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2006/0276221 A1 | 12/2006 | Lagnado et al. |
| 2006/0279501 A1 | 12/2006 | Lu et al. |
| 2006/0287982 A1 | 12/2006 | Sheldon et al. |
| 2007/0002587 A1 | 1/2007 | Miyashita |
| 2007/0003267 A1 | 1/2007 | Shibutani |
| 2007/0019181 A1 | 1/2007 | Sinclair et al. |
| 2007/0023703 A1 | 2/2007 | Sunaoshi et al. |
| 2007/0024742 A1 | 2/2007 | Raskar et al. |
| 2007/0046625 A1 | 3/2007 | Yee |
| 2007/0047221 A1 | 3/2007 | Park |
| 2007/0047260 A1 | 3/2007 | Lee et al. |
| 2007/0051766 A1 | 3/2007 | Spencer |
| 2007/0051792 A1 | 3/2007 | Wheeler et al. |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0076434 A1 | 4/2007 | Uehara et al. |
| 2007/0080813 A1 | 4/2007 | Melvin |
| 2007/0081091 A1 | 4/2007 | Pan et al. |
| 2007/0091638 A1 | 4/2007 | Ijzerman et al. |
| 2007/0114967 A1 | 5/2007 | Peng |
| 2007/0116929 A1 | 5/2007 | Fujimori et al. |
| 2007/0117600 A1 | 5/2007 | Robertson et al. |
| 2007/0121956 A1 | 5/2007 | Bai et al. |
| 2007/0122027 A1 | 5/2007 | Kunita et al. |
| 2007/0126393 A1 | 6/2007 | Bersenev |
| 2007/0127205 A1 | 6/2007 | Kuo |
| 2007/0133156 A1 | 6/2007 | Ligtenberg et al. |
| 2007/0145945 A1 | 6/2007 | McGinley et al. |
| 2007/0161262 A1 | 7/2007 | Lloyd |
| 2007/0172229 A1 | 7/2007 | Wernersson |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0188478 A1 | 8/2007 | Silverstein et al. |
| 2007/0189667 A1 | 8/2007 | Wakita et al. |
| 2007/0194752 A1 | 8/2007 | McBurney |
| 2007/0200830 A1 | 8/2007 | Yamamoto |
| 2007/0201246 A1 | 8/2007 | Yeo et al. |
| 2007/0201859 A1 | 8/2007 | Sarrat |
| 2007/0217224 A1 | 9/2007 | Kao et al. |
| 2007/0220708 A1 | 9/2007 | Lewis |
| 2007/0222766 A1 | 9/2007 | Bolender |
| 2007/0223248 A1 | 9/2007 | Han |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236467 A1 | 10/2007 | Marshall et al. |
| 2007/0236475 A1 | 10/2007 | Wherry |
| 2007/0236873 A1 | 10/2007 | Yukawa et al. |
| 2007/0242037 A1* | 10/2007 | Son .............. G06F 3/0414 345/156 |
| 2007/0247338 A1 | 10/2007 | Marchetto |
| 2007/0247432 A1 | 10/2007 | Oakley |
| 2007/0247800 A1 | 10/2007 | Smith et al. |
| 2007/0252674 A1 | 11/2007 | Nelson et al. |
| 2007/0252827 A1 | 11/2007 | Hirota |
| 2007/0257821 A1 | 11/2007 | Son et al. |
| 2007/0260892 A1 | 11/2007 | Paul et al. |
| 2007/0263119 A1 | 11/2007 | Shum et al. |
| 2007/0268273 A1* | 11/2007 | Westerman ........ G06F 3/0235 345/173 |
| 2007/0271527 A1 | 11/2007 | Paas et al. |
| 2007/0274094 A1 | 11/2007 | Schultz et al. |
| 2007/0274095 A1 | 11/2007 | Destain |
| 2007/0274099 A1 | 11/2007 | Tai et al. |
| 2007/0279744 A1 | 12/2007 | Fujimoto |
| 2007/0283179 A1 | 12/2007 | Burnett et al. |
| 2007/0296709 A1 | 12/2007 | Guanghai |
| 2007/0297125 A1 | 12/2007 | Maatta |
| 2007/0297625 A1 | 12/2007 | Hjort et al. |
| 2008/0001924 A1 | 1/2008 | de los Reyes et al. |
| 2008/0002350 A1 | 1/2008 | Farrugia |
| 2008/0005423 A1 | 1/2008 | Jacobs et al. |
| 2008/0013809 A1 | 1/2008 | Zhu et al. |
| 2008/0014534 A1 | 1/2008 | Barwicz et al. |
| 2008/0018611 A1 | 1/2008 | Serban et al. |
| 2008/0018613 A1* | 1/2008 | Kim .............. G06F 3/0412 345/173 |
| 2008/0019150 A1 | 1/2008 | Park et al. |
| 2008/0019684 A1 | 1/2008 | Shyu et al. |
| 2008/0025350 A1 | 1/2008 | Arbore et al. |
| 2008/0030937 A1 | 2/2008 | Russo et al. |
| 2008/0037284 A1 | 2/2008 | Rudisill |
| 2008/0042978 A1 | 2/2008 | Perez-Noguera |
| 2008/0048654 A1 | 2/2008 | Takahashi et al. |
| 2008/0049704 A1 | 2/2008 | Witteman et al. |

(56) References Cited

U.S. PATENT DOCUMENTS

| | | |
|---|---|---|
| 2008/0053222 A1 | 3/2008 | Ehrensvard et al. |
| 2008/0059888 A1 | 3/2008 | Dunko |
| 2008/0061565 A1 | 3/2008 | Lee et al. |
| 2008/0068451 A1 | 3/2008 | Hyatt |
| 2008/0074398 A1 | 3/2008 | Wright |
| 2008/0080166 A1 | 4/2008 | Duong et al. |
| 2008/0083127 A1 | 4/2008 | Mcmurtry et al. |
| 2008/0084499 A1 | 4/2008 | Kisacanin et al. |
| 2008/0088487 A1* | 4/2008 | Li .................. G06F 3/0414 341/22 |
| 2008/0088593 A1 | 4/2008 | Smoot |
| 2008/0090626 A1 | 4/2008 | Griffin et al. |
| 2008/0094398 A1 | 4/2008 | Ng et al. |
| 2008/0104437 A1 | 5/2008 | Lee |
| 2008/0106592 A1 | 5/2008 | Mikami |
| 2008/0111518 A1 | 5/2008 | Toya |
| 2008/0122803 A1 | 5/2008 | Izadi et al. |
| 2008/0129520 A1 | 6/2008 | Lee |
| 2008/0150913 A1 | 6/2008 | Bell et al. |
| 2008/0151478 A1 | 6/2008 | Chern |
| 2008/0158185 A1 | 7/2008 | Westerman |
| 2008/0158189 A1 | 7/2008 | Kim |
| 2008/0167832 A1 | 7/2008 | Soss |
| 2008/0174570 A1* | 7/2008 | Jobs .................. G06F 3/0488 345/173 |
| 2008/0177185 A1 | 7/2008 | Nakao et al. |
| 2008/0179507 A2 | 7/2008 | Han |
| 2008/0180411 A1 | 7/2008 | Solomon et al. |
| 2008/0182622 A1 | 7/2008 | Makarowski et al. |
| 2008/0186660 A1 | 8/2008 | Yang |
| 2008/0186683 A1 | 8/2008 | Ligtenberg et al. |
| 2008/0203277 A1 | 8/2008 | Warszauer et al. |
| 2008/0211787 A1 | 9/2008 | Nakao et al. |
| 2008/0219025 A1 | 9/2008 | Spitzer et al. |
| 2008/0224659 A1 | 9/2008 | Singh |
| 2008/0225205 A1 | 9/2008 | Travis |
| 2008/0228969 A1 | 9/2008 | Cheah et al. |
| 2008/0232061 A1 | 9/2008 | Wang et al. |
| 2008/0233326 A1 | 9/2008 | Hegemier et al. |
| 2008/0238871 A1 | 10/2008 | Tam |
| 2008/0238884 A1 | 10/2008 | Harish |
| 2008/0253822 A1 | 10/2008 | Matias |
| 2008/0258679 A1 | 10/2008 | Manico et al. |
| 2008/0273297 A1 | 11/2008 | Kumar |
| 2008/0297878 A1 | 12/2008 | Brown et al. |
| 2008/0303479 A1 | 12/2008 | Park et al. |
| 2008/0307242 A1 | 12/2008 | Qu |
| 2008/0309636 A1 | 12/2008 | Feng et al. |
| 2008/0316002 A1 | 12/2008 | Brunet et al. |
| 2008/0316183 A1 | 12/2008 | Westerman et al. |
| 2008/0316768 A1 | 12/2008 | Travis |
| 2008/0318008 A1 | 12/2008 | Wielstra et al. |
| 2008/0320190 A1 | 12/2008 | Lydon et al. |
| 2009/0002218 A1 | 1/2009 | Rigazio et al. |
| 2009/0007001 A1 | 1/2009 | Morin et al. |
| 2009/0009476 A1 | 1/2009 | Daley, III |
| 2009/0013275 A1 | 1/2009 | May et al. |
| 2009/0020343 A1 | 1/2009 | Rothkopf et al. |
| 2009/0033623 A1 | 2/2009 | Lin |
| 2009/0040426 A1 | 2/2009 | Mather et al. |
| 2009/0044113 A1 | 2/2009 | Jones et al. |
| 2009/0046416 A1 | 2/2009 | Daley, III |
| 2009/0049979 A1 | 2/2009 | Naik et al. |
| 2009/0065267 A1 | 3/2009 | Sato |
| 2009/0066653 A1 | 3/2009 | Wang |
| 2009/0067156 A1 | 3/2009 | Bonnett et al. |
| 2009/0073060 A1 | 3/2009 | Shimasaki et al. |
| 2009/0073957 A1 | 3/2009 | Newland et al. |
| 2009/0079639 A1 | 3/2009 | Hotta et al. |
| 2009/0083562 A1 | 3/2009 | Park et al. |
| 2009/0083710 A1 | 3/2009 | Best et al. |
| 2009/0085515 A1 | 4/2009 | Bourilkov et al. |
| 2009/0089600 A1 | 4/2009 | Nousiainen |
| 2009/0096738 A1 | 4/2009 | Chen et al. |
| 2009/0096756 A1 | 4/2009 | Lube |
| 2009/0102419 A1 | 4/2009 | Gwon et al. |
| 2009/0102794 A1 | 4/2009 | Lapstun et al. |
| 2009/0102805 A1 | 4/2009 | Meijer et al. |
| 2009/0117955 A1 | 5/2009 | Lo |
| 2009/0127005 A1 | 5/2009 | Zachut et al. |
| 2009/0131134 A1 | 5/2009 | Baerlocher et al. |
| 2009/0134838 A1 | 5/2009 | Raghuprasad |
| 2009/0135142 A1* | 5/2009 | Fu .................. G06F 3/016 345/168 |
| 2009/0135318 A1 | 5/2009 | Tateuchi et al. |
| 2009/0140985 A1 | 6/2009 | Liu |
| 2009/0141439 A1 | 6/2009 | Moser |
| 2009/0142020 A1 | 6/2009 | Van Ostrand et al. |
| 2009/0146975 A1 | 6/2009 | Chang |
| 2009/0146992 A1 | 6/2009 | Fukunaga et al. |
| 2009/0147102 A1 | 6/2009 | Kakinuma et al. |
| 2009/0152748 A1 | 6/2009 | Wang et al. |
| 2009/0158221 A1 | 6/2009 | Nielsen et al. |
| 2009/0160944 A1 | 6/2009 | Trevelyan et al. |
| 2009/0161385 A1 | 6/2009 | Parker et al. |
| 2009/0163147 A1 | 6/2009 | Steigerwald et al. |
| 2009/0167718 A1 | 7/2009 | Lee et al. |
| 2009/0167728 A1 | 7/2009 | Geaghan et al. |
| 2009/0167930 A1 | 7/2009 | Safaee-Rad et al. |
| 2009/0174687 A1 | 7/2009 | Ciesla et al. |
| 2009/0174759 A1 | 7/2009 | Yeh et al. |
| 2009/0177906 A1 | 7/2009 | Paniagua, Jr. et al. |
| 2009/0182901 A1 | 7/2009 | Callaghan et al. |
| 2009/0187860 A1 | 7/2009 | Fleck et al. |
| 2009/0189873 A1 | 7/2009 | Peterson et al. |
| 2009/0189974 A1 | 7/2009 | Deering |
| 2009/0195497 A1 | 8/2009 | Fitzgerald et al. |
| 2009/0195518 A1 | 8/2009 | Mattice et al. |
| 2009/0200148 A1 | 8/2009 | Honmatsu et al. |
| 2009/0200384 A1 | 8/2009 | Masalkar |
| 2009/0201254 A1 | 8/2009 | Rais |
| 2009/0207144 A1 | 8/2009 | Bridger |
| 2009/0219250 A1* | 9/2009 | Ure .................. G06F 1/1624 345/169 |
| 2009/0224416 A1 | 9/2009 | Laakkonen et al. |
| 2009/0226689 A1 | 9/2009 | Watanabe et al. |
| 2009/0231275 A1* | 9/2009 | Odgers .................. G06F 1/162 345/157 |
| 2009/0231465 A1 | 9/2009 | Senba |
| 2009/0239586 A1 | 9/2009 | Boeve et al. |
| 2009/0244009 A1 | 10/2009 | Staats et al. |
| 2009/0244832 A1 | 10/2009 | Behar et al. |
| 2009/0244872 A1 | 10/2009 | Yan |
| 2009/0246707 A1 | 10/2009 | Li et al. |
| 2009/0251008 A1 | 10/2009 | Sugaya |
| 2009/0251623 A1 | 10/2009 | Koyama |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0268386 A1 | 10/2009 | Lin |
| 2009/0269943 A1 | 10/2009 | Palli et al. |
| 2009/0276734 A1 | 11/2009 | Taylor et al. |
| 2009/0284613 A1 | 11/2009 | Kim |
| 2009/0285491 A1 | 11/2009 | Ravenscroft et al. |
| 2009/0295648 A1 | 12/2009 | Dorsey et al. |
| 2009/0296331 A1 | 12/2009 | Choy |
| 2009/0302175 A1 | 12/2009 | Torrii et al. |
| 2009/0303137 A1 | 12/2009 | Kusaka et al. |
| 2009/0303204 A1 | 12/2009 | Nasiri et al. |
| 2009/0315830 A1* | 12/2009 | Westerman .......... G06F 3/0219 345/168 |
| 2009/0316072 A1 | 12/2009 | Okumura et al. |
| 2009/0317595 A1 | 12/2009 | Brehm et al. |
| 2009/0320244 A1 | 12/2009 | Lin |
| 2009/0321490 A1 | 12/2009 | Groene et al. |
| 2009/0322278 A1 | 12/2009 | Franks et al. |
| 2010/0001963 A1 | 1/2010 | Doray et al. |
| 2010/0006412 A1 | 1/2010 | Wang et al. |
| 2010/0013319 A1 | 1/2010 | Kamiyama et al. |
| 2010/0013738 A1 | 1/2010 | Covannon et al. |
| 2010/0021022 A1 | 1/2010 | Pittel et al. |
| 2010/0021108 A1 | 1/2010 | Kang et al. |
| 2010/0023869 A1 | 1/2010 | Saint-Hilaire et al. |
| 2010/0026656 A1 | 2/2010 | Hotelling et al. |

(56) References Cited

U.S. PATENT DOCUMENTS

| | | |
|---|---|---|
| 2010/0038821 A1 | 2/2010 | Jenkins et al. |
| 2010/0039081 A1 | 2/2010 | Sip |
| 2010/0039764 A1 | 2/2010 | Locker et al. |
| 2010/0045540 A1 | 2/2010 | Lai et al. |
| 2010/0045609 A1 | 2/2010 | Do et al. |
| 2010/0045633 A1 | 2/2010 | Gettemy et al. |
| 2010/0051356 A1 | 3/2010 | Stern et al. |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0053771 A1 | 3/2010 | Travis et al. |
| 2010/0054435 A1 | 3/2010 | Louch et al. |
| 2010/0056130 A1 | 3/2010 | Louch et al. |
| 2010/0072334 A1 | 3/2010 | Le Gette et al. |
| 2010/0072351 A1 | 3/2010 | Mahowald |
| 2010/0073329 A1 | 3/2010 | Raman et al. |
| 2010/0074291 A1 | 3/2010 | Nakamura |
| 2010/0075517 A1 | 3/2010 | Ni et al. |
| 2010/0077237 A1 | 3/2010 | Sawyers |
| 2010/0078328 A1 | 4/2010 | Mandler et al. |
| 2010/0079379 A1 | 4/2010 | Demuynck et al. |
| 2010/0079861 A1 | 4/2010 | Powell |
| 2010/0081377 A1 | 4/2010 | Chatterjee et al. |
| 2010/0083108 A1 | 4/2010 | Rider et al. |
| 2010/0085321 A1 | 4/2010 | Pundsack |
| 2010/0100752 A1 | 4/2010 | Chueh et al. |
| 2010/0102182 A1 | 4/2010 | Lin |
| 2010/0102206 A1 | 4/2010 | Cazaux et al. |
| 2010/0103112 A1 | 4/2010 | Yoo et al. |
| 2010/0103131 A1 | 4/2010 | Segal et al. |
| 2010/0103332 A1 | 4/2010 | Li et al. |
| 2010/0103611 A1 | 4/2010 | Yang et al. |
| 2010/0105443 A1 | 4/2010 | Vaisanen |
| 2010/0106983 A1 | 4/2010 | Kasprzak et al. |
| 2010/0115309 A1 | 5/2010 | Carvalho et al. |
| 2010/0117993 A1 | 5/2010 | Kent |
| 2010/0123686 A1 | 5/2010 | Klinghult et al. |
| 2010/0128112 A1 | 5/2010 | Marti et al. |
| 2010/0128427 A1 | 5/2010 | Iso |
| 2010/0133398 A1 | 6/2010 | Chiu et al. |
| 2010/0135036 A1 | 6/2010 | Matsuba et al. |
| 2010/0141588 A1 | 6/2010 | Kimura et al. |
| 2010/0142130 A1 | 6/2010 | Wang et al. |
| 2010/0144406 A1 | 6/2010 | Ozawa |
| 2010/0146317 A1 | 6/2010 | Challener et al. |
| 2010/0148642 A1 | 6/2010 | Eromaki et al. |
| 2010/0148995 A1 | 6/2010 | Elias |
| 2010/0148999 A1 * | 6/2010 | Casparian ............. G06F 3/0202 341/34 |
| 2010/0149073 A1 | 6/2010 | Chaum et al. |
| 2010/0149100 A1 | 6/2010 | Meiby |
| 2010/0149104 A1 | 6/2010 | Sim et al. |
| 2010/0149111 A1 | 6/2010 | Olien |
| 2010/0149117 A1 | 6/2010 | Chien et al. |
| 2010/0149134 A1 | 6/2010 | Westerman et al. |
| 2010/0149377 A1 | 6/2010 | Shintani et al. |
| 2010/0154171 A1 | 6/2010 | Lombardi et al. |
| 2010/0156798 A1 | 6/2010 | Archer |
| 2010/0156913 A1 | 6/2010 | Ortega et al. |
| 2010/0157085 A1 | 6/2010 | Sasaki |
| 2010/0159995 A1 | 6/2010 | Stallings et al. |
| 2010/0161522 A1 | 6/2010 | Tirpak et al. |
| 2010/0162109 A1 | 6/2010 | Chatterjee et al. |
| 2010/0164857 A1 | 7/2010 | Liu et al. |
| 2010/0164897 A1 | 7/2010 | Morin et al. |
| 2010/0171875 A1 | 7/2010 | Yamamoto |
| 2010/0171891 A1 | 7/2010 | Kaji et al. |
| 2010/0174421 A1 | 7/2010 | Tsai et al. |
| 2010/0177388 A1 | 7/2010 | Cohen et al. |
| 2010/0180063 A1 | 7/2010 | Ananny et al. |
| 2010/0185877 A1 | 7/2010 | Chueh et al. |
| 2010/0185989 A1 | 7/2010 | Shiplacoff et al. |
| 2010/0188299 A1 | 7/2010 | Rinehart et al. |
| 2010/0188338 A1 | 7/2010 | Longe |
| 2010/0201308 A1 | 8/2010 | Lindholm |
| 2010/0201953 A1 | 8/2010 | Freeman et al. |
| 2010/0205472 A1 | 8/2010 | Tupman et al. |
| 2010/0206614 A1 | 8/2010 | Park et al. |
| 2010/0206644 A1 | 8/2010 | Yeh |
| 2010/0207774 A1 | 8/2010 | Song |
| 2010/0214214 A1 | 8/2010 | Corson et al. |
| 2010/0214249 A1 | 8/2010 | Ikeda et al. |
| 2010/0214257 A1 | 8/2010 | Wussler et al. |
| 2010/0214659 A1 | 8/2010 | Levola |
| 2010/0220205 A1 | 9/2010 | Lee et al. |
| 2010/0222110 A1 | 9/2010 | Kim et al. |
| 2010/0231498 A1 | 9/2010 | Large et al. |
| 2010/0231510 A1 | 9/2010 | Sampsell et al. |
| 2010/0231522 A1 | 9/2010 | Li |
| 2010/0231556 A1 | 9/2010 | Mines et al. |
| 2010/0235546 A1 | 9/2010 | Terlizzi et al. |
| 2010/0237970 A1 | 9/2010 | Liu |
| 2010/0238075 A1 | 9/2010 | Pourseyed |
| 2010/0238119 A1 | 9/2010 | Dubrovsky et al. |
| 2010/0238138 A1 | 9/2010 | Goertz et al. |
| 2010/0238270 A1 | 9/2010 | Bjelkhagen et al. |
| 2010/0238320 A1 | 9/2010 | Washisu |
| 2010/0238620 A1 | 9/2010 | Fish |
| 2010/0244577 A1 | 9/2010 | Shimokawa |
| 2010/0245106 A1 | 9/2010 | Miller |
| 2010/0245221 A1 | 9/2010 | Khan |
| 2010/0245289 A1 | 9/2010 | Svajda |
| 2010/0250975 A1 | 9/2010 | Gill et al. |
| 2010/0250988 A1 | 9/2010 | Okuda et al. |
| 2010/0259482 A1 | 10/2010 | Ball |
| 2010/0259876 A1 | 10/2010 | Kim |
| 2010/0265182 A1 | 10/2010 | Ball et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0282953 A1 | 11/2010 | Tam |
| 2010/0284085 A1 | 11/2010 | Laakkonen |
| 2010/0289457 A1 | 11/2010 | Onnerud et al. |
| 2010/0291331 A1 | 11/2010 | Schaefer |
| 2010/0295812 A1 | 11/2010 | Burns et al. |
| 2010/0296163 A1 | 11/2010 | Saarikko |
| 2010/0299642 A1 | 11/2010 | Merrell et al. |
| 2010/0302378 A1 | 12/2010 | Marks et al. |
| 2010/0302469 A1 | 12/2010 | Yue et al. |
| 2010/0304793 A1 | 12/2010 | Kim et al. |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0309617 A1 | 12/2010 | Wang et al. |
| 2010/0313680 A1 | 12/2010 | Joung et al. |
| 2010/0315345 A1 | 12/2010 | Laitinen |
| 2010/0315348 A1 * | 12/2010 | Jellicoe ................. G06F 3/041 345/173 |
| 2010/0315373 A1 * | 12/2010 | Steinhauser ............ G01L 1/205 345/174 |
| 2010/0315774 A1 | 12/2010 | Walker et al. |
| 2010/0321301 A1 * | 12/2010 | Casparian ............... G06F 3/016 345/168 |
| 2010/0321339 A1 | 12/2010 | Kimmel |
| 2010/0321482 A1 | 12/2010 | Cleveland |
| 2010/0321877 A1 | 12/2010 | Moser |
| 2010/0322479 A1 | 12/2010 | Cleveland |
| 2010/0324457 A1 | 12/2010 | Bean et al. |
| 2010/0325155 A1 | 12/2010 | Skinner et al. |
| 2010/0328203 A1 | 12/2010 | Hsu |
| 2010/0331059 A1 | 12/2010 | Apgar |
| 2011/0002577 A1 | 1/2011 | Van Ostrand |
| 2011/0007008 A1 | 1/2011 | Algreatly |
| 2011/0007047 A1 | 1/2011 | Fujioka et al. |
| 2011/0011650 A1 * | 1/2011 | Klinghult ............. G06F 3/0414 178/18.03 |
| 2011/0012866 A1 | 1/2011 | Keam |
| 2011/0012873 A1 | 1/2011 | Prest et al. |
| 2011/0015894 A1 | 1/2011 | Chu |
| 2011/0018799 A1 | 1/2011 | Lin |
| 2011/0019123 A1 | 1/2011 | Prest et al. |
| 2011/0031287 A1 | 2/2011 | Le Gette et al. |
| 2011/0032127 A1 * | 2/2011 | Roush .................. H01H 13/785 341/34 |

(56) References Cited

U.S. PATENT DOCUMENTS

| | | | |
|---|---|---|---|
| 2011/0032215 A1 | 2/2011 | Sirotich et al. | |
| 2011/0035209 A1 | 2/2011 | Macfarlane | |
| 2011/0036965 A1 | 2/2011 | Zhang et al. | |
| 2011/0037721 A1* | 2/2011 | Cranfill | G06F 3/0414 345/174 |
| 2011/0043142 A1 | 2/2011 | Travis et al. | |
| 2011/0043479 A1 | 2/2011 | van aerle et al. | |
| 2011/0043990 A1 | 2/2011 | Mickey et al. | |
| 2011/0044579 A1 | 2/2011 | Travis et al. | |
| 2011/0044582 A1 | 2/2011 | Travis et al. | |
| 2011/0045317 A1 | 2/2011 | Hao et al. | |
| 2011/0048754 A1 | 3/2011 | Xiong et al. | |
| 2011/0050576 A1 | 3/2011 | Forutanpour et al. | |
| 2011/0050587 A1 | 3/2011 | Natanzon et al. | |
| 2011/0050626 A1 | 3/2011 | Porter et al. | |
| 2011/0050946 A1 | 3/2011 | Lee et al. | |
| 2011/0055407 A1 | 3/2011 | Lydon et al. | |
| 2011/0057724 A1 | 3/2011 | Pabon | |
| 2011/0057899 A1* | 3/2011 | Sleeman | G01L 1/146 345/174 |
| 2011/0059771 A1 | 3/2011 | Kondo | |
| 2011/0060926 A1 | 3/2011 | Brooks et al. | |
| 2011/0069148 A1 | 3/2011 | Jones et al. | |
| 2011/0072391 A1 | 3/2011 | Hanggie et al. | |
| 2011/0074688 A1 | 3/2011 | Hull et al. | |
| 2011/0074702 A1 | 3/2011 | Pertuit et al. | |
| 2011/0075440 A1 | 3/2011 | Wang | |
| 2011/0080367 A1 | 4/2011 | Marchand et al. | |
| 2011/0081946 A1 | 4/2011 | Singh et al. | |
| 2011/0095994 A1 | 4/2011 | Birnbaum | |
| 2011/0096035 A1 | 4/2011 | Shen | |
| 2011/0096513 A1 | 4/2011 | Kim | |
| 2011/0099512 A1 | 4/2011 | Jeong | |
| 2011/0102326 A1* | 5/2011 | Casparian | G06F 3/016 345/168 |
| 2011/0102356 A1 | 5/2011 | Kemppinen et al. | |
| 2011/0102752 A1 | 5/2011 | Chen et al. | |
| 2011/0107958 A1* | 5/2011 | Pance | G06F 3/016 116/205 |
| 2011/0108401 A1 | 5/2011 | Yamada et al. | |
| 2011/0109572 A1* | 5/2011 | Deslippe | G06F 3/03547 345/173 |
| 2011/0109573 A1* | 5/2011 | Deslippe | G06F 3/044 345/173 |
| 2011/0113368 A1 | 5/2011 | Carvajal et al. | |
| 2011/0115738 A1* | 5/2011 | Suzuki | G01L 1/205 345/173 |
| 2011/0115747 A1 | 5/2011 | Powell et al. | |
| 2011/0117970 A1 | 5/2011 | Choi | |
| 2011/0118025 A1 | 5/2011 | Lukas et al. | |
| 2011/0119597 A1 | 5/2011 | Yellamraju et al. | |
| 2011/0122071 A1 | 5/2011 | Powell | |
| 2011/0134017 A1 | 6/2011 | Burke | |
| 2011/0134032 A1 | 6/2011 | Chiu et al. | |
| 2011/0134043 A1 | 6/2011 | Chen | |
| 2011/0134112 A1 | 6/2011 | Koh et al. | |
| 2011/0134161 A1 | 6/2011 | Son et al. | |
| 2011/0147398 A1 | 6/2011 | Ahee et al. | |
| 2011/0149094 A1 | 6/2011 | Chen et al. | |
| 2011/0157037 A1 | 6/2011 | Shamir et al. | |
| 2011/0157046 A1 | 6/2011 | Lee et al. | |
| 2011/0157087 A1 | 6/2011 | Kanehira et al. | |
| 2011/0157101 A1 | 6/2011 | Chang | |
| 2011/0163955 A1 | 7/2011 | Nasiri et al. | |
| 2011/0164357 A1 | 7/2011 | Yeom et al. | |
| 2011/0164370 A1 | 7/2011 | McClure et al. | |
| 2011/0167181 A1 | 7/2011 | Minoo et al. | |
| 2011/0167287 A1 | 7/2011 | Walsh et al. | |
| 2011/0167391 A1 | 7/2011 | Momeyer et al. | |
| 2011/0167992 A1 | 7/2011 | Eventoff et al. | |
| 2011/0169762 A1 | 7/2011 | Weiss | |
| 2011/0169778 A1 | 7/2011 | Nungester et al. | |
| 2011/0170289 A1 | 7/2011 | Allen et al. | |
| 2011/0176035 A1 | 7/2011 | Poulsen | |
| 2011/0179864 A1 | 7/2011 | Raasch et al. | |
| 2011/0181754 A1 | 7/2011 | Iwasaki | |
| 2011/0183120 A1 | 7/2011 | Sharygin et al. | |
| 2011/0184646 A1 | 7/2011 | Wong et al. | |
| 2011/0184824 A1 | 7/2011 | George et al. | |
| 2011/0188199 A1 | 8/2011 | Pan | |
| 2011/0191480 A1 | 8/2011 | Kobayashi | |
| 2011/0193787 A1 | 8/2011 | Morishige et al. | |
| 2011/0193938 A1 | 8/2011 | Oderwald et al. | |
| 2011/0197156 A1 | 8/2011 | Strait et al. | |
| 2011/0199389 A1 | 8/2011 | Lu et al. | |
| 2011/0202878 A1 | 8/2011 | Park et al. | |
| 2011/0205372 A1 | 8/2011 | Miramontes | |
| 2011/0216039 A1 | 9/2011 | Chen et al. | |
| 2011/0216266 A1 | 9/2011 | Travis | |
| 2011/0221659 A1 | 9/2011 | King et al. | |
| 2011/0221678 A1 | 9/2011 | Davydov | |
| 2011/0222238 A1 | 9/2011 | Staats et al. | |
| 2011/0227913 A1 | 9/2011 | Hyndman | |
| 2011/0228457 A1 | 9/2011 | Moon et al. | |
| 2011/0228462 A1 | 9/2011 | Dang | |
| 2011/0231682 A1 | 9/2011 | Kakish et al. | |
| 2011/0234494 A1 | 9/2011 | Peterson et al. | |
| 2011/0234502 A1 | 9/2011 | Yun et al. | |
| 2011/0234535 A1 | 9/2011 | Hung et al. | |
| 2011/0234881 A1 | 9/2011 | Wakabayashi et al. | |
| 2011/0235179 A1 | 9/2011 | Simmonds | |
| 2011/0241999 A1* | 10/2011 | Thier | G06F 3/023 345/168 |
| 2011/0242063 A1 | 10/2011 | Li et al. | |
| 2011/0242138 A1 | 10/2011 | Tribble | |
| 2011/0242298 A1 | 10/2011 | Bathiche et al. | |
| 2011/0242440 A1 | 10/2011 | Noma et al. | |
| 2011/0242670 A1 | 10/2011 | Simmonds | |
| 2011/0248152 A1 | 10/2011 | Svajda et al. | |
| 2011/0248920 A1 | 10/2011 | Larsen | |
| 2011/0248941 A1 | 10/2011 | Abdo et al. | |
| 2011/0259788 A1 | 10/2011 | Zeliff et al. | |
| 2011/0261001 A1 | 10/2011 | Liu | |
| 2011/0261083 A1 | 10/2011 | Wilson | |
| 2011/0261209 A1 | 10/2011 | Wu | |
| 2011/0262001 A1 | 10/2011 | Bi et al. | |
| 2011/0265287 A1 | 11/2011 | Li et al. | |
| 2011/0266672 A1 | 11/2011 | Sylvester | |
| 2011/0267272 A1 | 11/2011 | Meyer et al. | |
| 2011/0267300 A1 | 11/2011 | Serban et al. | |
| 2011/0267757 A1 | 11/2011 | Probst et al. | |
| 2011/0273475 A1 | 11/2011 | Herz et al. | |
| 2011/0284420 A1 | 11/2011 | Sajid | |
| 2011/0285555 A1 | 11/2011 | Bocirnea | |
| 2011/0290686 A1 | 12/2011 | Huang | |
| 2011/0291958 A1 | 12/2011 | Wu et al. | |
| 2011/0291993 A1 | 12/2011 | Miyazaki | |
| 2011/0295697 A1 | 12/2011 | Boston et al. | |
| 2011/0297566 A1 | 12/2011 | Gallagher et al. | |
| 2011/0298919 A1 | 12/2011 | Maglaque | |
| 2011/0302518 A1 | 12/2011 | Zhang | |
| 2011/0304577 A1 | 12/2011 | Brown et al. | |
| 2011/0304815 A1 | 12/2011 | Newell | |
| 2011/0304962 A1 | 12/2011 | Su | |
| 2011/0305875 A1 | 12/2011 | Sanford et al. | |
| 2011/0306424 A1 | 12/2011 | Kazama et al. | |
| 2011/0310038 A1 | 12/2011 | Park et al. | |
| 2011/0310548 A1 | 12/2011 | Ahn et al. | |
| 2011/0314425 A1 | 12/2011 | Chiang | |
| 2011/0316807 A1 | 12/2011 | Corrion | |
| 2011/0317399 A1 | 12/2011 | Hsu | |
| 2011/0320204 A1 | 12/2011 | Locker et al. | |
| 2012/0002052 A1 | 1/2012 | Muramatsu et al. | |
| 2012/0002820 A1 | 1/2012 | Leichter | |
| 2012/0007821 A1 | 1/2012 | Zaliva | |
| 2012/0008015 A1 | 1/2012 | Manabe | |
| 2012/0011462 A1 | 1/2012 | Westerman et al. | |
| 2012/0013490 A1 | 1/2012 | Pance | |
| 2012/0013519 A1 | 1/2012 | Hakansson et al. | |
| 2012/0019165 A1 | 1/2012 | Igaki et al. | |
| 2012/0019445 A1 | 1/2012 | Liu | |
| 2012/0019686 A1 | 1/2012 | Manabe | |
| 2012/0020019 A1 | 1/2012 | Chen et al. | |

(56) References Cited

U.S. PATENT DOCUMENTS

| | | |
|---|---|---|
| 2012/0020112 A1 | 1/2012 | Fisher et al. |
| 2012/0020490 A1 | 1/2012 | Leichter |
| 2012/0020556 A1 | 1/2012 | Manabe |
| 2012/0021618 A1 | 1/2012 | Schultz |
| 2012/0023401 A1 | 1/2012 | Arscott et al. |
| 2012/0023459 A1 | 1/2012 | Westerman |
| 2012/0024682 A1 | 2/2012 | Huang et al. |
| 2012/0026048 A1 | 2/2012 | Vazquez et al. |
| 2012/0026096 A1 | 2/2012 | Ku |
| 2012/0026110 A1 | 2/2012 | Yamano |
| 2012/0030616 A1 | 2/2012 | Howes et al. |
| 2012/0032887 A1 | 2/2012 | Chiu et al. |
| 2012/0032891 A1 | 2/2012 | Parivar |
| 2012/0032901 A1 | 2/2012 | Kwon |
| 2012/0032917 A1 | 2/2012 | Yamaguchi |
| 2012/0033306 A1 | 2/2012 | Valera et al. |
| 2012/0033369 A1 | 2/2012 | Wu et al. |
| 2012/0038495 A1 | 2/2012 | Ishikawa |
| 2012/0041721 A1 | 2/2012 | Chen |
| 2012/0044140 A1 | 2/2012 | Koyama et al. |
| 2012/0044179 A1 | 2/2012 | Hudson |
| 2012/0044379 A1 | 2/2012 | Manabe |
| 2012/0047368 A1 | 2/2012 | Chinn et al. |
| 2012/0050975 A1 | 3/2012 | Garelli et al. |
| 2012/0054674 A1 | 3/2012 | Beykpour et al. |
| 2012/0062564 A1 | 3/2012 | Miyashita |
| 2012/0062736 A1 | 3/2012 | Xiong |
| 2012/0062850 A1 | 3/2012 | Travis |
| 2012/0062998 A1 | 3/2012 | Schultz et al. |
| 2012/0068919 A1 | 3/2012 | Lauder et al. |
| 2012/0068933 A1 | 3/2012 | Larsen |
| 2012/0069413 A1 | 3/2012 | Schultz |
| 2012/0069540 A1 | 3/2012 | Lauder et al. |
| 2012/0071008 A1 | 3/2012 | Sessford |
| 2012/0072167 A1 | 3/2012 | Cretella, Jr. et al. |
| 2012/0075249 A1 | 3/2012 | Hoch |
| 2012/0075256 A1 | 3/2012 | Izadi et al. |
| 2012/0077384 A1 | 3/2012 | Bar-Niv et al. |
| 2012/0081316 A1 | 4/2012 | Sirpal et al. |
| 2012/0084548 A1 | 4/2012 | Cheng et al. |
| 2012/0084710 A1 | 4/2012 | Sirpal et al. |
| 2012/0087078 A1 | 4/2012 | Medica et al. |
| 2012/0092279 A1 | 4/2012 | Martin |
| 2012/0094257 A1 | 4/2012 | Pillischer et al. |
| 2012/0098872 A1 | 4/2012 | Kim et al. |
| 2012/0099263 A1 | 4/2012 | Lin |
| 2012/0099749 A1 | 4/2012 | Rubin et al. |
| 2012/0102436 A1 | 4/2012 | Nurmi |
| 2012/0102438 A1 | 4/2012 | Robinson et al. |
| 2012/0103778 A1 | 5/2012 | Obata et al. |
| 2012/0105321 A1 | 5/2012 | Wang et al. |
| 2012/0105481 A1 | 5/2012 | Baek et al. |
| 2012/0106078 A1 | 5/2012 | Probst et al. |
| 2012/0106082 A1 | 5/2012 | Wu et al. |
| 2012/0113031 A1 | 5/2012 | Lee et al. |
| 2012/0113137 A1 | 5/2012 | Nomoto |
| 2012/0113223 A1 | 5/2012 | Hilliges et al. |
| 2012/0113579 A1 | 5/2012 | Agata et al. |
| 2012/0115553 A1 | 5/2012 | Mahe et al. |
| 2012/0117409 A1 | 5/2012 | Lee et al. |
| 2012/0120493 A1 | 5/2012 | Simmonds et al. |
| 2012/0126445 A1 | 5/2012 | Rasmussen et al. |
| 2012/0127118 A1 | 5/2012 | Nolting et al. |
| 2012/0127126 A1 | 5/2012 | Mattice et al. |
| 2012/0127573 A1 | 5/2012 | Robinson et al. |
| 2012/0127646 A1 | 5/2012 | Moscovitch |
| 2012/0133561 A1 | 5/2012 | Konanur et al. |
| 2012/0133797 A1 | 5/2012 | Sato et al. |
| 2012/0134623 A1 | 5/2012 | Boudreau et al. |
| 2012/0139727 A1 | 6/2012 | Houvener et al. |
| 2012/0140396 A1 | 6/2012 | Zeliff et al. |
| 2012/0144331 A1 | 6/2012 | Tolonen et al. |
| 2012/0145525 A1 | 6/2012 | Ishikawa |
| 2012/0146863 A1 | 6/2012 | Kwon |
| 2012/0146943 A1 | 6/2012 | Fairley et al. |
| 2012/0155015 A1 | 6/2012 | Govindasamy et al. |
| 2012/0156875 A1 | 6/2012 | Srinivas et al. |
| 2012/0161406 A1 | 6/2012 | Mersky |
| 2012/0162088 A1 | 6/2012 | van lieshout et al. |
| 2012/0162126 A1 | 6/2012 | Yuan et al. |
| 2012/0162693 A1 | 6/2012 | Ito |
| 2012/0162889 A1 | 6/2012 | Han |
| 2012/0166980 A1 | 6/2012 | Yosef et al. |
| 2012/0170284 A1 | 7/2012 | Shedletsky |
| 2012/0175487 A1 | 7/2012 | Goto |
| 2012/0176322 A1 | 7/2012 | Karmi et al. |
| 2012/0176474 A1 | 7/2012 | Border |
| 2012/0182242 A1 | 7/2012 | Lindahl et al. |
| 2012/0182249 A1 | 7/2012 | Endo et al. |
| 2012/0182743 A1 | 7/2012 | Chou |
| 2012/0185803 A1 | 7/2012 | Wang et al. |
| 2012/0188243 A1 | 7/2012 | Fujii et al. |
| 2012/0188791 A1 | 7/2012 | Voloschenko et al. |
| 2012/0194393 A1 | 8/2012 | Uttermann et al. |
| 2012/0194448 A1 | 8/2012 | Rothkopf |
| 2012/0195063 A1 | 8/2012 | Kim et al. |
| 2012/0195553 A1 | 8/2012 | Hasegawa et al. |
| 2012/0200532 A1 | 8/2012 | Powell et al. |
| 2012/0200802 A1 | 8/2012 | Large |
| 2012/0206937 A1 | 8/2012 | Travis et al. |
| 2012/0212438 A1 | 8/2012 | Vaisanen |
| 2012/0218194 A1 | 8/2012 | Silverman |
| 2012/0221877 A1 | 8/2012 | Prabu |
| 2012/0223866 A1 | 9/2012 | Ayala Vazquez et al. |
| 2012/0224073 A1 | 9/2012 | Miyahara |
| 2012/0227259 A1 | 9/2012 | Badaye et al. |
| 2012/0229634 A1 | 9/2012 | Laett et al. |
| 2012/0235635 A1 | 9/2012 | Sato |
| 2012/0235790 A1 | 9/2012 | Zhao et al. |
| 2012/0235885 A1 | 9/2012 | Miller et al. |
| 2012/0235921 A1 | 9/2012 | Laubach |
| 2012/0242561 A1 | 9/2012 | Sugihara |
| 2012/0242584 A1 | 9/2012 | Tuli |
| 2012/0243102 A1 | 9/2012 | Takeda |
| 2012/0243165 A1 | 9/2012 | Chang et al. |
| 2012/0243204 A1 | 9/2012 | Robinson |
| 2012/0246377 A1 | 9/2012 | Bhesania |
| 2012/0249443 A1 | 10/2012 | Anderson et al. |
| 2012/0250873 A1 | 10/2012 | Bakalos et al. |
| 2012/0256829 A1 | 10/2012 | Dodge |
| 2012/0256848 A1 | 10/2012 | Madabusi Srinivasan |
| 2012/0256929 A1 | 10/2012 | Koenig et al. |
| 2012/0256959 A1 | 10/2012 | Ye et al. |
| 2012/0260177 A1 | 10/2012 | Sehrer |
| 2012/0262657 A1 | 10/2012 | Nakanishi et al. |
| 2012/0268911 A1 | 10/2012 | Lin |
| 2012/0268912 A1 | 10/2012 | Minami |
| 2012/0274578 A1 | 11/2012 | Snow et al. |
| 2012/0274811 A1 | 11/2012 | Bakin |
| 2012/0278744 A1 | 11/2012 | Kozitsyn et al. |
| 2012/0281129 A1 | 11/2012 | Wang et al. |
| 2012/0284297 A1 | 11/2012 | Aguera-arcas et al. |
| 2012/0287218 A1 | 11/2012 | Ok |
| 2012/0287562 A1 | 11/2012 | Wu et al. |
| 2012/0292535 A1 | 11/2012 | Choi et al. |
| 2012/0298491 A1 | 11/2012 | Ozias et al. |
| 2012/0299872 A1* | 11/2012 | Nishikawa ............... G06F 3/045 345/174 |
| 2012/0300275 A1 | 11/2012 | Vilardell et al. |
| 2012/0304092 A1 | 11/2012 | Jarrett et al. |
| 2012/0304116 A1 | 11/2012 | Donahue et al. |
| 2012/0306747 A1 | 12/2012 | Davidson et al. |
| 2012/0312955 A1 | 12/2012 | Randolph |
| 2012/0323933 A1 | 12/2012 | He et al. |
| 2012/0326003 A1 | 12/2012 | Solow et al. |
| 2012/0328349 A1* | 12/2012 | Isaac ................... G06F 3/04886 400/491 |
| 2012/0330162 A1 | 12/2012 | Rajan et al. |
| 2013/0002562 A1 | 1/2013 | Leskela et al. |
| 2013/0007665 A1 | 1/2013 | Chaudhri et al. |
| 2013/0009413 A1 | 1/2013 | Chiu et al. |
| 2013/0015311 A1 | 1/2013 | Kim |
| 2013/0016468 A1 | 1/2013 | Oh |
| 2013/0017696 A1 | 1/2013 | Alvarez Rivera |

(56) References Cited

U.S. PATENT DOCUMENTS

| | | |
|---|---|---|
| 2013/0021289 A1 | 1/2013 | Chen et al. |
| 2013/0024805 A1 | 1/2013 | In et al. |
| 2013/0027354 A1 | 1/2013 | Yabuta et al. |
| 2013/0027356 A1 | 1/2013 | Nishida |
| 2013/0027867 A1 | 1/2013 | Lauder et al. |
| 2013/0031353 A1 | 1/2013 | Noro |
| 2013/0038541 A1 | 2/2013 | Bakker |
| 2013/0044059 A1 | 2/2013 | Fu |
| 2013/0044074 A1 | 2/2013 | Park et al. |
| 2013/0046397 A1 | 2/2013 | Fadell et al. |
| 2013/0050922 A1 | 2/2013 | Lee et al. |
| 2013/0063465 A1 | 3/2013 | Zaman et al. |
| 2013/0063873 A1 | 3/2013 | Wodrich et al. |
| 2013/0067126 A1 | 3/2013 | Casparian et al. |
| 2013/0067259 A1 | 3/2013 | Freiwald et al. |
| 2013/0069916 A1 | 3/2013 | Estève |
| 2013/0073877 A1 | 3/2013 | Radke |
| 2013/0076614 A1 | 3/2013 | Ive et al. |
| 2013/0076617 A1 | 3/2013 | Csaszar et al. |
| 2013/0076635 A1 | 3/2013 | Lin |
| 2013/0082824 A1 | 4/2013 | Colley |
| 2013/0082950 A1 | 4/2013 | Lim et al. |
| 2013/0083466 A1 | 4/2013 | Becze et al. |
| 2013/0088431 A1 | 4/2013 | Ballagas et al. |
| 2013/0093388 A1 | 4/2013 | Partovi |
| 2013/0093679 A1 | 4/2013 | Dickinson et al. |
| 2013/0094131 A1 | 4/2013 | O'donnell et al. |
| 2013/0100008 A1 | 4/2013 | Marti et al. |
| 2013/0100030 A1* | 4/2013 | Los .............. G06F 3/023 345/169 |
| 2013/0100082 A1 | 4/2013 | Bakin et al. |
| 2013/0106592 A1 | 5/2013 | Morgan et al. |
| 2013/0106723 A1 | 5/2013 | Bakken |
| 2013/0106766 A1 | 5/2013 | Yilmaz et al. |
| 2013/0106813 A1 | 5/2013 | Hotelling et al. |
| 2013/0107144 A1 | 5/2013 | Marhefka et al. |
| 2013/0107572 A1 | 5/2013 | Holman et al. |
| 2013/0118878 A1 | 5/2013 | Purcocks |
| 2013/0118933 A1 | 5/2013 | Wang et al. |
| 2013/0120466 A1 | 5/2013 | Chen et al. |
| 2013/0120760 A1 | 5/2013 | Raguin et al. |
| 2013/0127980 A1* | 5/2013 | Haddick .......... G06F 3/013 348/14.08 |
| 2013/0128102 A1 | 5/2013 | Yano |
| 2013/0135214 A1 | 5/2013 | Li et al. |
| 2013/0148864 A1 | 6/2013 | Dolson et al. |
| 2013/0151944 A1 | 6/2013 | Lin |
| 2013/0154959 A1 | 6/2013 | Lindsay et al. |
| 2013/0155723 A1* | 6/2013 | Coleman .......... G02B 6/0018 362/621 |
| 2013/0156080 A1 | 6/2013 | Cheng et al. |
| 2013/0159417 A1 | 6/2013 | Meckler et al. |
| 2013/0159749 A1 | 6/2013 | Moeglein et al. |
| 2013/0162554 A1 | 6/2013 | Lauder et al. |
| 2013/0170802 A1 | 7/2013 | Pitwon |
| 2013/0172906 A1 | 7/2013 | Olson et al. |
| 2013/0181926 A1 | 7/2013 | Lim |
| 2013/0182246 A1 | 7/2013 | Tanase |
| 2013/0187753 A1 | 7/2013 | Chiriyankandath |
| 2013/0191741 A1 | 7/2013 | Dickinson et al. |
| 2013/0201094 A1 | 8/2013 | Travis |
| 2013/0207896 A1 | 8/2013 | Robinson et al. |
| 2013/0207937 A1 | 8/2013 | Lutian et al. |
| 2013/0212483 A1 | 8/2013 | Brakensiek et al. |
| 2013/0215035 A1 | 8/2013 | Guard |
| 2013/0216108 A1 | 8/2013 | Hwang et al. |
| 2013/0217451 A1 | 8/2013 | Komiyama et al. |
| 2013/0222272 A1 | 8/2013 | Martin, Jr. |
| 2013/0222274 A1 | 8/2013 | Mori et al. |
| 2013/0222275 A1 | 8/2013 | Byrd et al. |
| 2013/0222323 A1 | 8/2013 | McKenzie |
| 2013/0222353 A1 | 8/2013 | Large |
| 2013/0222681 A1 | 8/2013 | Wan |
| 2013/0226794 A1 | 8/2013 | Englebardt |
| 2013/0227836 A1 | 9/2013 | Whitt, III et al. |
| 2013/0228023 A1 | 9/2013 | Drasnin |
| 2013/0228433 A1 | 9/2013 | Shaw |
| 2013/0228434 A1* | 9/2013 | Whitt, III .............. G06F 1/1618 200/5 A |
| 2013/0228435 A1 | 9/2013 | Whitt, III |
| 2013/0228439 A1 | 9/2013 | Whitt, III |
| 2013/0229100 A1 | 9/2013 | Siddiqui et al. |
| 2013/0229335 A1 | 9/2013 | Whitman |
| 2013/0229347 A1 | 9/2013 | Lutz, III |
| 2013/0229350 A1 | 9/2013 | Shaw et al. |
| 2013/0229351 A1 | 9/2013 | Whitt, III |
| 2013/0229354 A1 | 9/2013 | Whitt, III et al. |
| 2013/0229356 A1 | 9/2013 | Marwah et al. |
| 2013/0229357 A1 | 9/2013 | Powell |
| 2013/0229363 A1 | 9/2013 | Whitman |
| 2013/0229366 A1 | 9/2013 | Dighde |
| 2013/0229380 A1 | 9/2013 | Lutz, III |
| 2013/0229386 A1 | 9/2013 | Bathiche |
| 2013/0229534 A1 | 9/2013 | Panay |
| 2013/0229568 A1 | 9/2013 | Belesiu et al. |
| 2013/0229570 A1 | 9/2013 | Beck et al. |
| 2013/0229756 A1 | 9/2013 | Whitt, III |
| 2013/0229757 A1 | 9/2013 | Whitt, III et al. |
| 2013/0229758 A1 | 9/2013 | Belesiu et al. |
| 2013/0229759 A1 | 9/2013 | Whitt, III et al. |
| 2013/0229760 A1 | 9/2013 | Whitt, III |
| 2013/0229761 A1 | 9/2013 | Shaw |
| 2013/0229762 A1 | 9/2013 | Whitt, III |
| 2013/0229773 A1 | 9/2013 | Siddiqui et al. |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler et al. |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0232742 A1 | 9/2013 | Burnett et al. |
| 2013/0241860 A1 | 9/2013 | Ciesla et al. |
| 2013/0242495 A1 | 9/2013 | Bathiche et al. |
| 2013/0262886 A1 | 10/2013 | Nishimura |
| 2013/0265220 A1 | 10/2013 | Fleischmann et al. |
| 2013/0268897 A1 | 10/2013 | Li et al. |
| 2013/0278552 A1 | 10/2013 | Kamin-Lyndgaard |
| 2013/0283212 A1 | 10/2013 | Zhu et al. |
| 2013/0285922 A1 | 10/2013 | Alberth, Jr. et al. |
| 2013/0300590 A1 | 11/2013 | Dietz |
| 2013/0300647 A1 | 11/2013 | Drasnin |
| 2013/0300684 A1 | 11/2013 | Kim et al. |
| 2013/0301199 A1 | 11/2013 | Whitt |
| 2013/0301206 A1 | 11/2013 | Whitt |
| 2013/0304941 A1 | 11/2013 | Drasnin |
| 2013/0304944 A1 | 11/2013 | Young |
| 2013/0305184 A1 | 11/2013 | Kim et al. |
| 2013/0307935 A1 | 11/2013 | Rappel et al. |
| 2013/0308339 A1 | 11/2013 | Woodgate et al. |
| 2013/0321992 A1 | 12/2013 | Liu et al. |
| 2013/0322000 A1 | 12/2013 | Whitt |
| 2013/0322001 A1 | 12/2013 | Whitt |
| 2013/0328761 A1 | 12/2013 | Boulanger |
| 2013/0329301 A1 | 12/2013 | Travis |
| 2013/0329360 A1 | 12/2013 | Aldana |
| 2013/0332628 A1 | 12/2013 | Panay |
| 2013/0335330 A1 | 12/2013 | Lane |
| 2013/0335387 A1 | 12/2013 | Emerton |
| 2013/0335891 A1 | 12/2013 | Chen et al. |
| 2013/0335902 A1 | 12/2013 | Campbell |
| 2013/0335903 A1 | 12/2013 | Raken |
| 2013/0339757 A1 | 12/2013 | Reddy |
| 2013/0342464 A1 | 12/2013 | Bathiche et al. |
| 2013/0342465 A1 | 12/2013 | Bathiche |
| 2013/0342976 A1 | 12/2013 | Chung |
| 2013/0343291 A1 | 12/2013 | Gao |
| 2013/0346636 A1 | 12/2013 | Bathiche |
| 2013/0346725 A1 | 12/2013 | Lomet et al. |
| 2013/0346882 A1 | 12/2013 | Shiplacoff et al. |
| 2014/0012401 A1 | 1/2014 | Perek et al. |
| 2014/0022177 A1* | 1/2014 | Shaw ............... G06F 1/1669 345/168 |

(56) References Cited

U.S. PATENT DOCUMENTS

| | | |
|---|---|---|
| 2014/0022265 A1 | 1/2014 | Canan et al. |
| 2014/0022629 A1 | 1/2014 | Powell |
| 2014/0028635 A1 | 1/2014 | Krah |
| 2014/0029180 A1 | 1/2014 | Nishimura et al. |
| 2014/0029183 A1 | 1/2014 | Ashcraft et al. |
| 2014/0036430 A1 | 2/2014 | Wroblewski et al. |
| 2014/0043275 A1 | 2/2014 | Whitman |
| 2014/0048399 A1 | 2/2014 | Whitt, III |
| 2014/0049894 A1 | 2/2014 | Rihn |
| 2014/0053108 A1 | 2/2014 | Johansson |
| 2014/0055624 A1 | 2/2014 | Gaines |
| 2014/0059139 A1 | 2/2014 | Filev et al. |
| 2014/0063198 A1 | 3/2014 | Boulanger |
| 2014/0063367 A1 | 3/2014 | Yang et al. |
| 2014/0069791 A1 | 3/2014 | Chu et al. |
| 2014/0078063 A1 | 3/2014 | Bathiche |
| 2014/0083883 A1 | 3/2014 | Elias |
| 2014/0085814 A1 | 3/2014 | Kielland |
| 2014/0086081 A1 | 3/2014 | Mack et al. |
| 2014/0089833 A1 | 3/2014 | Hwang et al. |
| 2014/0092765 A1 | 4/2014 | Agarwal et al. |
| 2014/0098058 A1* | 4/2014 | Baharav ............... G06F 3/0421 345/174 |
| 2014/0098085 A1 | 4/2014 | Lee et al. |
| 2014/0104189 A1 | 4/2014 | Marshall et al. |
| 2014/0104665 A1 | 4/2014 | Popovich et al. |
| 2014/0111865 A1 | 4/2014 | Kobayashi |
| 2014/0116982 A1 | 5/2014 | Schellenberg et al. |
| 2014/0117928 A1 | 5/2014 | Liao |
| 2014/0118241 A1 | 5/2014 | Chai |
| 2014/0119802 A1 | 5/2014 | Shaw |
| 2014/0123273 A1 | 5/2014 | Matus |
| 2014/0125864 A1 | 5/2014 | Rihn et al. |
| 2014/0131000 A1 | 5/2014 | Bornemann et al. |
| 2014/0132550 A1 | 5/2014 | McCracken et al. |
| 2014/0133456 A1 | 5/2014 | Donepudi et al. |
| 2014/0135060 A1 | 5/2014 | Mercer |
| 2014/0139989 A1 | 5/2014 | Mori et al. |
| 2014/0143247 A1 | 5/2014 | Rathnavelu et al. |
| 2014/0143708 A1 | 5/2014 | Yang et al. |
| 2014/0148170 A1 | 5/2014 | Damji et al. |
| 2014/0148938 A1 | 5/2014 | Zhang |
| 2014/0153390 A1 | 6/2014 | Ishii et al. |
| 2014/0154523 A1 | 6/2014 | Bornemann |
| 2014/0155031 A1 | 6/2014 | Lee et al. |
| 2014/0155123 A1 | 6/2014 | Lee et al. |
| 2014/0166227 A1 | 6/2014 | Bornemann et al. |
| 2014/0167585 A1 | 6/2014 | Kuan et al. |
| 2014/0168131 A1 | 6/2014 | Rihn et al. |
| 2014/0185215 A1 | 7/2014 | Whitt et al. |
| 2014/0185220 A1 | 7/2014 | Whitt et al. |
| 2014/0194095 A1 | 7/2014 | Wynne et al. |
| 2014/0196143 A1 | 7/2014 | Fliderman et al. |
| 2014/0197058 A1 | 7/2014 | Huet et al. |
| 2014/0204514 A1 | 7/2014 | Whitt |
| 2014/0204515 A1 | 7/2014 | Whitt |
| 2014/0221098 A1 | 8/2014 | Boulanger |
| 2014/0225821 A1 | 8/2014 | Kim et al. |
| 2014/0233237 A1 | 8/2014 | Lutian |
| 2014/0240842 A1 | 8/2014 | Nguyen et al. |
| 2014/0247546 A1 | 9/2014 | Whitt |
| 2014/0248506 A1 | 9/2014 | Mccormack et al. |
| 2014/0254032 A1 | 9/2014 | Chen |
| 2014/0258937 A1 | 9/2014 | Lee |
| 2014/0283142 A1 | 9/2014 | Shepherd et al. |
| 2014/0291134 A1 | 10/2014 | Whitt |
| 2014/0293534 A1 | 10/2014 | Siddiqui |
| 2014/0310646 A1 | 10/2014 | Vranjes et al. |
| 2014/0313401 A1 | 10/2014 | Rihn et al. |
| 2014/0313665 A1 | 10/2014 | Delpier et al. |
| 2014/0314374 A1 | 10/2014 | Fattal et al. |
| 2014/0362506 A1 | 12/2014 | Whitt, III et al. |
| 2014/0370937 A1 | 12/2014 | Park et al. |
| 2014/0372914 A1 | 12/2014 | Byrd et al. |
| 2014/0374230 A1 | 12/2014 | Shaw et al. |
| 2014/0378099 A1 | 12/2014 | Huang et al. |
| 2014/0379942 A1 | 12/2014 | Perek et al. |
| 2014/0379991 A1 | 12/2014 | Lomet et al. |
| 2015/0005953 A1 | 1/2015 | Fadell et al. |
| 2015/0020122 A1 | 1/2015 | Shin et al. |
| 2015/0022995 A1 | 1/2015 | Peterson et al. |
| 2015/0026092 A1 | 1/2015 | Abboud et al. |
| 2015/0036274 A1 | 2/2015 | Belesiu et al. |
| 2015/0070119 A1 | 3/2015 | Rihn et al. |
| 2015/0086174 A1 | 3/2015 | Abecassis et al. |
| 2015/0117444 A1 | 4/2015 | Sandblad et al. |
| 2015/0161834 A1 | 6/2015 | Spahl et al. |
| 2015/0172264 A1 | 6/2015 | Hardy |
| 2015/0177497 A1 | 6/2015 | Travis |
| 2015/0185950 A1 | 7/2015 | Watanabe et al. |
| 2015/0212553 A1 | 7/2015 | Park et al. |
| 2015/0227212 A1 | 8/2015 | Whitt, III et al. |
| 2015/0228105 A1 | 8/2015 | Harley et al. |
| 2015/0234108 A1 | 8/2015 | Harley, Jr. |
| 2015/0234478 A1 | 8/2015 | Belesiu et al. |
| 2015/0241929 A1 | 8/2015 | Raken et al. |
| 2015/0243236 A1 | 8/2015 | Jain et al. |
| 2015/0253872 A1 | 9/2015 | Reyes |
| 2015/0261262 A1 | 9/2015 | Whitt, III et al. |
| 2015/0268699 A1 | 9/2015 | Bathiche et al. |
| 2015/0277500 A1 | 10/2015 | Turowski et al. |
| 2015/0286125 A1 | 10/2015 | Powell |
| 2015/0311014 A1 | 10/2015 | Shaw et al. |
| 2015/0312453 A1 | 10/2015 | Gaines et al. |
| 2015/0317062 A1 | 11/2015 | Jarrett et al. |
| 2015/0378392 A1 | 12/2015 | Siddiqui et al. |
| 2016/0034284 A1 | 2/2016 | Won et al. |
| 2016/0034424 A1 | 2/2016 | Won |
| 2016/0034695 A1 | 2/2016 | Won et al. |
| 2016/0037481 A1 | 2/2016 | Won et al. |
| 2016/0090767 A1 | 3/2016 | Park et al. |
| 2016/0124467 A1 | 5/2016 | Whitt et al. |
| 2016/0143170 A9 | 5/2016 | Mccormack et al. |
| 2016/0170935 A1 | 6/2016 | Drasnin |
| 2016/0209884 A1 | 7/2016 | Whitt et al. |
| 2016/0246441 A1* | 8/2016 | Westerman ............ G06F 3/0235 |
| 2016/0299537 A1 | 10/2016 | Whitt et al. |
| 2016/0306396 A1 | 10/2016 | Bathiche et al. |
| 2017/0108941 A1* | 4/2017 | Asbjornsen ............ G06F 1/1662 |
| 2017/0147084 A1 | 5/2017 | Whitt et al. |
| 2017/0177038 A1 | 6/2017 | Whitt et al. |

FOREIGN PATENT DOCUMENTS

| | | |
|---|---|---|
| CN | 2363007 | 2/2000 |
| CN | 1352767 | 6/2002 |
| CN | 1394119 A | 1/2003 |
| CN | 1440513 | 9/2003 |
| CN | 1467615 A | 1/2004 |
| CN | 1489031 | 4/2004 |
| CN | 1515937 A | 7/2004 |
| CN | 1537223 | 10/2004 |
| CN | 1603072 A | 4/2005 |
| CN | 1650202 A | 8/2005 |
| CN | 1653411 | 8/2005 |
| CN | 1700072 A | 11/2005 |
| CN | 1787605 | 6/2006 |
| CN | 1808362 | 7/2006 |
| CN | 1904823 A | 1/2007 |
| CN | 1920642 A | 2/2007 |
| CN | 2881760 | 3/2007 |
| CN | 101036104 A | 9/2007 |
| CN | 101038401 A | 9/2007 |
| CN | 200947406 | 9/2007 |
| CN | 101105512 A | 1/2008 |
| CN | 101198925 | 6/2008 |
| CN | 101335147 | 12/2008 |
| CN | 101366001 | 2/2009 |
| CN | 101388482 A | 3/2009 |
| CN | 101410781 | 4/2009 |
| CN | 101452334 | 6/2009 |
| CN | 101464750 | 6/2009 |
| CN | 101473167 A | 7/2009 |
| CN | 101490642 | 7/2009 |

(56) References Cited

FOREIGN PATENT DOCUMENTS

| | | |
|---|---|---|
| CN | 101500388 | 8/2009 |
| CN | 101512403 A | 8/2009 |
| CN | 101644979 | 2/2010 |
| CN | 101675406 | 3/2010 |
| CN | 101681189 | 3/2010 |
| CN | 101688991 A | 3/2010 |
| CN | 101765825 | 6/2010 |
| CN | 101889225 A | 11/2010 |
| CN | 101893785 A | 11/2010 |
| CN | 101904661 | 12/2010 |
| CN | 101908428 | 12/2010 |
| CN | 102004559 | 4/2011 |
| CN | 102004577 | 4/2011 |
| CN | 102012772 A | 4/2011 |
| CN | 1102012763 | 4/2011 |
| CN | 102047155 A | 5/2011 |
| CN | 102096494 | 6/2011 |
| CN | 102112947 | 6/2011 |
| CN | 201853163 | 6/2011 |
| CN | 102117121 | 7/2011 |
| CN | 102124532 | 7/2011 |
| CN | 102138113 | 7/2011 |
| CN | 102147643 | 8/2011 |
| CN | 102156510 | 8/2011 |
| CN | 201936231 | 8/2011 |
| CN | 102214040 | 10/2011 |
| CN | 102292687 | 12/2011 |
| CN | 202119579 U | 1/2012 |
| CN | 102339683 | 2/2012 |
| CN | 102356624 | 2/2012 |
| CN | 202441167 | 9/2012 |
| CN | 102778956 A | 11/2012 |
| CN | 102937231 | 2/2013 |
| CN | 103455097 | 12/2013 |
| CN | 103455149 | 12/2013 |
| CN | 103543904 A | 1/2014 |
| CN | 203480365 | 3/2014 |
| CN | 203606723 | 5/2014 |
| DE | 19924694 | 3/2001 |
| DE | 10116556 | 10/2002 |
| DE | 202010005274 U1 | 7/2010 |
| EP | 0271956 A2 | 6/1988 |
| EP | 0276048 A1 | 7/1988 |
| EP | 645726 | 3/1995 |
| EP | 977022 A2 | 2/2000 |
| EP | 1003188 | 5/2000 |
| EP | 1223722 | 7/2002 |
| EP | 1425763 | 6/2004 |
| EP | 1480029 | 11/2004 |
| EP | 1591891 | 11/2005 |
| EP | 1847924 A1 | 10/2007 |
| EP | 1983411 | 10/2008 |
| EP | 2006869 | 12/2008 |
| EP | 2009660 | 12/2008 |
| EP | 2026178 | 2/2009 |
| EP | 2083310 A2 | 7/2009 |
| EP | 2207076 | 7/2010 |
| EP | 2353978 | 8/2011 |
| EP | 2378607 | 10/2011 |
| EP | 2381290 | 10/2011 |
| EP | 2400365 | 12/2011 |
| EP | 2410408 | 1/2012 |
| EP | 2423787 | 2/2012 |
| EP | 2618247 A1 | 7/2013 |
| EP | 2662761 A1 | 11/2013 |
| EP | 2752691 A1 | 7/2014 |
| FR | 2942811 A1 | 9/2010 |
| GB | 1100331 A | 1/1968 |
| GB | 2068643 | 8/1981 |
| GB | 2123213 | 1/1984 |
| GB | 2178570 | 2/1987 |
| GB | 2305780 | 4/1997 |
| GB | 2381584 | 5/2003 |
| GB | 2402460 | 12/2004 |
| GB | 2410116 A | 7/2005 |
| GB | 2428101 A | 1/2007 |
| GB | 2482931 A | 2/2012 |
| GB | 2482932 | 2/2012 |
| GB | 2504944 | 2/2014 |
| JP | 52107722 | 9/1977 |
| JP | 56108127 | 8/1981 |
| JP | S56159134 A | 12/1981 |
| JP | S57126617 | 8/1982 |
| JP | S57126617 U | 8/1982 |
| JP | S5810335 | 1/1983 |
| JP | S593824 | 1/1984 |
| JP | 6014315 | 1/1985 |
| JP | S6014315 A | 1/1985 |
| JP | S6037923 | 8/1985 |
| JP | S60216479 | 10/1985 |
| JP | H0195596 | 4/1989 |
| JP | H0245820 | 2/1990 |
| JP | H03151693 A | 6/1991 |
| JP | H04317899 A | 11/1992 |
| JP | 04363823 | 12/1992 |
| JP | 4363823 | 12/1992 |
| JP | 06250761 | 9/1994 |
| JP | H107218865 A | 8/1995 |
| JP | 08273471 | 10/1996 |
| JP | 3602207 B2 | 1/1997 |
| JP | H10980354 A | 3/1997 |
| JP | H109178949 A | 7/1997 |
| JP | H104540 | 1/1998 |
| JP | H104540 A | 1/1998 |
| JP | H1078357 | 3/1998 |
| JP | H10234057 | 9/1998 |
| JP | H10234057 A | 9/1998 |
| JP | 10301055 | 11/1998 |
| JP | 10326124 | 12/1998 |
| JP | 1173239 | 3/1999 |
| JP | H1173239 A | 3/1999 |
| JP | H11248557 A | 9/1999 |
| JP | 11338575 | 12/1999 |
| JP | 11345041 | 12/1999 |
| JP | 2000010654 | 1/2000 |
| JP | 2000035849 | 2/2000 |
| JP | 2000076966 A | 3/2000 |
| JP | 2000106021 | 4/2000 |
| JP | 2000231386 A | 8/2000 |
| JP | 2000347037 A | 12/2000 |
| JP | 2001142564 | 5/2001 |
| JP | 2001174746 | 6/2001 |
| JP | 2001243707 A | 9/2001 |
| JP | 2002100226 A | 4/2002 |
| JP | 2002162912 | 6/2002 |
| JP | 2002170458 | 6/2002 |
| JP | 2002300438 | 10/2002 |
| JP | 2002358852 | 12/2002 |
| JP | 2002366277 | 12/2002 |
| JP | 2003051227 A | 2/2003 |
| JP | 2003140775 A | 5/2003 |
| JP | 2003215349 A | 7/2003 |
| JP | 2003256106 | 9/2003 |
| JP | 2003257282 | 9/2003 |
| JP | 2003529837 | 10/2003 |
| JP | 2004038950 | 2/2004 |
| JP | 2004138167 A | 5/2004 |
| JP | 2004171948 A | 6/2004 |
| JP | 2004227071 A | 8/2004 |
| JP | 2004234662 | 8/2004 |
| JP | 2004259173 | 9/2004 |
| JP | 2005031555 | 2/2005 |
| JP | 2005077437 A | 3/2005 |
| JP | 2005078104 | 3/2005 |
| JP | 2005117161 | 4/2005 |
| JP | 2005135694 A | 5/2005 |
| JP | 2005156932 A | 6/2005 |
| JP | 2005071728 | 8/2005 |
| JP | 2005213142 A | 8/2005 |
| JP | 2005302447 | 10/2005 |
| JP | 2005331565 | 12/2005 |
| JP | 2006004063 | 1/2006 |
| JP | 2006004877 A | 1/2006 |
| JP | 2006093461 | 4/2006 |

(56) References Cited

FOREIGN PATENT DOCUMENTS

| | | |
|---|---|---|
| JP | 2006127486 | 5/2006 |
| JP | 2006160155 | 6/2006 |
| JP | 2006163459 | 6/2006 |
| JP | 2006266812 | 10/2006 |
| JP | 2006278251 A | 10/2006 |
| JP | 2006292375 | 10/2006 |
| JP | 2006294361 | 10/2006 |
| JP | 2006310269 A | 11/2006 |
| JP | 2007042004 | 2/2007 |
| JP | 2007184286 A | 7/2007 |
| JP | 2007258774 A | 10/2007 |
| JP | 2007273288 A | 10/2007 |
| JP | 2007279577 A | 10/2007 |
| JP | 2008066152 A | 3/2008 |
| JP | 2008140182 | 6/2008 |
| JP | 2008152805 | 7/2008 |
| JP | 2008286874 A | 7/2008 |
| JP | 2008529251 A | 7/2008 |
| JP | 2008181523 | 8/2008 |
| JP | 2008298435 | 12/2008 |
| JP | 2009003053 A | 1/2009 |
| JP | 2009009854 | 1/2009 |
| JP | 2009059583 A | 3/2009 |
| JP | 2009122551 | 6/2009 |
| JP | 2009222079 A | 10/2009 |
| JP | 2009232326 A | 10/2009 |
| JP | 2010109589 A | 5/2010 |
| JP | 2010151951 A | 7/2010 |
| JP | 2010244514 | 10/2010 |
| JP | 2010249305 A | 11/2010 |
| JP | 2010272384 | 12/2010 |
| JP | 2011027815 A | 2/2011 |
| JP | 2012204127 A | 3/2011 |
| JP | 2011150737 | 8/2011 |
| JP | 2011170834 | 9/2011 |
| JP | 2011221640 | 11/2011 |
| JP | 2012027875 | 2/2012 |
| JP | 2012182456 A | 9/2012 |
| JP | 2003077368 | 3/2014 |
| KR | 20010039013 | 5/2001 |
| KR | 20010039013 A | 5/2001 |
| KR | 20010107055 | 12/2001 |
| KR | 20040003709 A | 1/2004 |
| KR | 20040066647 | 7/2004 |
| KR | 20050014299 | 2/2005 |
| KR | 20060003093 | 1/2006 |
| KR | 20060055307 A | 5/2006 |
| KR | 1020070001771 A | 1/2007 |
| KR | 20080006404 | 1/2008 |
| KR | 20080009490 | 1/2008 |
| KR | 20080055051 | 6/2008 |
| KR | 20090029411 | 3/2009 |
| KR | 1020090084316 A | 8/2009 |
| KR | 20100022059 | 2/2010 |
| KR | 20100067366 | 6/2010 |
| KR | 20100115675 | 10/2010 |
| KR | 20110064265 | 6/2011 |
| KR | 1020110087178 | 8/2011 |
| KR | 20110109791 | 10/2011 |
| KR | 20110120002 | 11/2011 |
| KR | 20110122333 | 11/2011 |
| KR | 20110138943 A | 12/2011 |
| KR | 101113530 | 2/2012 |
| KR | 20120015749 A | 2/2012 |
| NL | 1038411 | 5/2012 |
| TW | 201407202 A | 2/2014 |
| WO | WO-1991008915 | 6/1991 |
| WO | 9414587 A2 | 7/1994 |
| WO | WO-1999019995 | 4/1999 |
| WO | WO-1999064784 | 12/1999 |
| WO | 0072079 A2 | 11/2000 |
| WO | WO-2000079327 | 12/2000 |
| WO | WO-0128309 | 4/2001 |
| WO | 0133282 A1 | 5/2001 |
| WO | 0172037 A1 | 9/2001 |
| WO | 03048635 A1 | 6/2003 |
| WO | 03083530 A1 | 10/2003 |
| WO | WO-2003106134 | 12/2003 |
| WO | WO-2005027696 | 3/2005 |
| WO | WO-2005059874 | 6/2005 |
| WO | WO-2006044818 | 4/2006 |
| WO | 2006054056 A1 | 5/2006 |
| WO | 2006082444 A2 | 8/2006 |
| WO | 2007057500 A1 | 5/2007 |
| WO | 2007094304 A1 | 8/2007 |
| WO | WO-2007103631 | 9/2007 |
| WO | WO-2007112172 | 10/2007 |
| WO | 2007123202 A1 | 11/2007 |
| WO | 2008013146 A1 | 1/2008 |
| WO | 2008038016 A1 | 4/2008 |
| WO | WO-2008055039 | 5/2008 |
| WO | WO-2008117529 | 10/2008 |
| WO | 2009020264 A1 | 2/2009 |
| WO | WO-2009034484 | 3/2009 |
| WO | 2009050942 A1 | 4/2009 |
| WO | WO-2010011983 | 1/2010 |
| WO | WO-2010074116 | 7/2010 |
| WO | 2010100360 A1 | 9/2010 |
| WO | WO-2010105272 | 9/2010 |
| WO | WO-2010147609 | 12/2010 |
| WO | WO-2011016200 | 2/2011 |
| WO | WO-2011049609 | 4/2011 |
| WO | WO-2011071096 | 6/2011 |
| WO | 2011131978 A1 | 10/2011 |
| WO | WO-2011138200 | 11/2011 |
| WO | WO-2012036717 | 3/2012 |
| WO | 2012063410 A1 | 5/2012 |
| WO | 2012174364 A2 | 12/2012 |
| WO | 2012177811 A1 | 12/2012 |
| WO | WO-2013012699 | 1/2013 |
| WO | 2013033274 A1 | 3/2013 |
| WO | WO 2013033067 | 3/2013 |
| WO | 2013049908 A1 | 4/2013 |
| WO | 2013163347 A1 | 10/2013 |
| WO | 2014051920 A1 | 4/2014 |
| WO | 2014071308 A1 | 5/2014 |
| WO | 2014084872 A3 | 6/2014 |
| WO | 2014085502 A1 | 6/2014 |
| WO | 2014088343 A1 | 6/2014 |
| WO | 2014130383 A1 | 8/2014 |
| WO | 2014209818 A1 | 12/2014 |

OTHER PUBLICATIONS

"ACPI Docking for Windows Operating Systems", Retrieved from: <http://www.scritube.com/limba/engleza/software/ACPI-Docking-for-Windows-Opera331824193.php> on Jul. 6, 2012, 2012, 10 pages.

"Advanced Configuration and Power Management Specification", Intel Corporation, Microsoft Corporation, Toshiba Corp. Revision 1, Dec. 22, 1996, 364 pages.

"Advisory Action", U.S. Appl. No. 13/471,376, dated Sep. 23, 2015, 7 pages.

"Advisory Action", U.S. Appl. No. 13/939,032, dated Feb. 24, 2014, 2 pages.

"Advisory Action", U.S. Appl. No. 14/059,280, dated Sep. 25, 2015, 7 pages.

"Advisory Action", U.S. Appl. No. 14/199,924, dated May 28, 2014, 2 pages.

"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, Jan. 2013, 1 page.

"Corrected Notice of Allowance", U.S. Appl. No. 13/470,633, dated Apr. 9, 2013, 2 pages.

"Corrected Notice of Allowance", U.S. Appl. No. 13/470,633, dated Jul. 2, 2013, 2 pages.

"Corrected Notice of Allowance", U.S. Appl. No. 13/470,951, dated Jul. 8, 2016, 2 pages.

"Corrected Notice of Allowance", U.S. Appl. No. 13/471,030, dated Aug. 10, 2015, 2 pages.

(56) References Cited

OTHER PUBLICATIONS

"Corrected Notice of Allowance", U.S. Appl. No. 13/471,030, dated Sep. 30, 2014, 2 pages.
"Corrected Notice of Allowance", U.S. Appl. No. 13/471,054, dated Jan. 11, 2016, 2 pages.
"Corrected Notice of Allowance", U.S. Appl. No. 13/471,412, dated Feb. 16, 2016, 2 pages.
"Corrected Notice of Allowance", U.S. Appl. No. 13/471,412, dated Mar. 3, 2016, 2 pages.
"Corrected Notice of Allowance", U.S. Appl. No. 13/527,263, dated Jan. 4, 2016, 2 pages.
"Corrected Notice of Allowance", U.S. Appl. No. 13/527,263, dated Jan. 11, 2016, 2 pages.
"Corrected Notice of Allowance", U.S. Appl. No. 13/527,263, dated Mar. 7, 2016, 2 pages.
"Corrected Notice of Allowance", U.S. Appl. No. 13/527,263, dated Apr. 12, 2016, 2 pages.
"Corrected Notice of Allowance", U.S. Appl. No. 13/527,263, dated Apr. 25, 2016, 2 pages.
"Corrected Notice of Allowance", U.S. Appl. No. 13/563,435, dated Jan. 14, 2014, 2 pages.
"Corrected Notice of Allowance", U.S. Appl. No. 13/563,435, dated Mar. 20, 2014, 2 pages.
"Corrected Notice of Allowance", U.S. Appl. No. 13/563,435, dated Jan. 22, 2014, 2 pages.
"Corrected Notice of Allowance", U.S. Appl. No. 13/564,520, dated Aug. 14, 2015, 2 pages.
"Corrected Notice of Allowance", U.S. Appl. No. 13/564,520, dated Sep. 17, 2015, 2 pages.
"Corrected Notice of Allowance", U.S. Appl. No. 13/565,124, dated Apr. 3, 2014, 4 pages.
"Corrected Notice of Allowance", U.S. Appl. No. 13/565,124, dated Mar. 10, 2014, 2 pages.
"Corrected Notice of Allowance", U.S. Appl. No. 13/565,124, dated Apr. 14, 2014, 2 pages.
"Corrected Notice of Allowance", U.S. Appl. No. 13/651,232, dated Apr. 24, 2015, 2 pages.
"Corrected Notice of Allowance", U.S. Appl. No. 13/651,232, dated Jun. 10, 2015, 2 pages.
"Corrected Notice of Allowance", U.S. Appl. No. 13/651,232, dated Jul. 6, 2015, 2 pages.
"Corrected Notice of Allowance", U.S. Appl. No. 13/651,232, dated Jul. 31, 2014, 2 pages.
"Corrected Notice of Allowance", U.S. Appl. No. 13/651,287, dated Aug. 21, 2014, 2 pages.
"Corrected Notice of Allowance", U.S. Appl. No. 13/651,327, dated Sep. 12, 2013, 2 pages.
"Corrected Notice of Allowance", U.S. Appl. No. 13/651,327, dated Sep. 23, 2013, 2 pages.
"Corrected Notice of Allowance", U.S. Appl. No. 13/651,726, dated Sep. 17, 2013, 2 pages.
"Corrected Notice of Allowance", U.S. Appl. No. 13/656,055, dated Apr. 13, 2015, 2 pages.
"Corrected Notice of Allowance", U.S. Appl. No. 13/656,055, dated Jul. 1, 2015, 2 pages.
"Corrected Notice of Allowance", U.S. Appl. No. 13/852,848, dated Jan. 29, 2016, 2 pages.
"Corrected Notice of Allowance", U.S. Appl. No. 13/852,848, dated Mar. 2, 2016, 2 pages.
"Corrected Notice of Allowance", U.S. Appl. No. 13/891,109, dated Jun. 21, 2016, 2 pages.
"Corrected Notice of Allowance", U.S. Appl. No. 13/938,930, dated May 6, 2014, 2 pages.
"Corrected Notice of Allowance", U.S. Appl. No. 13/938,930, dated Jun. 6, 2014, 2 pages.
"Corrected Notice of Allowance", U.S. Appl. No. 13/939,002, dated May 22, 2014, 2 pages.
"Corrected Notice of Allowance", U.S. Appl. No. 13/939,002, dated Jun. 19, 2014, 2 pages.
"Corrected Notice of Allowance", U.S. Appl. No. 13/939,002, dated May 5, 2014, 2 pages.
"Corrected Notice of Allowance", U.S. Appl. No. 13/939,032, dated Jun. 26, 2014, 2 pages.
"Corrected Notice of Allowance", U.S. Appl. No. 13/939,032, dated Jul. 15, 2014, 2 pages.
"Corrected Notice of Allowance", U.S. Appl. No. 14/199,924, dated Aug. 29, 2014, 2 pages.
"Corrected Notice of Allowance", U.S. Appl. No. 14/199,924, dated Sep. 5, 2014, 2 pages.
"Corrected Notice of Allowance", U.S. Appl. No. 14/199,924, dated Sep. 19, 2014, 2 pages.
"Corrected Notice of Allowance", U.S. Appl. No. 14/200,595, dated Jun. 4, 2015, 3 pages.
"Corrected Notice of Allowance", U.S. Appl. No. 14/225,276, dated Aug. 27, 2015, 2 pages.
"Corrected Notice of Allowance", U.S. Appl. No. 14/225,276, dated Sep. 29, 2015, 2 pages.
"Corrected Notice of Allowance", U.S. Appl. No. 14/277,240, dated Jan. 8, 2015, 2 pages.
"Corrected Notice of Allowance", U.S. Appl. No. 14/457,881, dated Aug. 20, 2015, 2 pages.
"Corrected Notice of Allowance", U.S. Appl. No. 14/457,881, dated Oct. 2, 2015, 2 pages.
"Corrected Notice of Allowance", U.S. Appl. No. 14/517,048, dated Apr. 13, 2016, 2 pages.
"Corrected Notice of Allowance", U.S. Appl. No. 14/727,001, dated Jan. 25, 2016, 2 pages.
"Corrected Notice of Allowance", U.S. Appl. No. 14/727,001, dated Dec. 15, 2015, 2 pages.
"Decision on Reexamination", CN Application No. 201320097079.5, dated Sep. 7, 2015, 8 Pages.
"Extended European Search Report", EP Application No. 13728568.0, dated Mar. 14, 2016, 16 pages.
"Extended European Search Report", EP Application No. 13857958.6, dated Dec. 18, 2015, 8 pages.
"Extended European Search Report", EP Application No. 13858283.8, dated Nov. 23, 2015, 10 pages.
"Extended European Search Report", EP Application No. 13858397.6, dated Nov. 30, 2015, 7 pages.
"Extended European Search Report", EP Application No. 13858403.2, dated Mar. 16, 2016, 12 pages.
"Extended European Search Report", EP Application No. 13858620.1, dated Sep. 18, 2015, 6 pages.
"Extended European Search Report", EP Application No. 13858674.8, dated Nov. 27, 2015, 6 pages.
"Extended European Search Report", EP Application No. 13858834.8, dated Oct. 29, 2015, 8 pages.
"Extended European Search Report", EP Application No. 13859280.3, dated Sep. 7, 2015, 6 pages.
"Extended European Search Report", EP Application No. 13859406.4, dated Sep. 8, 2015, 6 pages.
"Extended European Search Report", EP Application No. 13860271.9, dated May 4, 2016, 8 pages.
"Extended European Search Report", EP Application No. 13860272.7, dated Dec. 14, 2015, 9 pages.
"Extended European Search Report", EP Application No. 13860836.9, dated Nov. 27, 2015, 9 pages.
"Extended European Search Report", EP Application No. 13861059.7, dated Apr. 29, 2016, 8 pages.
"Extended European Search Report", EP Application No. 13861292.4, dated Nov. 23, 2015, 7 pages.
"Final Office Action", U.S. Appl. No. 13/371,725, dated Apr. 2, 2014, 22 pages.
"Final Office Action", U.S. Appl. No. 13/468,882, dated Feb. 12, 2015, 9 pages.
"Final Office Action", U.S. Appl. No. 13/468,949, dated Oct. 6, 2014, 11 pages.
"Final Office Action", U.S. Appl. No. 13/470,951, dated Jan. 12, 2015, 20 pages.
"Final Office Action", U.S. Appl. No. 13/471,001, dated Jul. 25, 2013, 20 pages.

(56) References Cited

OTHER PUBLICATIONS

"Final Office Action", U.S. Appl. No. 13/471,054, dated Oct. 23, 2014, 17 pages.
"Final Office Action", U.S. Appl. No. 13/471,139, dated Sep. 16, 2013, 13 pages.
"Final Office Action", U.S. Appl. No. 13/471,336, dated Aug. 28, 2013, 18 pages.
"Final Office Action", U.S. Appl. No. 13/471,336, dated Oct. 6, 2014, 13 pages.
"Final Office Action", U.S. Appl. No. 13/471,336, dated Dec. 10, 2015, 17 pages.
"Final Office Action", U.S. Appl. No. 13/471,376, dated Jul. 28, 2015, 35 pages.
"Final Office Action", U.S. Appl. No. 13/471,376, dated Aug. 18, 2014, 24 pages.
"Final Office Action", U.S. Appl. No. 13/471,393, dated Mar. 9, 2016, 17 pages.
"Final Office Action", U.S. Appl. No. 13/471,412, dated Dec. 15, 2014, 11 pages.
"Final Office Action", U.S. Appl. No. 13/492,232, dated May 25, 2016, 12 pages.
"Final Office Action", U.S. Appl. No. 13/492,232, dated Jul. 10, 2015, 11 pages.
"Final Office Action", U.S. Appl. No. 13/492,232, dated Nov. 17, 2014, 13 pages.
"Final Office Action", U.S. Appl. No. 13/525,070, dated Apr. 24, 2014, 21 pages.
"Final Office Action", U.S. Appl. No. 13/525,614, dated Apr. 29, 2015, 20 pages.
"Final Office Action", U.S. Appl. No. 13/527,263, dated Jan. 27, 2015, 7 pages.
"Final Office Action", U.S. Appl. No. 13/564,520, dated Jan. 15, 2014, 7 pages.
"Final Office Action", U.S. Appl. No. 13/595,700, dated Aug. 15, 2014, 6 pages.
"Final Office Action", U.S. Appl. No. 13/595,700, dated Oct. 9, 2014, 8 pages.
"Final Office Action", U.S. Appl. No. 13/599,635, dated Jul. 30, 2015, 23 pages.
"Final Office Action", U.S. Appl. No. 13/599,635, dated Aug. 8, 2014, 16 pages.
"Final Office Action", U.S. Appl. No. 13/651,195, dated Apr. 18, 2013, 13 pages.
"Final Office Action", U.S. Appl. No. 13/651,232, dated May 21, 2013, 21 pages.
"Final Office Action", U.S. Appl. No. 13/651,287, dated May 3, 2013, 16 pages.
"Final Office Action", U.S. Appl. No. 13/651,976, dated Jul. 25, 2013, 21 pages.
"Final Office Action", U.S. Appl. No. 13/653,321, dated Aug. 2, 2013, 17 pages.
"Final Office Action", U.S. Appl. No. 13/653,682, dated Jun. 11, 2014, 11 pages.
"Final Office Action", U.S. Appl. No. 13/653,682, dated Oct. 18, 2013, 16 pages.
"Final Office Action", U.S. Appl. No. 13/656,055, dated Sep. 17, 2014, 10 pages.
"Final Office Action", U.S. Appl. No. 13/656,055, dated Oct. 23, 2013, 14 pages.
"Final Office Action", U.S. Appl. No. 13/689,541, dated Nov. 2, 2015, 21 pages.
"Final Office Action", U.S. Appl. No. 13/780,228, dated Mar. 23, 2016, 16 pages.
"Final Office Action", U.S. Appl. No. 13/780,228, dated Apr. 10, 2015, 19 pages.
"Final Office Action", U.S. Appl. No. 13/780,228, dated Mar. 28, 2014, 13 pages.
"Final Office Action", U.S. Appl. No. 13/852,848, dated Jul. 20, 2015, 9 pages.
"Final Office Action", U.S. Appl. No. 13/938,930, dated Nov. 8, 2013, 10 pages.
"Final Office Action", U.S. Appl. No. 13/939,002, dated Nov. 8, 2013, 7 pages.
"Final Office Action", U.S. Appl. No. 13/939,032, dated Dec. 20, 2013, 5 pages.
"Final Office Action", U.S. Appl. No. 14/059,280, dated Jul. 22, 2015, 25 pages.
"Final Office Action", U.S. Appl. No. 14/063,912, dated Jan. 12, 2015, 12 pages.
"Final Office Action", U.S. Appl. No. 14/063,912, dated Apr. 29, 2014, 10 pages.
"Final Office Action", U.S. Appl. No. 14/063,912, dated Sep. 3, 2015, 13 pages.
"Final Office Action", U.S. Appl. No. 14/147,252, dated Jun. 25, 2015, 11 pages.
"Final Office Action", U.S. Appl. No. 14/199,924, dated May 6, 2014, 5 pages.
"Final Office Action", U.S. Appl. No. 14/200,595, dated Nov. 19, 2014, 5 pages.
"Final Office Action", U.S. Appl. No. 14/225,250, dated Jan. 29, 2016, 10 pages.
"Final Office Action", U.S. Appl. No. 14/225,250, dated Mar. 13, 2015, 7 pages.
"Final Office Action", U.S. Appl. No. 14/225,276, dated Dec. 17, 2014, 6 pages.
"Final Office Action", U.S. Appl. No. 14/794,182, dated Sep. 15, 2016, 25 pages.
"Final Office Action", U.S. Appl. No. 14/994,737, dated Aug. 26, 2016, 6 pages.
"FingerWorks Installation and Operation Guide for the TouchStream ST and TouchStream LP", FingerWorks, Inc. Retrieved from <http://ec1.images-amazon.com/media/i3d/01/A/man-migrate/MANUAL000049862.pdf>, 2002, 14 pages.
"First Examination Report", NZ Application No. 628690, dated Nov. 27, 2014, 2 pages.
"First One Handed Fabric Keyboard with Bluetooth Wireless Technology", Retrieved from: <http://press.xtvworld.com/article3817.html> on May 8, 2012, Jan. 6, 2005, 2 pages.
"Force and Position Sensing Resistors: An Emerging Technology", Interlink Electronics, Available at <http://staff.science.uva.nl/~vlaander/docu/FSR/An_Exploring_Technology.pdf>, Feb. 1990, pp. 1-6.
"Foreign Notice of Allowance", CN Application No. 201310065273.X, dated Mar. 31, 2016, 4 Pages.
"Foreign Notice of Allowance", CN Application No. 201320097079.5, dated Apr. 1, 2016, 4 Pages.
"Foreign Notice of Allowance", CN Application No. 201310067531.8, dated Jun. 7, 2016, 4 pages.
"Foreign Notice of Allowance", CN Application No. 201310067592.4, dated May 17, 2016, 4 pages.
"Foreign Notice of Allowance", CN Application No. 201310067631.0, dated Aug. 5, 2016, 4 pages.
"Foreign Notice of Allowance", CN Application No. 201310067808.7, dated May 4, 2016, 4 pages.
"Foreign Notice of Allowance", CN Application No. 201310316114.2, dated Aug. 2, 2016, 4 pages.
"Foreign Notice of Allowance", CN Application No. 201320096755.7, dated Jan. 27, 2014, 2 pages.
"Foreign Notice of Allowance", CN Application No. 201320097065.3, dated Nov. 21, 2013, 2 pages.
"Foreign Notice on Reexamination", CN Application No. 201320097066.8, dated Apr. 3, 2015, 7 Pages.
"Foreign Office Action", CL Application No. 14-211.785, dated Apr. 26, 2016, 12 pages.
"Foreign Office Action", CN Application No. 201110272868.3, dated Apr. 1, 2013, 10 pages.
"Foreign Office Action", CN Application No. 201310065273.X, dated Oct. 28, 2015, 14 pages.
"Foreign Office Action", CN Application No. 201310067335.0, dated Jun. 12, 2015, 15 Pages.
"Foreign Office Action", CN Application No. 201310067356.2, dated Feb. 4, 2016, 15 Pages.

(56) References Cited

OTHER PUBLICATIONS

"Foreign Office Action", CN Application No. 201310067373.6, dated Aug. 18, 2016, 16 pages.
"Foreign Office Action", CN Application No. 201310067373.6, dated Dec. 23, 2015, 15 Pages.
"Foreign Office Action", CN Application No. 201310067385.9, dated Apr. 14, 2016, 14 Pages.
"Foreign Office Action", CN Application No. 201310067385.9, dated Aug. 6, 2015, 16 pages.
"Foreign Office Action", CN Application No. 201310067429.8, dated Jul. 20, 2016, 11 pages.
"Foreign Office Action", CN Application No. 201310067429.8, dated Nov. 25, 2015, 12 Pages.
"Foreign Office Action", CN Application No. 201310067592.4, dated Oct. 23, 2015, 12 Pages.
"Foreign Office Action", CN Application No. 201310067603.9, dated Feb. 15, 2016, 12 Pages.
"Foreign Office Action", CN Application No. 201310067622.1, dated Jun. 21, 2016, 14 Pages.
"Foreign Office Action", CN Application No. 201310067622.1, dated Oct. 27, 2015, 14 pages.
"Foreign Office Action", CN Application No. 201310067627.4, dated May 3, 2016, 7 pages.
"Foreign Office Action", CN Application No. 201310067627.4, dated Sep. 28, 2015, 14 pages.
"Foreign Office Action", CN Application No. 201310067631.0, dated Dec. 10, 2015, 11 Pages.
"Foreign Office Action", CN Application No. 201310067641.4, dated Jul. 27, 2016, 8 pages.
"Foreign Office Action", CN Application No. 201310067641.4, dated Dec. 30, 2015, 12 Pages.
"Foreign Office Action", CN Application No. 201310067808.7, dated Jan. 7, 2016, 7 Pages.
"Foreign Office Action", CN Application No. 201310067808.7, dated May 28, 2015, 14 Pages.
"Foreign Office Action", CN Application No. 201310096345.7, dated May 25, 2016, 16 Pages.
"Foreign Office Action", CN Application No. 201310096345.7, dated Oct. 19, 2015, 16 Pages.
"Foreign Office Action", CN Application No. 201310225788.1, dated Feb. 29, 2016, 11 Pages.
"Foreign Office Action", CN Application No. 201310225788.1, dated Jun. 23, 2015, 14 Pages.
"Foreign Office Action", CN Application No. 201310225788.1, dated Sep. 1, 2016, 8 pages.
"Foreign Office Action", CN Application No. 201310316114.2, dated Apr. 18, 2016, 11 pages.
"Foreign Office Action", CN Application No. 201310316114.2, dated Sep. 29, 2015, 13 pages.
"Foreign Office Action", CN Application No. 201320097065.3, dated Jun. 18, 2013, 2 pages.
"Foreign Office Action", CN Application No. 201320097066.8, dated Oct. 24, 2013, 5 Pages.
"Foreign Office Action", CN Application No. 201320097079.5, dated Jul. 28, 2014, 4 pages.
"Foreign Office Action", CN Application No. 201320097079.5, dated Sep. 26, 2013, 4 pages.
"Foreign Office Action", CN Application No. 201320328022.1, dated Feb. 17, 2014, 4 Pages.
"Foreign Office Action", CN Application No. 201320328022.1, dated Oct. 18, 2013, 3 Pages.
"Foreign Office Action", CN Application No. 201380025290.9, dated May 10, 2016, 15 pages.
"Frogpad Introduces Weareable Fabric Keyboard with Bluetooth Technology", Retrieved from: <http://www.geekzone.co.nz/content.asp?contentid=3898> on May 7, 2012, Jan. 7, 2005, 3 pages.
"How to Use the iPad's Onscreen Keyboard", Retrieved from <http://www.dummies.com/how-to/content/how-to-use-the-ipads-onscreen-keyboard.html> on Aug. 28, 2012, 2012, 3 pages.
"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 2012, 4 pages.
"Interlink Electronics FSR (TM) Force Sensing Resistors (TM)", Retrieved at <<http://akizukidenshi.com/download/ds/ interlinkelec/94-00004+Rev+B%20FSR%201ntegration%20Guide.pdf on Mar. 21, 2013, 36 pages.
"International Preliminary Report on Patentability", Application No. PCT/US2014/031531, dated Jun. 9, 2015, 7 pages.
"International Search Report and Written Opinion", Application No. PCT/US2014/031531, dated Jun. 20, 2014, 10 Pages.
"International Search Report and Written Opinion", Application No. PCT/US2013/028483, dated Jun. 24, 2014, 10 pages.
"International Search Report and Written Opinion", Application No. PCT/US2013/028484, dated Jun. 24, 2014, 10 pages.
"International Search Report and Written Opinion", Application No. PCT/US2013/028485, dated Jun. 25, 2014, 10 pages.
"International Search Report and Written Opinion", Application No. PCT/US2013/028769, dated Jun. 26, 2014, 10 pages.
"International Search Report and Written Opinion", Application No. PCT/US2014/043546, dated Oct. 9, 2014, 10 pages.
"International Search Report and Written Opinion", Application No. PCT/US2013/028771, dated Jun. 19, 2014, 10 pages.
"International Search Report and Written Opinion", Application No. PCT/US2013/028486, dated Jun. 20, 2014, 10 pages.
"International Search Report and Written Opinion", Application No. PCT/US2013/041017, dated Jul. 17, 2014, 10 pages.
"International Search Report and Written Opinion", Application No. PCT/US2013/028489, dated Jun. 20, 2014, 11 pages.
"International Search Report and Written Opinion", Application No. PCT/US2013/028488, dated Jun. 24, 2014, 11 pages.
"International Search Report and Written Opinion", Application No. PCT/US2013/028767, dated Jun. 24, 2014, 11 pages.
"International Search Report and Written Opinion", Application No. PCT/US2013/028481, dated Jun. 19, 2014, 11 pages.
"International Search Report and Written Opinion", Application No. PCT/US2013/028948, dated Jun. 21, 2013, 11 pages.
"International Search Report and Written Opinion", Application No. PCT/US2013/029461, dated Jun. 21, 2013, 11 pages.
"International Search Report and Written Opinion", Application No. PCT/US2013/028490, dated Jun. 24, 2014, 11 pages.
"International Search Report and Written Opinion", Application No. PCT/US2013/028766, dated Jun. 26, 2014, 11 pages.
"International Search Report and Written Opinion", Application No. PCT/US2013/028772, dated Jun. 30, 2014, 11 pages.
"International Search Report and Written Opinion", Application No. PCT/US2013/040968, dated Sep. 5, 2013, 11 pages.
"International Search Report and Written Opinion", Application No. PCT/US2013/028768, dated Jun. 24, 2014, 12 pages.
"International Search Report and Written Opinion", Application No. PCT/US2013/028482, dated Jun. 20, 2014, 13 pages.
"International Search Report and Written Opinion", Application No. PCT/US2013/042550, dated Sep. 24, 2013, 14 pages.
"International Search Report and Written Opinion", Application No. PCT/US2014/013928, dated May 12, 2014, 17 pages.
"International Search Report and Written Opinion", Application No. PCT/US2013/067905, dated Apr. 15, 2014, 9 pages.
"International Search Report and Written Opinion", Application No. PCT/US2013/028487, dated May 27, 2014, 9 pages.
"International Search Report and Written Opinion", Application No. PCT/US2013/028770, dated Jun. 26, 2014, 9 pages.
"Membrane Keyboards & Membrane Keypads", Retrieved from: <http://www.pannam.com/> on May 9, Mar. 4, 2009, 2 pages.
"Motion Sensors", Android Developers—retrieved from <http://developer.android.com/guide/topics/sensors/sensors_motion.html> on May 25, 2012, 2012, 7 pages.
"Non-Final Office Action", U.S. Appl. No. 13/599,635, dated Feb. 25, 2014, 13 pages.
"Non-Final Office Action", U.S. Appl. No. 13/468,882, dated Jul. 9, 2014, 9 pages.
"Non-Final Office Action", U.S. Appl. No. 13/468,882, dated Nov. 13, 2015, 9 pages.

(56) References Cited

OTHER PUBLICATIONS

"Non-Final Office Action", U.S. Appl. No. 13/468,918, dated Dec. 26, 2013, 18 pages.
"Non-Final Office Action", U.S. Appl. No. 13/468,949, dated Jun. 20, 2014, 10 pages.
"Non-Final Office Action", U.S. Appl. No. 13/470,951, dated Jul. 2, 2014, 19 pages.
"Non-Final Office Action", U.S. Appl. No. 13/470,951, dated Oct. 1, 2015, 29 pages.
"Non-Final Office Action", U.S. Appl. No. 13/471,001, dated Feb. 19, 2013, 15 pages.
"Non-Final Office Action", U.S. Appl. No. 13/471,001, dated Jun. 17, 2014, 23 pages.
"Non-Final Office Action", U.S. Appl. No. 13/471,030, dated Jan. 15, 2015, 7 pages.
"Non-Final Office Action", U.S. Appl. No. 13/471,030, dated May 15, 2014, 10 pages.
"Non-Final Office Action", U.S. Appl. No. 13/471,054, dated Mar. 13, 2015, 18 pages.
"Non-Final Office Action", U.S. Appl. No. 13/471,054, dated Jun. 3, 2014, 15 pages.
"Non-Final Office Action", U.S. Appl. No. 13/471,139, dated Mar. 21, 2013, 12 pages.
"Non-Final Office Action", U.S. Appl. No. 13/471,186, dated Feb. 27, 2014, 8 pages.
"Non-Final Office Action", U.S. Appl. No. 13/471,202, dated Feb. 11, 2013, 10 pages.
"Non-Final Office Action", U.S. Appl. No. 13/471,237, dated Mar. 24, 2014, 7 pages.
"Non-Final Office Action", U.S. Appl. No. 13/471,282, dated Sep. 3, 2014, 13 pages.
"Non-Final Office Action", U.S. Appl. No. 13/471,336, dated Jan. 18, 2013, 14 pages.
"Non-Final Office Action", U.S. Appl. No. 13/471,336, dated May 7, 2014, 17 pages.
"Non-Final Office Action", U.S. Appl. No. 13/471,336, dated Jun. 24, 2015, 15 pages.
"Non-Final Office Action", U.S. Appl. No. 13/471,336, dated Aug. 30, 2016, 17 pages.
"Non-Final Office Action", U.S. Appl. No. 13/471,376, dated Mar. 27, 2015, 28 pages.
"Non-Final Office Action", U.S. Appl. No. 13/471,376, dated Apr. 2, 2014, 17 pages.
"Non-Final Office Action", U.S. Appl. No. 13/471,393, dated Mar. 26, 2015, 13 pages.
"Non-Final Office Action", U.S. Appl. No. 13/471,393, dated Sep. 30, 2015, 15 pages.
"Non-Final Office Action", U.S. Appl. No. 13/471,393, dated Oct. 20, 2014, 12 pages.
"Non-Final Office Action", U.S. Appl. No. 13/471,405, dated Feb. 20, 2014, 37 pages.
"Non-Final Office Action", U.S. Appl. No. 13/471,412, dated Jun. 1, 2015, 31 pages.
"Non-Final Office Action", U.S. Appl. No. 13/471,412, dated Jul. 11, 2014, 22 pages.
"Non-Final Office Action", U.S. Appl. No. 13/492,232, dated Feb. 24, 2015, 12 pages.
"Non-Final Office Action", U.S. Appl. No. 13/492,232, dated Apr. 30, 2014, 9 pages.
"Non-Final Office Action", U.S. Appl. No. 13/492,232, dated Dec. 17, 2015, 11 pages.
"Non-Final Office Action", U.S. Appl. No. 13/525,614, dated Jul. 31, 2015, 20 pages.
"Non-Final Office Action", U.S. Appl. No. 13/525,614, dated Nov. 24, 2014, 19 pages.
"Non-Final Office Action", U.S. Appl. No. 13/527,263, dated Apr. 3, 2014, 6 pages.
"Non-Final Office Action", U.S. Appl. No. 13/527,263, dated Jul. 19, 2013, 5 pages.
"Non-Final Office Action", U.S. Appl. No. 13/563,435, dated Jun. 14, 2013, 6 pages.
"Non-Final Office Action", U.S. Appl. No. 13/564,520, dated Jan. 26, 2015, 6 pages.
"Non-Final Office Action", U.S. Appl. No. 13/564,520, dated Feb. 14, 2014, 5 pages.
"Non-Final Office Action", U.S. Appl. No. 13/564,520, dated Jun. 19, 2013, 8 pages.
"Non-Final Office Action", U.S. Appl. No. 13/564,520, dated Jun. 16, 2014, 5 pages.
"Non-Final Office Action", U.S. Appl. No. 13/565,124, dated Jun. 17, 2013, 5 pages.
"Non-Final Office Action", U.S. Appl. No. 13/595,700, dated Jun. 18, 2014, 8 pages.
"Non-Final Office Action", U.S. Appl. No. 13/599,635, dated Feb. 12, 2015, 16 pages.
"Non-Final Office Action", U.S. Appl. No. 13/599,763, dated May 28, 2014, 6 pages.
"Non-Final Office Action", U.S. Appl. No. 13/647,479, dated Jul. 3, 2014, 10 pages.
"Non-Final Office Action", U.S. Appl. No. 13/651,195, dated Jan. 2, 2013, 14 pages.
"Non-Final Office Action", U.S. Appl. No. 13/651,232, dated Jan. 17, 2013, 15 pages.
"Non-Final Office Action", U.S. Appl. No. 13/651,232, dated Dec. 5, 2013, 15 pages.
"Non-Final Office Action", U.S. Appl. No. 13/651,272, dated Feb. 12, 2013, 10 pages.
"Non-Final Office Action", U.S. Appl. No. 13/651,287, dated Jan. 29, 2013, 13 pages.
"Non-Final Office Action", U.S. Appl. No. 13/651,304, dated Mar. 22, 2013, 9 pages.
"Non-Final Office Action", U.S. Appl. No. 13/651,327, dated Mar. 22, 2013, 6 pages.
"Non-Final Office Action", U.S. Appl. No. 13/651,726, dated Apr. 15, 2013, 6 pages.
"Non-Final Office Action", U.S. Appl. No. 13/651,871, dated Mar. 18, 2013, 14 pages.
"Non-Final Office Action", U.S. Appl. No. 13/651,871, dated Jul. 1, 2013, 5 pages.
"Non-Final Office Action", U.S. Appl. No. 13/651,976, dated Feb. 22, 2013, 16 pages.
"Non-Final Office Action", U.S. Appl. No. 13/651,976, dated Jun. 16, 2014, 23 pages.
"Non-Final Office Action", U.S. Appl. No. 13/653,321, dated Feb. 1, 2013, 13 pages.
"Non-Final Office Action", U.S. Appl. No. 13/653,682, dated Feb. 7, 2013, 11 pages.
"Non-Final Office Action", U.S. Appl. No. 13/653,682, dated Feb. 26, 2014, 10 pages.
"Non-Final Office Action", U.S. Appl. No. 13/653,682, dated Jun. 3, 2013, 14 pages.
"Non-Final Office Action", U.S. Appl. No. 13/655,065, dated Apr. 24, 2014, 16 pages.
"Non-Final Office Action", U.S. Appl. No. 13/656,055, dated Mar. 12, 2014, 17 pages.
"Non-Final Office Action", U.S. Appl. No. 13/656,055, dated Apr. 23, 2013, 11 pages.
"Non-Final Office Action", U.S. Appl. No. 13/689,541, dated Apr. 14, 2016, 23 pages.
"Non-Final Office Action", U.S. Appl. No. 13/780,228, dated Jun. 17, 2016, 18 pages.
"Non-Final Office Action", U.S. Appl. No. 13/780,228, dated Sep. 15, 2014, 18 pages.
"Non-Final Office Action", U.S. Appl. No. 13/780,228, dated Sep. 18, 2015, 19 pages.
"Non-Final Office Action", U.S. Appl. No. 13/780,228, dated Oct. 30, 2013, 12 pages.
"Non-Final Office Action", U.S. Appl. No. 13/852,848, dated Mar. 26, 2015, 7 pages.
"Non-Final Office Action", U.S. Appl. No. 13/938,930, dated Aug. 29, 2013, 9 pages.

(56) References Cited

OTHER PUBLICATIONS

"Non-Final Office Action", U.S. Appl. No. 13/939,002, dated Aug. 28, 2013, 6 pages.
"Non-Final Office Action", U.S. Appl. No. 13/939,002, dated Dec. 20, 2013, 5 pages.
"Non-Final Office Action", U.S. Appl. No. 13/939,032, dated Aug. 29, 2013, 7 pages.
"Non-Final Office Action", U.S. Appl. No. 13/974,994, dated Jun. 4, 2014, 24 pages.
"Non-Final Office Action", U.S. Appl. No. 13/975,087, dated May 8, 2014, 18 pages.
"Non-Final Office Action", U.S. Appl. No. 14/059,280, dated Mar. 3, 2015, 18 pages.
"Non-Final Office Action", U.S. Appl. No. 14/063,912, dated Jan. 2, 2014, 10 pages.
"Non-Final Office Action", U.S. Appl. No. 14/063,912, dated May 7, 2015, 12 pages.
"Non-Final Office Action", U.S. Appl. No. 14/063,912, dated Sep. 2, 2014, 11 pages.
"Non-Final Office Action", U.S. Appl. No. 14/147,252, dated Feb. 23, 2015, 11 pages.
"Non-Final Office Action", U.S. Appl. No. 14/162,529, dated Sep. 18, 2015, 13 pages.
"Non-Final Office Action", U.S. Appl. No. 14/199,924, dated Apr. 10, 2014, 6 pages.
"Non-Final Office Action", U.S. Appl. No. 14/200,595, dated Apr. 11, 2014, 4 pages.
"Non-Final Office Action", U.S. Appl. No. 14/225,250, dated Jun. 17, 2014, 5 pages.
"Non-Final Office Action", U.S. Appl. No. 14/225,250, dated Jul. 1, 2016, 9 pages.
"Non-Final Office Action", U.S. Appl. No. 14/225,250, dated Aug. 19, 2015, 9 pages.
"Non-Final Office Action", U.S. Appl. No. 14/225,276, dated Apr. 23, 2015, 7 pages.
"Non-Final Office Action", U.S. Appl. No. 14/225,276, dated Jun. 13, 2014, 6 pages.
"Non-Final Office Action", U.S. Appl. No. 14/225,276, dated Aug. 19, 2015, 9 pages.
"Non-Final Office Action", U.S. Appl. No. 14/277,240, dated Jun. 13, 2014, 6 pages.
"Non-Final Office Action", U.S. Appl. No. 14/307,262, dated Apr. 20, 2016, 10 pages.
"Non-Final Office Action", U.S. Appl. No. 14/704,423, dated Sep. 26, 2016, 11 pages.
"Non-Final Office Action", U.S. Appl. No. 14/727,001, dated Jul. 10, 2015, 7 pages.
"Non-Final Office Action", U.S. Appl. No. 14/794,182, dated Apr. 13, 2016, 15 pages.
"Non-Final Office Action", U.S. Appl. No. 14/994,737, dated Apr. 5, 2016, 6 pages.
"Non-Final Office Action", U.S. Appl. No. 15/050,072, dated Sep. 23, 2016, 5 pages.
"Notice of Allowance", U.S. Appl. No. 13/468,949, dated Apr. 24, 2015, 9 pages.
"Notice of Allowance", U.S. Appl. No. 13/468,882, dated May 24, 2016, 5 pages.
"Notice of Allowance", U.S. Appl. No. 13/468,918, dated Apr. 8, 2015, 7 pages.
"Notice of Allowance", U.S. Appl. No. 13/468,918, dated Jun. 17, 2014, 5 pages.
"Notice of Allowance", U.S. Appl. No. 13/468,949, dated Apr. 24, 2015, 8 pages.
"Notice of Allowance", U.S. Appl. No. 13/470,633, dated Mar. 22, 2013, 7 pages.
"Notice of Allowance", U.S. Appl. No. 13/470,951, dated Mar. 24, 2016, 8 pages.
"Notice of Allowance", U.S. Appl. No. 13/471,030, dated Apr. 6, 2015, 6 pages.
"Notice of Allowance", U.S. Appl. No. 13/471,030, dated Sep. 5, 2014, 6 pages.
"Notice of Allowance", U.S. Appl. No. 13/471,054, dated Sep. 25, 2015, 7 pages.
"Notice of Allowance", U.S. Appl. No. 13/471,139, dated Mar. 17, 2014, 4 pages.
"Notice of Allowance", U.S. Appl. No. 13/471,186, dated Jul. 3, 2014, 7 pages.
"Notice of Allowance", U.S. Appl. No. 13/471,202, dated May 28, 2013, 7 pages.
"Notice of Allowance", U.S. Appl. No. 13/471,237, dated May 12, 2014, 8 pages.
"Notice of Allowance", U.S. Appl. No. 13/471,282, dated Apr. 30, 2015, 8 pages.
"Notice of Allowance", U.S. Appl. No. 13/471,376, dated Nov. 23, 2015, 9 pages.
"Notice of Allowance", U.S. Appl. No. 13/471,405, dated Jun. 24, 2014, 9 pages.
"Notice of Allowance", U.S. Appl. No. 13/471,412, dated Nov. 20, 2015, 10 pages.
"Notice of Allowance", U.S. Appl. No. 13/527,263, dated Dec. 9, 2015, 6 pages.
"Notice of Allowance", U.S. Appl. No. 13/563,435, dated Nov. 12, 2013, 5 pages.
"Notice of Allowance", U.S. Appl. No. 13/564,520, dated May 8, 2015, 4 pages.
"Notice of Allowance", U.S. Appl. No. 13/565,124, dated Dec. 24, 2013, 6 pages.
"Notice of Allowance", U.S. Appl. No. 13/595,700, dated Jan. 21, 2015, 4 pages.
"Notice of Allowance", U.S. Appl. No. 13/647,479, dated Jan. 14, 2016, 8 pages.
"Notice of Allowance", U.S. Appl. No. 13/651,195, dated Jul. 8, 2013, 9 pages.
"Notice of Allowance", U.S. Appl. No. 13/651,232, dated Mar. 30, 2015, 7 pages.
"Notice of Allowance", U.S. Appl. No. 13/651,232, dated Apr. 25, 2014, 9 pages.
"Notice of Allowance", U.S. Appl. No. 13/651,272, dated May 2, 2013, 7 pages.
"Notice of Allowance", U.S. Appl. No. 13/651,287, dated May 2, 2014, 6 pages.
"Notice of Allowance", U.S. Appl. No. 13/651,304, dated Jul. 1, 2013, 5 pages.
"Notice of Allowance", U.S. Appl. No. 13/651,327, dated Jun. 11, 2013, 7 pages.
"Notice of Allowance", U.S. Appl. No. 13/651,726, dated May 31, 2013, 5 pages.
"Notice of Allowance", U.S. Appl. No. 13/651,871, dated Oct. 2, 2013, 7 pages.
"Notice of Allowance", U.S. Appl. No. 13/651,976, dated Jan. 21, 2015, 10 pages.
"Notice of Allowance", U.S. Appl. No. 13/653,321, dated Dec. 18, 2013, 4 pages.
"Notice of Allowance", U.S. Appl. No. 13/653,682, dated Sep. 24, 2014, 4 pages.
"Notice of Allowance", U.S. Appl. No. 13/656,055, dated Mar. 4, 2015, 7 pages.
"Notice of Allowance", U.S. Appl. No. 13/666,958, dated Aug. 29, 2014, 9 pages.
"Notice of Allowance", U.S. Appl. No. 13/852,848, dated Nov. 19, 2015, 4 pages.
"Notice of Allowance", U.S. Appl. No. 13/938,930, dated Feb. 20, 2014, 4 pages.
"Notice of Allowance", U.S. Appl. No. 13/939,002, dated Mar. 3, 2014, 4 pages.
"Notice of Allowance", U.S. Appl. No. 13/939,032, dated Apr. 3, 2014, 4 pages.
"Notice of Allowance", U.S. Appl. No. 14/018,286, dated May 23, 2014, 8 pages.
"Notice of Allowance", U.S. Appl. No. 14/059,280, dated Nov. 23, 2015, 9 pages.

(56) References Cited

OTHER PUBLICATIONS

"Notice of Allowance", U.S. Appl. No. 14/199,924, dated Jun. 10, 2014, 4 pages.
"Notice of Allowance", U.S. Appl. No. 14/200,595, dated Feb. 17, 2015, 2 pages.
"Notice of Allowance", U.S. Appl. No. 14/200,595, dated Feb. 25, 2015, 4 pages.
"Notice of Allowance", U.S. Appl. No. 14/225,276, dated Jun. 22, 2015, 4 pages.
"Notice of Allowance", U.S. Appl. No. 14/277,240, dated Sep. 16, 2014, 4 pages.
"Notice of Allowance", U.S. Appl. No. 14/457,881, dated Jul. 22, 2015, 7 pages.
"Notice of Allowance", U.S. Appl. No. 14/517,048, dated Feb. 24, 2016, 8 pages.
"Notice of Allowance", U.S. Appl. No. 14/517,048, dated Jul. 7, 2016, 7 pages.
"Notice of Allowance", U.S. Appl. No. 14/727,001, dated Oct. 2, 2015, 4 pages.
"Notice of Allowance", U.S. Appl. No. 14/727,001, dated Dec. 15, 2015, 2 pages.
"Notice to Grant", CN Application No. 201320097089.9, dated Sep. 29, 2013, 2 Pages.
"Notice to Grant", CN Application No. 201320097124.7, dated Oct. 8, 2013, 2 pages.
"On-Screen Keyboard for Windows 7, Vista, XP with Touchscreen", Retrieved from <www.comfort-software.com/on-screen-keyboard.html> on Aug. 28, 2012, Feb. 2, 2011, 3 pages.
"Position Sensors", Android Developers—retrieved from <http://developer.android.com/guide/topics/sensors/sensors_position.html> on May 25, 2012, 5 pages.
"Restriction Requirement", U.S. Appl. No. 13/468,918, dated Nov. 29, 2013, 6 pages.
"Restriction Requirement", U.S. Appl. No. 13/471,139, dated Jan. 17, 2013, 7 pages.
"Restriction Requirement", U.S. Appl. No. 13/595,700, dated May 28, 2014, 6 pages.
"Restriction Requirement", U.S. Appl. No. 13/651,304, dated Jan. 18, 2013, 7 pages.
"Restriction Requirement", U.S. Appl. No. 13/651,726, dated Feb. 22, 2013, 6 pages.
"Restriction Requirement", U.S. Appl. No. 13/651,871, dated Feb. 7, 2013, 6 pages.
"Restriction Requirement", U.S. Appl. No. 14/147,252, dated Dec. 1, 2014, 6 pages.
"Restriction Requirement", U.S. Appl. No. 14/307,262, dated Mar. 21, 2016, 6 pages.
"Restriction Requirement", U.S. Appl. No. 14/794,182, dated Dec. 22, 2015, 6 pages.
"SolRxTM E-Series Multidirectional Phototherapy ExpandableTM 2-Bulb Full Body Panel System", Retrieved from: <http://www.solarcsystems.com/us_multidirectional_uv_light_therapy_1_intro.html > on Jul. 25, 2012, 2011, 4 pages.
"Supplemental Notice of Allowance", U.S. Appl. No. 13/468,918, dated Jun. 4, 2015, 2 pages.
"Supplemental Notice of Allowance", U.S. Appl. No. 13/468,918, dated Aug. 7, 2015, 4 pages.
"Supplemental Notice of Allowance", U.S. Appl. No. 13/468,949, dated Jun. 5, 2015, 2 pages.
"Supplemental Notice of Allowance", U.S. Appl. No. 13/468,949, dated Sep. 14, 2015, 2 pages.
"Supplemental Notice of Allowance", U.S. Appl. No. 13/471,054, dated Nov. 19, 2015, 2 pages.
"Supplemental Notice of Allowance", U.S. Appl. No. 13/471,405, dated Aug. 29, 2014, 5 pages.
"Supplemental Notice of Allowance", U.S. Appl. No. 13/471,405, dated Dec. 17, 2014, 5 pages.
"Supplemental Notice of Allowance", U.S. Appl. No. 13/595,700, dated Apr. 10, 2015, 2 pages.
"Supplemental Notice of Allowance", U.S. Appl. No. 13/595,700, dated May 4, 2015, 2 pages.
"Supplemental Notice of Allowance", U.S. Appl. No. 13/595,700, dated May 22, 2015, 2 pages.
"Supplemental Notice of Allowance", U.S. Appl. No. 13/653,321, dated Mar. 28, 2014, 4 pages.
"Supplemental Notice of Allowance", U.S. Appl. No. 13/656,055, dated May 15, 2015, 2 pages.
"Supplemental Notice of Allowance", U.S. Appl. No. 13/656,055, dated Jun. 10, 2015, 2 pages.
"Supplemental Notice of Allowance", U.S. Appl. No. 14/018,286, dated Jun. 11, 2014, 5 pages.
"Supplemental Notice of Allowance", U.S. Appl. No. 14/517,048, dated Aug. 10, 2016, 2 pages.
"Supplemental Notice of Allowance", U.S. Appl. No. 14/517,048, dated Aug. 19, 2016, 2 pages.
"Supplementary European Search Report", EP Application No. 13728568.0, dated Oct. 30, 2015, 7 pages.
"Supplementary European Search Report", EP Application No. 13858403.2, dated Nov. 25, 2015, 7 pages.
"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, Jun. 2012, 2 pages.
"Tilt Shift Lenses: Perspective Control", retrieved from http://www.cambridgeincolour.com/tutorials/tilt-shift-lenses1.htm, Mar. 28, 2008, 11 Pages.
"Virtualization Getting Started Guide", Red Hat Enterprise Linux 6, Edition 0.2—retrieved from <http://docs.redhat.com/docs/en-US/Red_Hat_Enterprise_Linux/6/html-single/Virtualization_Getting_Started_Guide/index.html> on Jun. 13, 2012, 24 pages.
"Welcome to Windows 7", Retrieved from: <http://www.microsoft.com/en-us/download/confirmation.aspx?id=4984> on Aug. 1, 2013, Sep. 16, 2009, 3 pages.
"What is Active Alignment?", http://www.kasalis.com/active_alignment.html, retrieved on Nov. 22, 2012, Nov. 22, 2012, 2 Pages.
Block,"DeviceOrientation Event Specification", W3C, Editor's Draft, retrieved from <https://developer.palm.com/content/api/dev-guide/pdk/accessing-device-sensors.html> on May 25, 2012, Jul. 12, 2011, 14 pages.
Brown,"Microsoft Shows Off Pressure-Sensitive Keyboard", retrieved from <http://news.cnet.com/8301-17938_105-10304792-1.html> on May 7, 2012, Aug. 6, 2009, 2 pages.
Butler,"SideSight: Multi-"touch" Interaction around Small Devices", In the proceedings of the 21st annual ACM symposium on User interface software and technology., retrieved from <http://research.microsoft.com/pubs/132534/sidesight_crv3.pdf> on May 29, 2012, Oct. 19, 2008, 4 pages.
Crider,"Sony Slate Concept Tablet "Grows" a Kickstand", Retrieved from: <http://androidcommunity.com/sony-slate-concept-tablet-grows-a-kickstand-20120116/> on May 4, 2012, Jan. 16, 2012, 9 pages.
Cunningham,"Software Infrastructure for Natural Language Processing", In Proceedings of the fifth conference on Applied natural language processing, Mar. 31, 1997, pp. 237-244.
Dietz,"A Practical Pressure Sensitive Computer Keyboard", In Proceedings of UIST 2009, Oct. 2009, 4 pages.
Glatt,"Channel and Key Pressure (Aftertouch).", Retrieved from: <http://home.roadrunner.com/~jgglatt/tutr/touch.htm> on Jun. 11, 2012, 2012, 2 pages.
Hanlon,"ElekTex Smart Fabric Keyboard Goes Wireless", Retrieved from: <http://www.gizmag.com/go/5048/ > on May 7, 2012, Jan. 15, 2006, 5 pages.
Harrison,"UIST 2009 Student Innovation Contest—Demo Video", Retrieved From: <https://www.youtube.com/watch?v=PDI8eYIASf0> Sep. 16, 2014, Jul. 23, 2009, 1 pages.
Kaur,"Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012, Jun. 21, 2010, 4 pages.

(56) References Cited

OTHER PUBLICATIONS

Khuntontong,"Fabrication of Molded Interconnection Devices by Ultrasonic Hot Embossing on Thin Polymer Films", IEEE Transactions on Electronics Packaging Manufacturing, vol. 32, No. 3, Jul. 2009, pp. 152-156.
Linderholm,"Logitech Shows Cloth Keyboard for PDAs", Retrieved from: <http://www.pcworld.com/article/89084/logitech_shows_cloth_keyboard_for_pdas.html> on May 7, 2012, Mar. 15, 2002, 5 pages.
McLellan,"Eleksen Wireless Fabric Keyboard: a first look", Retrieved from: <http://www.zdnetasia.com/eleksen-wireless-fabric-keyboard-a-first-look-40278954.htm> on May 7, 2012, Jul. 17, 2006, 9 pages.
Piltch,"ASUS Eee Pad Slider SL101 Review", Retrieved from <http://www.laptopmag.com/review/tablets/asus-eee-pad-slider-sl101.aspx>, Sep. 22, 2011, 5 pages.
Post,"E-Broidery: Design and Fabrication of Textile-Based Computing", IBM Systems Journal, vol. 39, Issue 3 & 4, Jul. 2000, pp. 840-860.
Prospero,"Samsung Outs Series 5 Hybrid PC Tablet", Retrieved from: <http://blog.laptopmag.com/samsung-outs-series-5-hybrid-pc-tablet-running-windows-8> on Oct. 31, 2013, Jun. 4, 2012, 7 pages.
Purcher,"Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012, Retrieved from: <http://www.patentlyapple.com/patently-apple/2012/01/apple-is-paving-the-way-for-a-new-3d-gui-for-ios-devices.html> on Jun. 4, 2012, Jan. 12, 2012, 15 pages.
Schafer,"Using Interactive Maps for Navigation and Collaboration", CHI '01 Extended Abstracts on Human Factors in Computing Systems, Mar. 31, 2001, 2 pages.
Takamatsu,"Flexible Fabric Keyboard with Conductive Polymer-Coated Fibers", In Proceedings of Sensors 2011, Oct. 28, 2011, 4 pages.
Zhang,"Model-Based Development of Dynamically Adaptive Software", In Proceedings of ICSE 2006, Available at <http://www.irisa.fr/lande/lande/icse-proceedings/icse/p371.pdf>, May 20, 2006, pp. 371-380.
"Corrected Notice of Allowance", U.S. Appl. No. 14/994,737, dated Mar. 20, 2017, 2 pages.
"Corrected Notice of Allowance", U.S. Appl. No. 14/994,737, dated Mar. 30, 2017, 2 pages.
"Foreign Office Action", CN Application No. 201310067356.2, dated Mar. 20, 2017, 9 pages.
"Foreign Office Action", CN Application No. 201310067641.4, dated Jan. 23, 2017, 7 pages.
"Foreign Office Action", CN Application No. 201380025290.9, dated Mar. 27, 2017, 13 pages.
"Foreign Office Action", EP Application No. 13730686.6, dated Mar. 27, 2017, 6 pages.
"Foreign Office Action", EP Application No. 13861292.4, dated Jan. 3, 2017, 4 pages.
"Foreign Office Action", EP Application No. 14720018.2, dated Mar. 7, 2017, 7 pages.
"Non-Final Office Action", U.S. Appl. No. 14/225,250, dated Mar. 20, 2017, 7 pages.
"Non-Final Office Action", U.S. Appl. No. 15/083,008, dated Mar. 24, 2017, 13 pages.
"Non-Final Office Action", U.S. Appl. No. 15/184,566, dated Mar. 30, 2017, 9 pages.
"Notice of Allowance", U.S. Appl. No. 14/147,252, dated Apr. 14, 2017, 7 pages.
"Final Office Action", U.S. Appl. No. 15/425,779, dated Nov. 20, 2017, 7 pages.
"Foreign Notice of Allowance", JP Application No. 2014-560073, dated Oct. 31, 2017, 4 pages.
"Foreign Notice of Allowance", JP Application No. 2014-560120, dated Sep. 29, 2017, 4 pages.
"Foreign Office Action", EP Application No. 13858283.8, dated Oct. 18, 2017, 4 pages.
"Foreign Office Action", EP Application No. 13860271.9, dated Nov. 7, 2017, 5 pages.
"Foreign Office Action", EP Application No. 14703759.2, dated Nov. 6, 2017, 8 pages.
"Non-Final Office Action", U.S. Appl. No. 15/083,008, dated Oct. 17, 2017, 16 pages.
"Notice of Allowance", U.S. Appl. No. 13/471,336, dated Dec. 26, 2017, 7 pages.
"Notice of Allowance", U.S. Appl. No. 14/225,250, dated Nov. 6, 2017, 5 pages.
"Final Office Action", U.S. Appl. No. 13/471,393, dated Jul. 12, 2017, 20 pages.
"Foreign Office Action", CN Application No. 201310067523.3, dated May 17, 2017, 8 pages.
"Foreign Office Action", CN Application No. 201380025290.9, dated Jul. 18, 2017, 9 pages.
"Foreign Office Action", EP Application No. 13858403.2, dated Aug. 1, 2017, 5 pages.
"Foreign Office Action", JP Application No. 2014-560072, dated Jun. 27, 2017, 4 pages.
"Foreign Office Action", JP Application No. 2014-560073, dated Jul. 25, 2017, 12 pages.
"Foreign Office Action", JP Application No. 2014-560120, dated Jun. 13, 2017, 5 pages.
"Notice of Allowance", U.S. Appl. No. 13/471,336, dated Aug. 9, 2017, 7 pages.
"Notice of Allowance", U.S. Appl. No. 14/794,182, dated Jul. 13, 2017, 7 pages.
"Corrected Notice of Allowance", U.S. Appl. No. 13/715,133, dated Apr. 2, 2014, 2 pages.
"Corrected Notice of Allowance", U.S. Appl. No. 14/847,838, dated Jun. 26, 2017, 3 pages.
"Corrected Notice of Allowance", U.S. Appl. No. 14/994,737, dated May 10, 2017, 2 pages.
"Final Office Action", U.S. Appl. No. 13/471,336, dated Jun. 8, 2017, 8 pages.
"Foreign Notice of Allowance", JP Application No. 2014-560119, dated Apr. 18, 2017, 4 pages.
"Foreign Office Action", Application No. MX/a/2014/010533, dated Nov. 25, 2016, 3 pages.
"Foreign Office Action", CN Application No. 201310067603.9, dated Apr. 19, 2017, 12 pages.
"Non-Final Office Action", U.S. Appl. No. 15/050,072, dated May 12, 2017, 9 pages.
"Non-Final Office Action", U.S. Appl. No. 15/425,799, dated Jun. 2, 2017, 12 pages.
"Notice of Allowance", U.S. Appl. No. 12/163,614, dated Apr. 3, 2013, 9 pages.
"Notice of Allowance", U.S. Appl. No. 14/847,838, dated May 4, 2017, 10 pages.
"Supplemental Notice of Allowance", U.S. Appl. No. 14/147,252, dated May 3, 2017, 2 pages.
"Supplemental Notice of Allowance", U.S. Appl. No. 14/147,252, dated May 15, 2017, 2 pages.
"Supplemental Notice of Allowance", U.S. Appl. No. 14/147,252, dated Jun. 21, 2017, 2 pages.
"Corrected Notice of Allowance", U.S. Appl. No. 14/482,983, dated Mar. 13, 2017, 5 pages.
"Corrected Notice of Allowance", U.S. Appl. No. 14/482,983, dated Feb. 22, 2017, 6 pages.
"Corrected Notice of Allowance", U.S. Appl. No. 14/994,737, dated Mar. 2, 2017, 2 pages.
"Foreign Notice of Allowance", CN Application No. 201310067385.9, dated Feb. 20, 2017, 4 pages.
"Foreign Notice of Allowance", CN Application No. 201310096345.7, dated Feb. 4, 2017, 4 pages.
"Foreign Office Action", JP Application No. 2014-560121, dated Dec. 20, 2016, 8 pages.
"Foreign Office Action", JP Application No. 2015-512767, dated Jan. 24, 2017, 8 pages.
"Non-Final Office Action", U.S. Appl. No. 14/692,497, dated Feb. 22, 2017, 8 pages.

(56) References Cited

OTHER PUBLICATIONS

"Corrected Notice of Allowance", U.S. Appl. No. 15/426,116, dated Oct. 10, 2017, 2 pages.
"Final Office Action", U.S. Appl. No. 14/225,250, dated Aug. 17, 2017, 8 pages.
"Foreign Office Action", CN Application No. 201310225788.1, dated Sep. 20, 2017, 10 pages.
"Foreign Office Action", JP Application No. 2015-512767, dated Jul. 25, 2017, 6 pages.
"Notice of Allowance", U.S. Appl. No. 14/692,497, dated Sep. 8, 2017, 7 pages.
"Notice of Allowance", U.S. Appl. No. 15/426,116, dated Sep. 14, 2017, 7 pages.
"Supplemental Notice of Allowance", U.S. Appl. No. 14/692,497, dated Sep. 18, 2017, 2 pages.
"Supplemental Notice of Allowance", U.S. Appl. No. 14/692,497, dated Oct. 6, 2017, 2 pages.
"Supplemental Notice of Allowance", U.S. Appl. No. 14/794,182, dated Aug. 14, 2017, 2 pages.
"Supplemental Notice of Allowance", U.S. Appl. No. 14/847,838, dated Aug. 17, 2017, 4 pages.
"Corrected Notice of Allowance", U.S. Appl. No. 14/944,737, dated Jan. 18, 2017, 2 pages.
"Examiner's Answer to Appeal Brief", U.S. Appl. No. 13/492,232, dated Feb. 9, 2017, 5 pages.
"Final Office Action", U.S. Appl. No. 14/225,250, dated Dec. 27, 2016, 10 pages.
"Foreign Office Action", CN Application No. 201310067373.6, dated Dec. 27, 2016, 12 pages.
"Foreign Office Action", CN Application No. 201310067622.1, dated Nov. 23, 2016, 16 pages.
"Foreign Office Action", JP Application No. 2014-560073, dated Jan. 4, 2017, 7 pages.
"Foreign Office Action", JP Application No. 2014-560119, dated Jan. 4, 2017, 6 pages.
"Foreign Office Action", JP Application No. 2014-560120, dated Jan. 10, 2017, 5 pages.
"Foreign Office Action", JP Application No. 2014-560122, dated Dec. 6, 2016, 10 pages.
"Notice of Allowance", U.S. Appl. No. 14/482,983, dated Jan. 4, 2017, 10 pages.
"Final Office Action", U.S. Appl. No. 14/307,262, dated Sep. 29, 2016, 7 pages.
"Foreign Notice of Allowance", CN Application No. 201310067429.8, dated Dec. 13, 2016, 4 pages.
"Foreign Notice of Allowance", CN Application No. 201310067627.4, dated Oct. 24, 2016, 4 pages.
"Foreign Office Action", CN Application No. 201310067356.2, dated Oct. 9, 2016, 13 pages.
"Foreign Office Action", CN Application No. 201310067385.9, dated Oct. 8, 2016, 6 pages.
"Foreign Office Action", CN Application No. 201310067523.3, dated Nov. 7, 2016, 12 pages.
"Foreign Office Action", CN Application No. 201310067603.9, dated Oct. 17, 2016, 6 pages.
"Foreign Office Action", CN Application No. 201310096345.7, dated Oct. 9, 2016, 15 pages.
"Foreign Office Action", CN Application No. 201380025290.9, dated Oct. 19, 2016, 8 pages.
"Foreign Office Action", EP Application No. 13858283.8, dated Nov. 2, 2016, 5 pages.
"Foreign Office Action", EP Application No. 13858674.8, dated Oct. 26, 2016, 5 pages.
"Non-Final Office Action", U.S. Appl. No. 13/471,393, dated Oct. 5, 2016, 17 pages.
"Non-Final Office Action", U.S. Appl. No. 14/147,252, dated Oct. 12, 2016, 17 pages.
"Non-Final Office Action", U.S. Appl. No. 14/847,838, dated Dec. 16, 2016, 24 pages.
"Notice of Allowance", U.S. Appl. No. 14/307,262, dated Nov. 30, 2016, 5 pages.
"Notice of Allowance", U.S. Appl. No. 14/994,737, dated Nov. 30, 2016, 5 pages.
"Foreign Office Action", EP Application No. 13858834.8, dated Jan. 18, 2018, 5 pages.
"Foreign Office Action", CN Application No. 201310067373.6, dated Dec. 11, 2017, 9 pages.
Zhu, et al., "Keyboard before Head Tracking Depresses User Success in Remote Camera Control", In Proceedings of Human-Computer Interaction—Interact 2009, 12th IFIP TC 13 International Conferenc, Aug. 24, 2009, 14 Pages.
Smalley, et al., "Anisotropic Leaky-Mode Modulator for Holographic Video Displays", In Proceedings of the Nature, vol. 498, Jun. 20, 2013, 6 Pages.
Staff, "Gametel Android controller turns tablets, phones into portable gaming devices", Retrieved from: http://www.mobiletor.com/gametel-android-controller-turns-tablets-phones-into-portable-gaming-devices/, Nov. 18, 2011, 5 Pages.
Sumimoto, "Touch & Write: Surface Computing With Touch and Pen Input", Retrieved from: http://www.gottabemobile.com/touch-write-surface-computing-with-touch-and-pen-input/, Aug. 7, 2009, 4 Pages.
Sundstedt, Veronica, "Gazing at Games: Using Eye Tracking to Control Virtual Characters", In Proceedings of International Conference on Computer Graphics and Interactive Techniques, SIGGRAPH 2010, Jul. 28, 2010, 85 Pages.
Takamatsu, et al., "Flexible Fabric Keyboard with Conductive Polymer-Coated Fibers", In Proceedings of the IEEE. on Sensors, Oct. 28, 2011, pp. 659-662.
Teng, et al., "Fabrication of nanoscale zero-mode waveguides using microlithography for single molecule sensing", In Proceedings of the Nanotechnology, vol. 23, No. 45, Oct. 19, 2012, 7 Pages.
Thurrott, Paul, "Nokia Lumia "Black": Glance 2.0", Retrieved from: http://winsupersite.com/windows-phone/nokia-lumia-black-glance-20, Jan. 11, 2014, 3 Pages.
Thurrott, "Surface Pro 3: Continuous Kickstand", Retrieved from: http://winsupersite.com/mobile-devices/surface-pro-3-continuous-kickstand, May 21, 2014, 5 Pages.
Tien, et al., "Microcontact Printing of SAMs", In Proceedings of the Thin Films, vol. 24, May 28, 2014, 24 Pages.
Travis, et al., "Collimated Light from a Waveguide for a Display Backlight", In Journal of Optics Express, vol. 17, Issue 22, Oct. 26, 2009, pp. 19714-19719.
Travis, et al., "Flat Projection for 3-D", In Proceedings of the IEEE, vol. 94 Issue: 3, Mar. 13, 2006, pp. 539-549.
Travis, et al. "Optical Design of a Flat Panel Projection Wedge Display", In Proceedings of the 9th International Display Workshops, Dec. 2002, 4 Pages.
Travis, et al., "P-127: Linearity in Flat Panel Wedge Projection", In SID Symposium Digest of Technical Papers, vol. 34, Issue 1, May 1, 2003, pp. 716-719.
Travis, et al., "P-60: LCD Smear Elimination by Scanning Ray Angle into a Light Guide", In Proceedings of SID Symposium Digest of Technical Papers, vol. 35, Issue 1, May 2004, pp. 474-477.
Travis, et al., "The Design Of Backlights For View-Sequential 3D", Retrieved From: https://www.microsoft.com/en-us/research/publication/design-backlights-view-sequential-3d/, Jun. 21, 2010, 4 Pages.
Valli, Alessandro, "Notes on Natural Interaction", Retrieved From: http://www.idemployee.id.tue.nl/g.w.m.rauterberg/lecturenotes/valli-2004.pdf , Sep. 2005, 80 Pages.
Valliath, et al., "Design of Hologram for Brightness Enhancement in Color LCDs", In SID Symposium Digest of Technical Papers, vol. 29, No. 1, May 1, 1998, 5 Pages.
Vaucelle, "Scopemate, A Robotic Microscope!", Retrieved from: http://architectradure.blogspot.com/2011/1 0/at-uist-this-monday-scopemate-robotic.html, Oct. 17, 2011, 2 Pages.
Whitwam, Ryan, "How to Tweak Android's Lock Screen and Notifications", Retrieved from: http://www.tested.com/tech/android/457766-tips-and-tricks-make-androids-lock-screen-and-notifications-even-better/?icid=pets%7Chat%7Ctestedlink%7C457766-how-to-tweak-androids-lock-screen-and-notification , Sep. 18, 2013, 4 Pages.

(56) References Cited

OTHER PUBLICATIONS

Wiebe, Toban, "Using screen space efficiently with Gridmove", Retrieved from: http://lowerthought.wordpress.com/2010/05/15/using-screen-space-efficiently-with-gridmove/, May 15, 2010, 1 Page.

Williams, Jim, "A Fourth Generation of LCD Backlight Technology", Retrieved from: http://cds.linear.com/docs/en/application-note/an65fa.pdf, Nov. 1995, 124 Pages.

Xu, et al., "Hand Gesture Recognition and Virtual Game Control Based on 3D Accelerometer and EMG Sensors", In Proceedings of the 14th International Conference on Intelligent User Interfaces, Feb. 8, 2009, pp. 401-405.

Xu, et al., "Vision-based Detection of Dynamic Gesture", In Proceedings of the International Conference on Test and Measurement, Dec. 5, 2009., pp. 223-226.

Yagi, The Concept of "AdapTV", Series: The Challenge of "AdapTV", In Proceedings of Broadcast Technology, No. 28, 2006, pp. 16-17.

Yan, et al., "Edge-Lighting Light Guide Plate Based on Micro-Prism for Liquid Crystal Display", In Journal of Display Technology, vol. 5. No. 9, Sep. 1, 2009, pp. 355-357.

Yu, et al., "A New Driving Scheme for Reflective Bistable Cholesteric Liquid Crystal Displays", In Proceedings Of Society for Information Display International Symposium Digest of Technical Papers, May 1997, 4 Pages.

Zhang, Rui, "Design of Head Mounted Displays", In Tutorial Report for Optics 521, Dec. 12, 2007, 6 Pages.

Jacobs, et al., "2D/3D Switchable Displays", In the Proceedings of Sharp Technical Journal, vol. 4, Apr. 2003, pp. 15-18.

Jarvenpaa, et al., "Compact Near-To-Eye Display With Integrated Gaze Tracker", In Proceedings of the SPIE, Photonics in Multimedia II, vol. 7001, Apr. 25, 2008, 8 Pages.

Johnson, Jennifer, "Samsung Galaxy Tab Pro 10.1 Review", Retrieved from: http://hothardware.com/reviews/samsung-galaxy-tab-pro-101-review, Mar. 21, 2014, 10 Pages.

Justin, "Seidio Active with Kickstand for the Galaxy Sill", http://www.t3chniq.com/seidio-active-with-kickstand-gs3/, Jan. 3, 2013, 5 Pages.

Kandogan,, et al., "Elastic Windows: Improved Spatial Layout and Rapid Multiple Window Operations", In Proceedings of the Workshop on Advanced Visual Interfaces, May 27, 1996, 10 Pages.

Kaufmann, et al., "Hand Posture Recognition Using Real-time Artificial Evolution", In European Conference on the Applications of Evolutionary Computation, Apr. 7, 2010, 10 Pages.

Kim, et al., "A Controllable Viewing Angle LCD with an Optically isotropic liquid crystal", Journal of Physics D: Applied Physics, vol. 43, Issue 14, Mar. 23, 2010, 7 Pages.

Kishore, Aseem, "Split or Divide Your Desktop Screen into Multiple Parts", Retrieved from https://web.archive.org/web/20081019203601/http://www.online-tech-tips.com/free-software-downloads/split-or-divide-your-desktop-screen-into-multiple-parts/, Oct. 18, 2008, 7 Pages.

Ksentini, Adlen, "Building the Bridges between QoS and QoE for Network Control Mechanisms", In Dissertation of Enabling a Direct Research Presented in Front of the University of Rennes, Jul. 3, 2013, 66 Pages.

L. et al. "All-Nanoparticle Concave Diffraction Grating Fabricated by Self-Assembly onto Magnetically-Recorded Templates", In Proceedings of the Optical Express, vol. 21, Issue 1, Jan. 14, 2013, 1 Page.

Lahr, Derek, "Development of a Novel Cam-based Infinitely Variable Transmission", In Thesis of Master of Science in Mechanical Engineering, Virginia Polytechnic Institute and State University, Nov. 6, 2009, 91 Pages.

Lambert, S., "Cam Design", In Proceedings of Kinematics and dynamics of Machine, University of Waterloo Department of Mechanical Engineering, Jul. 2, 2002, pp. 51-60.

Lane, David M.., et al., "Media Processing Input Device", In U.S. Appl. No. 13/655,065, filed Oct. 18, 2012, 43 Pages.

Lanman, et al., "Near-Eye Light Field Displays", In Proceedings of ACM SIGGRAPH Emerging Technologies, Jul. 2013, 10 Pages.

Lee, et al., "Depth-Fused 3D Imagery on an Immaterial Display", In the Proceedings of IEEE Transactions On Visualization And Computer Graphics, vol. 15, No. 1, Jan. 2009, pp. 20-33.

Lee, et al. "Flat-panel Backlight for View-sequential 3D Display", In IEEE Proceedings Optoelectronics—vol. 151. Issue 6, Dec. 2004, 4 Pages.

Lee, et al. "LED Light Coupler Design for a Ultra Thin Light Guide", In Journal of the Optical Society of Korea, vol. 11, Issue 3, Sep. 2007, 5 Pages.

Levandoski, et al., "The Bw-Tree: a B-tree for New Hardware Platforms", In Proceedings of the 29th IEEE International Conference on Data Engineering, Apr. 8, 2013, 12 Pages.

Liu, et al., "Three-dimensional PC: toward novel forms of human-computer interaction", In the Proceedings of Three-Dimensional Video and Display: Devices and Systems Volume CR76, Nov. 5, 2000, 32 Pages.

Li, et al., "Characteristic Mode Based Tradeoff Analysis of Antenna-Chassis Interactions for Multiple Antenna Terminals", In Proceedings of the IEEE Transactions on Antennas and Propagation, vol. 60, Issue 2, Feb. 2012, pp. 490-502.

Ishida, et al., "A Novel Ultra Thin Backlight System without Optical Sheets Using a Newly Developed Multi-Layered Light-guide", In Journal of the Society for Information Display vol. 19, Issue 12, Jul. 5, 2012, 4 Pages.

Ismail, et al., "Improved Arrayed-Waveguide-Grating Layout Avoiding Systematic Phase Errors", In Proceedings of the Optics Express, vol. 19, No. 9, Apr. 25, 2011, 14 Pages.

Iwase, et al., "Multistep Sequential Batch Assembly of Three-Dimensional Ferromagnetic Microstructures with Elastic Hinges", In Journal of Microelectromechanical Systems, vol. 14, Issue 6, Dec. 2005, pp. 1265-1271.

Mack, Eric, "Moto X: the First Two Weeks", Retrieved from: http://www.gizmag.com/two-weeks-motorola-google-moto-x-review/28722/, Aug. 16, 2013, 8 Pages.

Manresa-Yee, et al., "Experiences Using a Hands-Free Interface", In Proceedings of the 10th international ACM SIGACCESS conference on Computers and accessibility, Oct. 13, 2008, pp. 261-262.

McLellan, Charles, "Microsoft Surface Review", http://www.zdnet.com/product/microsoft-surface-rt/, Nov. 6, 2012, 17 Pages.

Mei, et al., "An all fiber interferometric gradient hydrophone with optical path length compensation", In Proceedings of the Summaries of Papers Presented at the Conference on Lasers and Electro-Optics, May 28, 1999, 2 Pages.

Miller, Matthew, "MOGA gaming controller enhances the Android gaming experiencE", Retrieved from http://www.zdnet.com/article/moga-gaming-controller-enhances-the-android-gaming-experience/, Nov. 18, 2012, 9 Pages.

Morgan, David P.., et al., "History of Saw Devices", In Proceedings of the IEEE International Frequency Control Symposium, May 27, 1998, 22 Pages.

Morookian, et al., "Ambient-Light-Canceling Camera Using Subtraction of Frames", http://ntrs.nasa.gov/archive/nasa/casi.ntrs.nasa.gov/20110016693_2011017808.pdf, May 2004, 2 Pages.

Muller, Hans, "MultiSplitPane: Splitting Without Nesting", Retrieved from: https://web.archive.org/web/20150511183124/https://today.java.net/pub/a/today/2006/03/23/multi-split-pane.html, Mar. 23, 2006, 6 Pages.

Nablo, Sam V., "Transfer Coating by Electron Initiated Polymerization", In Proceedings of the 5th International Meeting on Radiation Processing, vol. 25, Issues 4-6, Jan. 1, 1985, 10 Pages.

Nakanishi, et al., "Movable Cameras Enhance Social Telepresence in Media SpaceS", In Proceedings of the 27th International Conference on Human Factors in Computing Systems, CHI 2009, Boston, MA, USA, Apr. 4, 2009, pp. 433-442.

Nishizawa, et al., "Investigation of Novel Diffuser Films for 2D Light-Distribution Control", In Proceedings of the IDW, Dec. 2011, 4 Pages.

Odegard, "My iPad MagPad Concept", Retrieved from: http://www.pocketables.com/2011/02/my-ipad-magpad-concept.html, Feb. 26, 2011, 8 Pages.

(56) References Cited

OTHER PUBLICATIONS

O'Reilly, Dennis, "Flow to Use the Microsoft Surface Touch Screen and Keyboard", Retrieved from: http://www.cnet.com/how-to/how-to-use-the-microsoft-surface-touch-screen-and-keyboard/, Nov. 6, 2012, 5 Pages.

Patterson, Ben, "iOS 7 Tip: Alerts, Banners, and Badges—What's the Difference?", Retrieved from: http://heresthethingblog.com/2014/01/22/ios-7-tip-whats-difference-alert/, Retrieved on Jan. 22, 2014, 6 Pages.

Paul, Ian, "Three Windows Multitasking Features That Help Maximize Your Screen Space", Retrieved from: http://www.pcworld.com/article/2094124/three-windows-multitasking-features-that-help-maximize-your-screen-space.html., February 4, 2014, 4 Pages.

Phillips, et al., "Links Between Holography and Lithography", In Proceedings of Fifth International Symposium on Display Holography, Feb. 17, 1995, 9 Pages.

Prohaska, Rich, "Fast Updates with TokuDB", Retrieved from: https://www.percona.com/blog/2013/02/12/fast-updates-with-tokudb/, Feb. 12, 2013, 2 Pages.

Qin, et al., "pPen: Enabling Authenticated Pen and Touch Interaction on Tabletop Surfaces", In Proceedings of International Conference on Interactive Tabletops and Surfaces, Nov. 7, 2010, 2 Pages.

Ramirez, George, "Applying Solventless Elastomeric Polyurethanes on Concrete in Wastewater Service", In Journal of Protective Coatings and Linings, May 1995, pp. 93-106.

Reilink, et al., "Endoscopic Camera Control by Head Movements for Thoracic Surgery", In Proceedings of the 3rd IEEE RAS and EMBS International Conference on Biomedical Robotics and Biomechatronics (BioRob), Sep. 26 2010, pp. 510-515.

Reisman, et al., "A Screen-Space Formulation for 2D and 3D Direct Manipulation", In Proceedings of the 22nd Annual ACM Symposium on User Interface Software and Technology, Oct. 4, 2009, pp. 69-78.

Ritchie, Rene, "How to Use Lock Screen, Today, Popups, and Banners in Notification Center for iPhone and iPad", Retrieved from: http://www.imore.com/how-use-notification-center-iphone-ipad , Apr. 30, 2014, 8 Pages.

Roymam, "NiLS Lockscreen Notifications", Retrieved From: https://play.google.com/store/apps/details?id=com.roymam.android.notificationswidget&hl=en_IN , Jun. 28, 2014, 3 Pages.

Salman, Asad, "Create a Minimal Lock Screen With WidgetLocker", Retrieved from: http://android.appstorm.net/how-to/create-a-minimal-lock-screen-with-widgetlocker/ , Dec. 26, 2011, 12 Pages.

Sanap, et al., "Design and Analysis of Globoidal Cam Index Drive", In Proceedings of International Journal of Scientific Research Engineering & Technology vol. 2 Issue 3, Jun. 2013, pp. 163-168.

Schoning, et al., "Building Interactive Multi-Touch Surfaces", In Journal of Graphics, GPU, and Game Tools,vol. 14, Issue 3, Dec. 17, 2009, pp. 35-55.

"Adobe Audition /Customizing Workspaces", Retrieved From: http://help.adobe.com/en_US/audition/cs/using/WS9FA7B8D7-5991-4e05-B13C-4C85DAF1F051.html, May 18, 2011, 6 Pages.

"Always Connected", Retrieved From: https://web.archive.org/web/20130624104603/http://www.samsung.com/global/microsite/galaxycamera/nx/, Jun. 24, 2013,5 Pages.

"Apple Designs a Future Built-In Stand for the iPad & More", Retrieved From: http://www.patentlyapple.com/patently-apple/2011/02/apple-designs-a-future-built-in-stand-for-the-ipad-more.htm , Feb. 3, 2011, 9 Pages.

"Apple-45W MagSafe 2 Power Adapter with Magnetic DC Connector", Retrieved From: http://www.bestbuy.com/site/Apple%26%23174%3B---45W-MagSafe-2-Power-Adapter-with-Magnetic-DC-Connector/5856526pid=1218696408860&skuld=5856526#tab=overview , May 14, 2013,4 Pages.

"Basic Cam Motion Curves",Retrieved From: http://ocw.metu.edu.tr/pluginfile.php/6886/mod_resource/content/1/ch8/8-3.htm, Retrieved on: Nov. 22, 2013,14 Pages.

"Can I Customize my Samsung Galaxy S4 Lock Screen? Which Features can I Access When the Device is Locked?", Retrieved from: https://web.archive.org/web/20150312081752/http://www.samsung.com/us/support/howtoguide/N0000006/10632/127767 , Retrieved on: May 16, 2014,12 Pages.

"Cholesteric Liquid Crystal", Retrieved from: http://en.wikipedia.org/wiki/Cholesteric_liquid_crystal, Jun. 10, 2012, 2 Pages.

"Controlling Your Desktop's Power Management", Retrieved From: http://www.vorkon.de/SU1210.001/drittanbieter/Dokumentation/openSUSE_11.2/manual/sec.gnomeuser.start.power_mgmt.html, Jul. 7, 2014, 6 Pages.

"Developing Next-Generation Human Interfaces using Capacitive and Infrared Proximity Sensing", Retrieved From: http://www.funkschau.de/fileadmin/media/whitepaper/files/Capacitive%20and%20proximity%20sensing_WP.pdf, Aug. 30, 2010,10 Pages.

"Display Control", Retrieved From: http://www.portrait.com/technology/display-control.html, Jun. 24, 2013, 5 Pages.

"DR2PA", "Retrieved from:https://www.controltechasia.com/images/PANEL/DR2P/DR2PA%20%28AU%20&%20US%20size%29%20Data%20Sheet%20Rev%20G.pdf", Jan. 2012, 4 Pages.

"For Any Kind of Proceeding 2011 Springtime as Well as Coil Nailers as Well as Hotter Summer Season", Retrieved From: http://www.ladyshoesworld.com/.../for-any-kind-of-proceeding-2011-springtime-as-well-as-hotter-summer-season, Sep. 8, 2011, 2 Pages.

"i-Blason Spring Series Premium Flexible KickStand Anti-Slippery TPU Cover Case for iPhone 44S (White)", Retrieved From: http://www.amazon.com/i-Blason-Premium-Flexible-KickStand-Anti-Slippery/dp/B007LCLXLU, Nov. 30, 2012, 4 Pages.

"i-Interactor Electronic Pen", Retrieved from: http://www.alibaba.com/productgs/331004878i_Interactor_electronic_pen.html, Jun. 19, 2012, 5 Pages.

"Lock Screen Overview (Windows Runtime Apps)", Retrieved from: https://msdn.microsoft.com/en-in/library/windows/apps/hh779720.aspx, Dec. 31, 2012, 5 Pages.

"Magnetic Cell Phone Holder-Extreme Computing", Retrieved From: https://web.archive.org/web/20080328121416/http://www.extremecomputing.com/magnetholder.html, Retrieved on: May 7, 2008,1 Page.

"Manage Multiple Windows", Retrieved from: https://web.archive.org/web/20150818093212/http://windows.microsoft.com/en-hk/windows/manage-multiple-windows#1TC=windows-7, Jul. 8, 2014,4 Pages.

"Merge Operator", Retrieved From: https://github.com/facebook/rocksdb/wiki/Merge-Operator, Jun. 14, 2014,10 Pages.

"Microsoft Develops Glasses-Free Eye-Tracking 3D Display", Retrieved From: http://www.tech-faq.com/microsoft-develops-glasses-free-eye-tracking-3d-display.html Retrieved Date: Nov. 2, 2011, 3 Pages.

"Microsoft Reveals Futuristic 3D Virtual HoloDesk Patent", Retrieved From: http://www.patentlymobile.com/2012/05/microsoft-reveals-futuristic-3d-virtual-holodesk-patent.html, May 23, 2012, 9 Pages.

"Microsoft Tablet PC", Retrieved From: http://web.archive.org/web/20120622064335/https://en.wikipedia.org/wiki/ Microsoft_Tablet_PC, Jun. 21, 2012, 9 Pages.

"MPC Fly Music Production Controller", Retrieved from: http://www.akaiprompc.com/mpc-fly, Jul. 9, 2012, 4 Pages.

"neXus Charging Cradle", Retrieved from: http://www.gen-xtech.com/neXus.php, Apr. 17, 2012, 2 Pages.

"Ni Releases New Maschine & Maschine Mikro", Retrieved from: http://www.djbooth.net/index/dj-equipment/entry/ni-releases-new-maschine-mikro/, Sep. 17, 2012,19 Pages.

"Optical Sensors in Smart Mobile Devices", Retrieved From: http://www.onsemi.com/pub_link/Collateral/TND415-D. PDF, Nov. 2010,13 Pages.

"Optics for Displays: Waveguide-based Wedge Creates Collimated Display Backlight", Retrieved from: http:/www.pptoiq.com/index/photonics-technologies-applications/lfw-di, Jan. 1, 2010,3 Pages.

"Organize Your Desktop Workspace for More Comfort with WindowSpace", Retrieved from: http://www.ntwind.com/software/windowspace.html, Jul. 4, 2014,5 Pages.

"PCI Express SMT Connector 1 FCI", Retrieved from: http://www.ttiinc.com/object/fp_fci_PCISMT, Feb. 2013,1 Page.

"Real-Time Television Content Platform", Retrieved from: http://web.archive.org/web/20110623222932/http://www.accenture.com/us-en/Pages/insight-real-time-television-platform.aspx, May 28, 2002, 3 Pages.

(56) References Cited

OTHER PUBLICATIONS

"Rechargeable Stylus Pen", Retrieved from: http://www.e-pens.com/uk/rechargeable-stylus-pen.html, Jul. 5, 2013,1 Page.
"Reflex LCD Writing Tablets", Retrieved from: http://web.archive.org/web/20120729211117/http://www.kentdisplays.com/products/lcdwritingtablets.html, Jun. 27, 2012, 3 Pages.
"RoPD Connectors", https://web.archive.org/web/20140520105144/http://www.rosenberger.de/documents/headquarters_de_en/ba_automotive/AUTO_RoPD_Flyer_2012.pdf, Jun. 2012,6 Pages.
"SizeUp the Missing Window Manager", Retrieved from: http://www.irradiatedsoftware.com/sizeup/, Jul. 4, 2014, 3 Pages.
"Smart Board Interactive Display Frame Pencil Pack", Retrieved from: http://downloads01.smarttech.com/media/sitecore/en/support/product/sbfpd/400series(interactivedisplayframes)/guidessmartboardinteractivedisplayframepencilpackv12mar09.pdf, 2009, 2 Pages.
"Snugg iPad 3 Keyboard Case—Cover Ultra Slim Bluetooth Keyboard Case for the iPad 3 and iPad 2", Retrieved From: http://web.archive.org/web/20120810202056/http://www.amazon.com/Snugg-iPad-Keyboard-Case-Bluetooth/dp/B008CCHXJE, Aug. 10, 2012, 4 Pages.
"Split the Windows Desktop: How to Divide a Single Large Desktop into Multiple Smaller Ones", Retrieved from: http://www.actualtools.com/multiplemonitors/split-windows-desktop-how-to-divide-single-large-desktop-into-smaller-ones.shtml, Retrieved Date: Jul. 7, 2014, 3 Pages.
"Surface", Retrieved From: http://www.microsoft.com/surface/en-us/support/hardware-and-drivers/type-cover, Retrieved on: Dec. 26, 2013,6 Pages.
"Tech Me Simply", Retrieved From: http://techmesimply.blogspot.in/2013/05/yugatech_3.html, May 3, 2013, pp. 1-6.
"The New Lenovo Yoga Tablet 8", Retrieved from: http://web.archive.org/web/20150320022048/http://www.pricepanda.co.in/lenovo-yoga-tablet-8-pid1529091/, Jun. 11, 2014, 3 Pages.
"Using Flickr to Organise a Collection of Images", Retrieved from: https://web.archive.org/web/20130402043816/http://www.jiscdigitalmedia.ac.uk/guide/using-flickr-to-organise-a-collection-of-images, Apr. 2, 2013,17 Pages.
"What is the PD-Net Project About?", Retrieved from: https://web-beta.archive.org/web/20110814125815/http://pd-net.org/about, Retrieved on Mar. 10, 2011, 3 Pages.
"Window Magnet", Retrieved from: http://web.archive.org/web/20110623033348/http://magnet.crowdcafe.com/ Jun. 23, 2011, 2 Pages.
"Windows 7: Display Reminder When Click on Shutdown?", Retrieved from: http://www.sevenforums.com/customization/118688-display-reminder-when-clickshutdown.html, Oct. 18, 2010, 5 Pages.
"Working with Windows", Retrieved From: http://h30097.www3.hp.com/docs/base_doc/DOCUMENTATION/V4F4, Retrieved on: Jul. 4, 2014,14 Pages.
"Writer 1 for iPad 1 keyboard+ Case (Aluminum Bluetooth Keyboard, Quick Eject and Easy Angle Function!)", Retrieved from: https://web.archive.org/web/20120817053825/http://www.amazon.com/keyboard-Aluminum-Bluetooth-Keyboard-Function/dp/B0040QLSLG, Aug. 17, 2012, 5 Pages.
"Office Action Issued in European Patent Application No. 13858834.8", dated Jan. 18, 2018, 5 Pages.
"Final Office Action Issued in U.S. Appl. No. 15/083,008", dated Apr. 9, 2018, 16 Pages.
"Non Final Office Action Issued in U.S. Appl. No. 15/083,008", dated Aug. 7, 2018, 21 Pages.
"Final Office Action Issued in U.S. Appl. No. 15/190,961", dated May 30, 2018, 11 Pages.
"Non-Final Office Action Issued in U.S. Appl. No. 15/190,961", dated Sep. 21, 2018, 6 Pages.
"Office Action Issued in Japanese Patent Application No. 2016-505516", dated Feb. 6, 2018, 3 Pages.
"Office Action Issued in Japanese Patent Application No. 2017-078955", dated Mar. 13, 2018, 8 Pages.
Ando, et al., "Development of Three-Dimensional Microstages Using Inclined Deep-Reactive Ion Etching", In Journal of Microelectromechanical Systems, vol. 16, Issue 3, Jun. 1, 2007, 9 pages.
Arar, Yardena, "HP Envy Rove: a Movable (If Underpowered) All-In-One PC", Retrieved from: http://web.archive.org/web/20130821102541/http://www.pcworld.com/article/2047032/hp-envy-rove-a-movable-if-underpowered-all-in-one-pc.html, Aug. 21, 2013, 6 Pages.
Ashraf, "Winsplit Revolution: Tile, Resize, and Position Windows for Efficient Use of Your Screen", Retrieved from: http://dottech.org/11240/winsplit-revolution-tile-resize-and-position-windows-for-efficient-use-of-your-screen/, Dec. 18, 2011, 4 Pages.
Bert, et al. "Passive Matrix Addressing of Electrophoretic Image Display", In Proceedings of the 22nd International Display Research Conference, Oct. 1, 2002, pp. 251-254.
Boual, et al., "Wedge Displays as Cameras", In SID Symposium Digest of Technical Papers, vol. 37, Issue 1, Jun. 2006, pp. 1999-2002.
Boulanger, Cati, "Architectradure", Retrieved From: http://architectradure.blogspot.com/2011/10/at-uist-this-monday-scopemate-robotic.html, Oct. 17, 2011, 2 Pages.
Breath, "ThinkSafe: a Magnetic Power Connector for Thinkpads", Retrieved From: http://www.instructables.com/id/ThinkSafe%3A-A-Magnetic-Power-Connector-for-Thinkpad/, Oct. 26, 2006, 9 Pages.
Burge, et al., "Determination of Off-Axis Aberrations of Imaging Systems Using On-Axis Measurements", In Proceedings of the SPIE 8129, Novel Optical Systems Design and Optimization XIV, 81290F, Sep. 21, 2011, 10 Pages.
Callaghan, Mark, "Types of Writes", Retrieved from: http://smalldatum.blogspot.in/2014/04/types-of-writes.html, April 16, 2014, 3 Pages.
Camp, Jeffrey, et al., "Lenovo Thinkpad Tablet 2 Review", Retrieved from: http://www.digitaltrends.com/tablet-reviews/lenovo-thinkpad-tablet-2-review/, Feb. 12, 2013, 7 Pages.
Campbell, "Future iPhones May Unlock, Hide Messages based on a User's Face", Retrieved from: http://appleinsider.com/articles/13/12/03/future-iphones-may-unlock-hide-messages-based-on-a-users-face, Dec. 3, 2013, 11 Pages.
Caprio, "Enabling Notification Badges for Whatsapp and Other Android Apps", Retrieved From: http://geek.ng/2013/05/enabling-notitication-badges-for-whatsapp-and-other-android-apps.html, May 20, 2014, 7 Pages.
Carlon, "How to Add a WhatsApp Widget to your Lock Screen", Retrieved from: http://web.archive.org/web/20140409045447/http://www.androidpit.com/how-to-add-a-whatsapp-widget-to-your-lock-screen, Apr. 29, 2014, 6 Pages.
Chang, et al., "Optical Design and Analysis of LCD Backlight Units Using ASAP", in Optical Engineering Magazine, Jun. 2003, 15 Pages.
Chang-Yen, et al., "A Monolithic PDMS Waveguide System Fabricated Using Soft-Lithography Techniques", in Journal of the Lightwave Technology, vol. 23, No. 6, Jun. 2005, 6 Pages.
Charles, et al., "Design of Optically Path Length Matched, Three-Dimensional Photonic Circuits Comprising Uniquely Routed Waveguides", in Proceedings of the Applied Optics, vol. 51, Issue 27, Sep. 20, 2012, 11 Pages.
Chavan, et al., "Synthesis, Design and Analysis of a Novel Variable Lift Cam Follower System", in Proceedings of International Journal of Design Engineering, vol. 3, Issue 4, Jan. 1, 2010, 1 Page.
Chen, et al., "A Study of Fiber-to-Fiber Losses in Waveguide Grating Routers", in Journal of the Lightwave Technology, vol. 15, No. 10, Oct. 1997, 5 Pages.
Chen, et al., "Design of a Novel Hybrid Light Guide Plate for Viewing Angle Switchable Backlight Module", Jul. 1, 2013, 4 Pages.
Chou, et al., "Imaging and Chromatic Behavior Analysis of a Wedge-Plate Display", in SID Symposium Digest of Technical Papers vol. 37, Issue 1, Jun. 2006, pp. 1031-1034.
Cohen, et al., "Automatic Strategies in the Siemens RTL Tiled Window Manager", in Proceedings of the 2nd IEEE Conference on Computer Workstations, Mar. 7, 1988, 9 pages.

(56) References Cited

OTHER PUBLICATIONS

Constine, Josh, "Cover is an Android-Only Lockscreen that Shows Apps When You Need Them", Retrieved from: http://techcrunch.com/2013/10/24/cover-android/, Oct. 24, 2013, 15 Pages.

Cottier, et al., "Label-free Highly Sensitive Detection of (small) Molecules by Wavelength Interrogation of Integrated Optical Chips", in Proceedings of the Sensors and Actuators B: Chemical, vol. 91, Issue 1-3, Jun. 1, 2003, 11 Pages.

Das, et al., "Study of Heat Transfer through Multilayer Clothing Assemblies: a Theoretical Prediction", in Autex Research Journal, vol. 11, Issue 2, Jun., 2011, 6 Pages.

Diverdi, et al., "An Immaterial Pseudo-3D Display with 3D Interaction", in the Proceedings of Three-Dimensional Television: Capture, Transmission, and Display, Feb. 6, 2007, pp. 1-26.

Dodson, Brian, "New Technology from MIT may Enable Cheap, Color, Holographic Video Displays", Retrieved From: http://newatlas.com/holograph-3d-color-video-display-inexpensive-mit/28029/, Jun. 25, 2013, 8 Pages.

Dumon, et al., "Compact Arrayed Waveguide Grating Devices in Silicon-on-Insulator", in Proceedings of the IEEE/LEOS Symposium Benelux Chapter, Dec. 2005, 4 Pages.

Eckel, Erik, "Personalize Alerts with the Help of OS X Mavericks Notifications", Retrieved from: http://www.techrepublic.com/article/customize-os-x-mavericks-notifications-to-personalize-alerts/, Mar. 10, 2014, 7 Pages.

Garcia, et al., "COMET: Content Mediator Architecture for Content-Aware Networks", in Proceedings of Future Network & Mobile Summit Conference, Jun. 15, 2011, 8 Pages.

Gaver, et al., "A Virtual Window on Media Space", in Proceedings of the SIGCHI conference on Human factors in computing systems, May 7, 1995, pp. 257-264.

Gila, et al., "First Results from a Multi-Ion Beam Lithography and Processing System at the University of Florida", in AIP Conference Proceedings, vol. 1336, Issue 1, Jun. 1, 2011, pp. 243-247.

Glendenning, Paul, "Polymer Micro-Optics via Micro Injection Moulding", Retrieved From: https://web.archive.org/web/20120310003606/http://www.microsystems.uk.com/english/polymer_optics_injection_moulding.html, Jan. 10, 2011, 6 Pages.

Greiner, et al., "Bandpass Engineering of Lithographically Scribed Channel-Waveguide Bragg Gratings", in Proceedings of the Optics Letters, vol. 29, No. 8, Apr. 15, 2004, 3 Pages.

Grossman, et al., "Multi-Finger Gestural Interaction with 3D Volumetric Displays", in Proceedings of the 17th Annual ACM Symposium on User Interface Software and Technology, Oct. 24, 2004, 10 Pages.

Harada, et al., "VoiceDraw: a Hands-Free Voice-Driven Drawing Application for People With Motor Impairments", in Proceedings of the 9th international ACM SIGACCESS conference on Computers and accessibility, Oct. 15, 2007, 8 Pages.

Haslam, "This App for Android Customizes your Lock Screen Automatically Depending on Time of Day or Situation", Retrieved from: http://www.redmondpie.com/this-app-for-android-customizes-your-lock-screen-automatically-depending-on-time-of-day-or-situation/, Jun. 1, 2012, 6 Pages.

Henry, Alan, "Supercharge Your Lock Screen with DashClock and These Add-Ons", Retrieved from: http://lifehacker.com/supercharge-your-lock-screen-with-dashclock-and-these-a-493206006, May 7, 2013, 12 Pages.

Hepburn, Aden, "Color: the Location Based Social Photo App", Retrieved from: http://www.digitalbuzzblog.com/color-the-location-based-social-photo-iphone-app/, Mar. 27, 2011, 12 Pages.

Hinckley, et al., "Codex: a Dual Screen Tablet Computer", in Proceedings of the SIGCHI Conference on Human Factors in Computing Systems, Apr. 9, 2009, 10 Pages.

Hollister, Sean, "Windows 8 Primer: How to Navigate Microsoft's New Operating System", Retrieved from: http://www.theverge.com/2012/10/28/3562172/windows-8-gestures-keyboard-shortcuts-tips-tricks-how-to-guide, Oct. 28, 2012, 30 Pages.

Hua, et al., "Engineering of Head-mounted Projective Displays", in Proceedings of the Applied Optics, vol. 39, Issue 22, Aug. 1, 2000, 11 Pages.

Izadi, et al., "ThinSight: a Thin Form-Factor Interactive Surface Technology", in Communications of the ACM, vol. 52, No. 12, Dec. 2009, pp. 90-98.

"Final Office Action Issued in U.S. Appl. No. 15/083,008", dated Mar. 4, 2019, 14 Pages.

"Notice of Allowance Issued in Japanese Patent Application No. 2017-207326", dated Mar. 19, 2019, 4 Pages.

"Office Action Issued in Japanese Patent Application No. 2014-560121", dated May 21, 2019, 25 Pages.

"Office Action Issued in European Patent Application No. 191/648,047", dated Jun. 21, 2019, 8 Pages.

"Summons to Attend Oral Proceedings Issued in European Patent Application No. 13861059.7", dated Jun. 19, 2019, 7 Pages.

"Office Action Issued in Korean Patent Application No. 10-2014-7024453", dated Jun. 24, 2019, 15 Pages.

"Notice of Allowance Issued in Korean Patent Application No. 10-2014-7024559", dated Jun. 17, 2019, 7 Pages.

"Office Action Issued in Korean Patent Application No. 10-2014-7024479", dated Jul. 22, 2019, 18 Pages.

"Office Action Issued in Korean Patent Application No. 10-2014-7024479", dated Jan. 30, 2020, 10 Pages.

"Notice of Allowance Issued in Korean Patent Application No. 10-2014-7024487", dated Feb. 10, 2020, 5 Pages.

"Office Action Issued in Korean Patent Application No. 10-2014-7024487", dated Aug. 7, 2019, 10 pages.

"Office Action Issued in Korean Patent Application No. 10-2014-7024500", dated Aug. 7, 2019, 15 Pages.

"Office Action Issued in Korean Patent Application No. 10-2014-7024552", dated Aug. 7, 2019, 14 Pages.

"Office Action Issued in Korean Patent Application No. 10-2014-7024555", dated Jul. 22, 2019, 14 Pages.

"Office Action Issued in Korean Patent Application No. 10-2014-7024555", dated Jan. 20, 2020, 10 Pages.

"Office Action Issued in Korean Patent Application No. 10-2014-7024564", dated Jan. 9, 2020, 10 Pages.

"Office Action Issued in Korean Patent Application No. 10-2014-7024564", dated Jul. 25, 2019, 9 Pages.

"Office Action Issued in European Patent Application No. 13758583.2", dated Sep. 26, 2019, 6 Pages.

"Summons to Attend Oral Proceedings Issued in European Patent Application No. 13857958.6", dated Aug. 2, 2019, 9 Pages.

"Office Action Issued in European Patent Application No. 13859280.3", dated Aug. 23, 2019, 5 Pages.

"Final Office Action Issued in U.S. Appl. No. 15/083,008", dated Jan. 16, 2020, 14 Pages.

"Non-Final Office Action Issued in U.S. Appl. No. 15/083,008", dated Feb. 28, 2020, 14 Pages.

"Non-Final Office Action Issued in U.S. Appl. No. 15/083,008", dated Jul. 19, 2019, 15 Pages.

"Office Action Issued in European Patent Application No. 18157310.6", dated Apr. 6, 2020, 5 Pages.

"Office Action Issued in Indian Patent Application No. 5767/CHENP/2015", dated Jun. 25, 2020, 6 Pages.

"Office Action Issued in Korean Patent Application No. 10-2020-7016522", dated Jul. 25, 2020, 26 Pages.

"Non-Final Office Action Issued in U.S. Appl. No. 13/471,393", dated Jul. 24, 2020, 22 Pages.

"Office Action Issued in European Patent Application No. 13858620.1", dated Jul. 13, 2020, 5 Pages.

"Extended Search Report Issued in European Patent Application No. 20192228.3", dated Dec. 1, 2020, 8 Pages.

"Office Action Issued in European Patent Application No. 13859280.3", dated Jan. 15, 2021, 5 Pages.

"Office Action Issued in European Patent Application No. 19164804.7", dated Feb. 2, 2021, 4 Pages.

* cited by examiner

PRESSURE SENSITIVE KEYS

RELATED APPLICATIONS

This application is a continuation of and claims priority to U.S. patent application Ser. No. 13/468,882 entitled "Pressure Sensitive Keys" and filed May 10, 2012 which in turn claims priority under 35 U.S.C. § 119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional;" and further this application incorporates the following applications by reference in their entirety:

U.S. patent application Ser. No. 13/470,633, filed May 14, 2012, and titled "Flexible Hinge and Removable Attachment;"

U.S. patent application Ser. No. 13/471,186, filed May 14, 2012, and titled "Input Device Layers and Nesting."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on. However, traditional mobile computing devices often employed a virtual keyboard that was accessed using touchscreen functionality of the device. This was generally employed to maximize an amount of display area of the computing device.

Use of the virtual keyboard, however, could be frustrating to a user that desired to provide a significant amount of inputs, such as to enter a significant amount of text to compose a long email, document, and so forth. Thus, conventional mobile computing devices were often perceived to have limited usefulness for such tasks, especially in comparison with ease at which users could enter text using a conventional keyboard, e.g., of a conventional desktop computer. Use of the conventional keyboards, though, with the mobile computing device could decrease the mobility of the mobile computing device and thus could make the mobile computing device less suited for its intended use in mobile settings.

SUMMARY

Pressure sensitive key techniques are described. In one or more implementations, a pressure sensitive key includes a sensor substrate having one or more conductors and a flexible contact layer spaced apart from the sensor substrate and configured to flex in response to an application of pressure to contact the sensor substrate. The flexible contact layer has a first location that is configured to contact the sensor substrate using force sensitive ink and a second location that is configured to contact the sensor substrate using force sensitive ink such that the second location has increased conductivity than the first location.

In one or more implementations, a pressure sensitive key includes a flexible contact layer configured to flex in response to an application of pressure and a sensor substrate spaced apart from the flexible contact layer and positioned for contact by the flexible contact layer responsive to the application of pressure. The sensor substrate has one or more conductors that are configured to be contacted by the flexible contact layer at first and second locations, the second location configured to have increased conductivity in relation to the first location.

In one or more implementations, a keyboard includes a plurality of pressure sensitive keys configured to initiate inputs of a computing device, each of the plurality of pressure sensitive keys comprising a flexible contact layer spaced apart from a sensor substrate by a spacer layer. The flexible contact layer is configured to flex in response to an application of pressure to contact the sensor substrate to initiate an input, for a computing device, associated with the pressure sensitive key. The sensor substrate has one or more conductors that are configured to be contacted by the flexible contact layer at respective first and second locations, the second location of the sensor substrate and the flexible contact layer configured to have increased conductivity in relation to the first location of the sensor substrate and the flexible contact layer.

In one or more implementations, a device includes at least one pressure sensitive key having a flexible contact layer spaced apart from a sensor substrate by a spacer layer, the flexible contact layer configured to flex responsive to pressure to contact the sensor substrate to initiate an input, for a computing device, associated with the pressure sensitive key. At least one of the flexible contact layer or the sensor substrate are configured to at least partially normalize an output resulting from pressure applied at a first location of the flexible contact layer with an output resulting from pressure applied at a second location of the flexible contact layer that has lesser flexibility than the first location.

In one or more implementations, an input device includes a plurality of pressure sensitive keys configured to initiate corresponding inputs of a computing device. Each of the plurality of pressure sensitive keys is formed from a flexible contact layer spaced apart from a sensor substrate by a spacer layer. A first pressure sensitive key is configured to have a greater sensitivity to pressure than a second pressure sensitive key through configuration of at least one of respective said flexible contact layers or respective said sensor substrates.

In one or more implementations, a keyboard includes a plurality of pressure sensitive keys configured to initiate inputs of a computing device, each of the plurality of pressure sensitive keys includes a flexible contact layer spaced apart from a sensor substrate by a spacer layer. The flexible contact layer is configured to flex responsive to a pressure to contact the sensor substrate to initiate an input associated with the pressure sensitive key for a computing device. At least one of the flexible contact layer or the sensor substrate are configured to at least partially normalize an output resulting from pressure applied at a first location of the flexible contact layer with an output resulting from pressure applied at a second location of the flexible contact layer, the second location positioned closer to an edge of the spacer layer than the first location.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Pressure sensitive keys may be used as part of an input device to support a relatively thin form factor, such as less than approximately 3.5 millimeters. However, pressure sensitive keys may not provide a degree of feedback that is common with conventional mechanical keyboards and therefore may result in missed hits and partial hits to intended keys of the keyboard. Further, conventional configuration of the pressure sensitive keys often resulted in different sensitivities due to the flexibility of the material being deflected, e.g., greater deflection is generally observed at a central area of the key as opposed to an edge of the key. Therefore, conventional pressure sensitive keys could result in an inconsistent user experience with a device that employs the keys.

Pressure sensitive key techniques are described. In one or more implementations, a pressure sensitive key is configured to provide a normalized output, e.g., to counteract differences in the flexibility at different positions of the pressure sensitive key. For example, sensitivity at an edge of a key may be increased in comparison with the sensitivity at a center of the key to address the differences in flexibility of the key at those positions.

The sensitivity may be adjusted in a variety of ways. For example, sensitivity may be adjusted by increasing an amount of force sensitive ink at the edges of a flexible contact layer as opposed to a center of the flexibility contact layer. In another example, an amount of conductors available to be contacted in a sensor substrate may be increased. This may be performed in a variety of ways, such as through arrangement of gaps, amount of conductive material, surface area, and so on at an edge of a sensor substrate that is contacted by the flexible contact layer as opposed to at a center of the sensor substrate.

Sensitivity may also be adjusted for different keys. For example, keys that are more likely to receive a lighter pressure (e.g., a key at a bottom row, positioned near the edges of a keyboard, and so on) may be configured to have increased sensitivity in comparison with a key that is likely to receive a higher amount of pressure, e.g., such as keys in a home row. In this way, normalization may also be performed between keys of a keyboard as well as at the keys themselves. Further discussion of these and other features may be found in relation to the following sections.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures.

Example Environment

Figure 1:
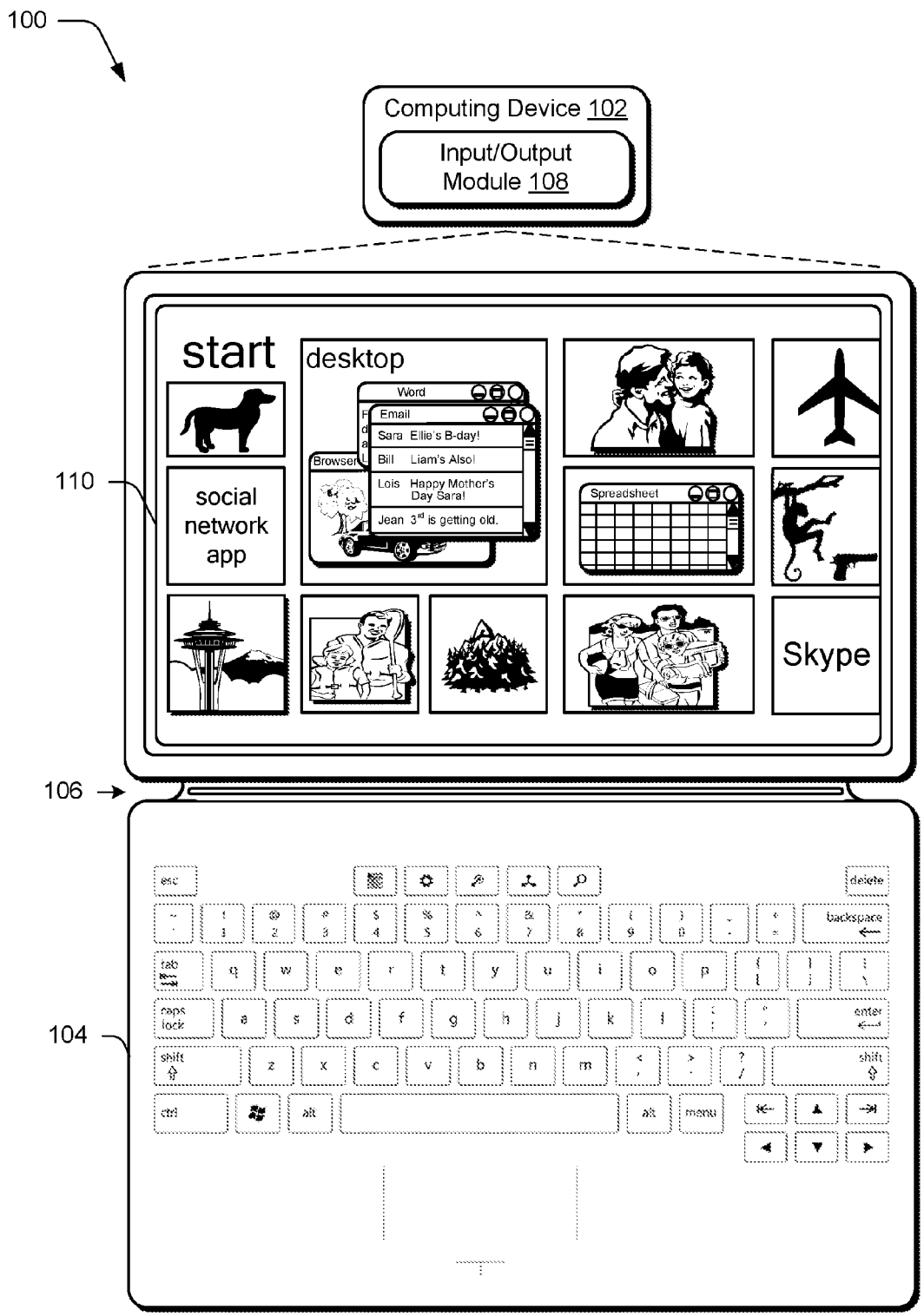
FIG. 1 is an illustration of an environment in an example implementation that is operable to employ the techniques described herein.

FIG. 1 is an illustration of an environment 100 in an example implementation that is operable to employ the techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by the display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as a keyboard having a QWERTY arrangement of keys although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one direction (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 may be configured in a variety of ways, further discussion of which may be found in relation to the following figure.

Figure 2:
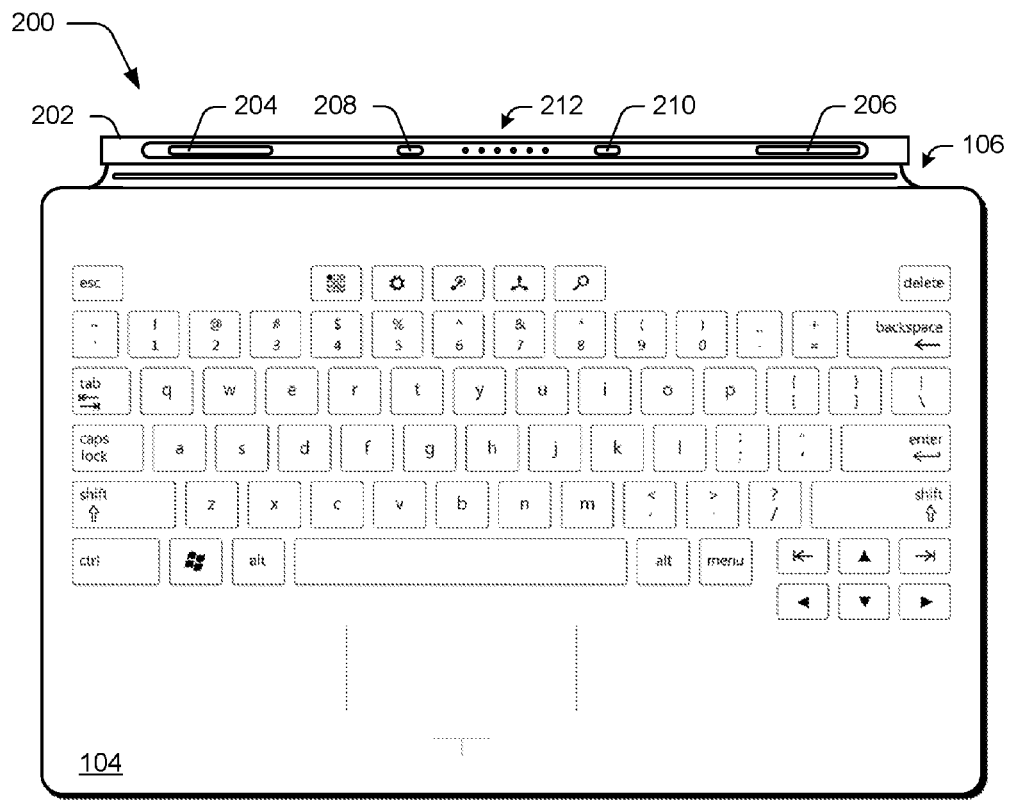
FIG. 2 depicts an example implementation of an input device of FIG. 1 as showing a flexible hinge in greater detail.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. In this example, the connection portion 202 has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device the combination of the connection portion 202 and the flexible hinge 106 supports movement of the input device 104 in relation to the computing device 102 that is similar to a hinge of a book.

For example, rotational movement may be supported by the flexible hinge 106 such that the input device 104 may be placed against the display device 110 of the computing device 102 and thereby act as a cover. The input device 104 may also be rotated so as to be disposed against a back of the computing device 102, e.g., against a rear housing of the computing device 102 that is disposed opposite the display device 110 on the computing device 102.

Naturally, a variety of other orientations are also supported. For instance, the computing device 102 and input device 104 may assume an arrangement such that both are laid flat against a surface as shown in FIG. 1. In another instance, a typing arrangement may be supported in which the input device 104 is laid flat against a surface and the computing device 102 is disposed at an angle to permit viewing of the display device 110, e.g., such as through use of a kickstand disposed on a rear surface of the computing device 102. Other instances are also contemplated, such as a tripod arrangement, meeting arrangement, presentation arrangement, and so forth.

The connecting portion 202 is illustrated in this example as including magnetic coupling devices 204, 206, mechanical coupling protrusions 208, 210, and a plurality of communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connecting portion 202 also includes mechanical coupling protrusions 208, 210 to form a mechanical physical connection between the input device 104 and the computing device 102. The mechanical coupling protrusions 208, 210 are shown in greater detail in the following figure.

Figure 3:
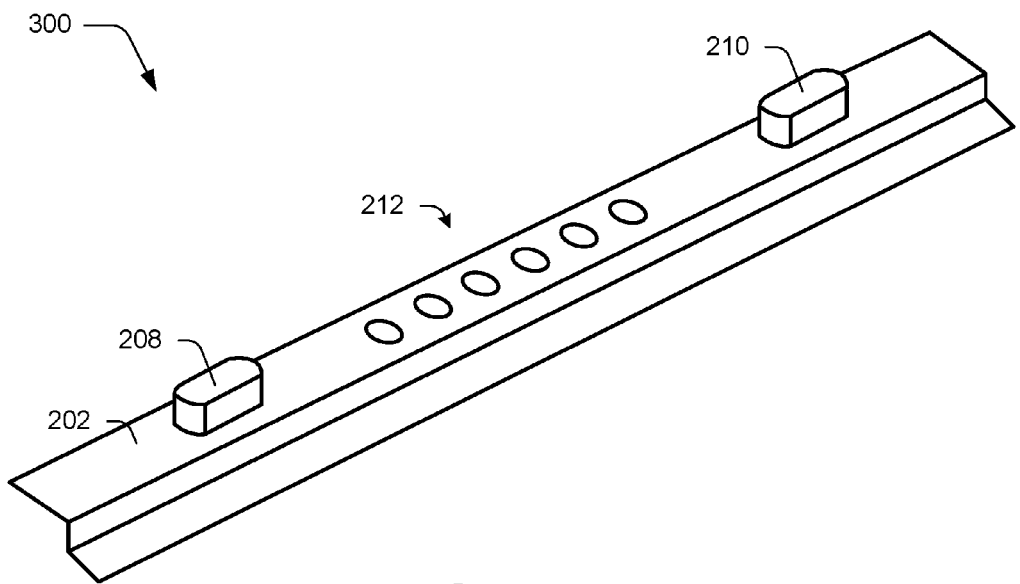
FIG. 3 depicts an example implementation showing a perspective view of a connecting portion of FIG. 2 that includes mechanical coupling protrusions and a plurality of communication contacts.

FIG. 3 depicts an example implementation 300 shown a perspective view of the connecting portion 202 of FIG. 2 that includes the mechanical coupling protrusions 208, 210 and the plurality of communication contacts 212. As illustrated, the mechanical coupling protrusions 208, 210 are configured to extend away from a surface of the connecting portion 202, which in this case is perpendicular although other angles are also contemplated.

The mechanical coupling protrusions 208, 210 are configured to be received within complimentary cavities within the channel of the computing device 102. When so received, the mechanical coupling protrusions 208, 210 promote a mechanical binding between the devices when forces are applied that are not aligned with an axis that is defined as correspond to the height of the protrusions and the depth of the cavity.

For example, when a force is applied that does coincide with the longitudinal axis described previously that follows the height of the protrusions and the depth of the cavities, a user overcomes the force applied by the magnets solely to separate the input device 104 from the computing device 102. However, at other angles the mechanical coupling protrusion 208, 210 are configured to mechanically bind within the cavities, thereby creating a force to resist removal of the input device 104 from the computing device 102 in addition to the magnetic force of the magnetic coupling devices 204, 206. In this way, the mechanical coupling protrusions 208, 210 may bias the removal of the input device 104 from the computing device 102 to mimic tearing a page from a book and restrict other attempts to separate the devices.

The connecting portion 202 is also illustrated as including a plurality of communication contacts 212. The plurality of communication contacts 212 is configured to contact corresponding communication contacts of the computing device 102 to form a communicative coupling between the devices. The communication contacts 212 may be configured in a variety of ways, such as through formation using a plurality of spring loaded pins that are configured to provide a consistent communication contact between the input device 104 and the computing device 102. Therefore, the communication contact may be configured to remain during minor movement of jostling of the devices. A variety of other examples are also contemplated, including placement of the pins on the computing device 102 and contacts on the input device 104.

Figure 4:
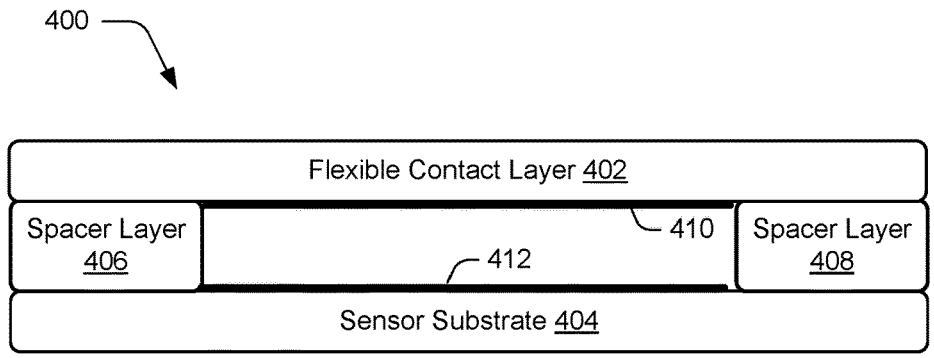
FIG. 4 depicts an example of a cross-sectional view of a pressure sensitive key of a keyboard of the input device of FIG. 2.

FIG. 4 depicts an example of a cross-sectional view of a pressure sensitive key 400 of a keyboard of the input device 104 of FIG. 2. The pressure sensitive key 400 in this example is illustrated as being formed using a flexible contact layer 402 (e.g., Mylar) that is spaced apart from the sensor substrate 404 using a spacer layer 406, 408, which may be formed as another layer of Mylar, formed on the sensor substrate 404, and so on. In this example, the flexible contact layer 402 does not contact the sensor substrate 404 absent application of pressure against the flexible contact layer 402.

The flexible contact layer 402 in this example includes a force sensitive ink 410 disposed on a surface of the flexible contact layer 402 that is configured to contact the sensor substrate 404. The force sensitive ink 410 is configured such that an amount of resistance of the ink varies directly in relation to an amount of pressure applied. The force sensitive ink 410, for instance, may be configured with a relatively rough surface that is compressed against the sensor substrate 404 upon an application of pressure against the flexible contact layer 402. The greater the amount of pressure, the more the force sensitive ink 410 is compressed, thereby increasing conductivity and decreasing resistance of the force sensitive ink 410. Other conductors may also be disposed on the flexible contact layer 402 without departing form the spirit and scope therefore, including other types of pressure sensitive and non-pressure sensitive conductors.

The sensor substrate 404 includes one or more conductors 412 disposed thereon that are configured to be contacted by the force sensitive ink 410 of the flexible contact layer 402. When contacted, an analog signal may be generated for processing by the input device 104 and/or the computing device 102, e.g., to recognize whether the signal is likely intended by a user to provide an input for the computing device 102. A variety of different types of conductors 412 may be disposed on the sensor substrate 404, such as formed from a variety of conductive materials (e.g., silver, copper), disposed in a variety of different configurations as further described in relation to FIG. 9, and so on.

Figure 5:
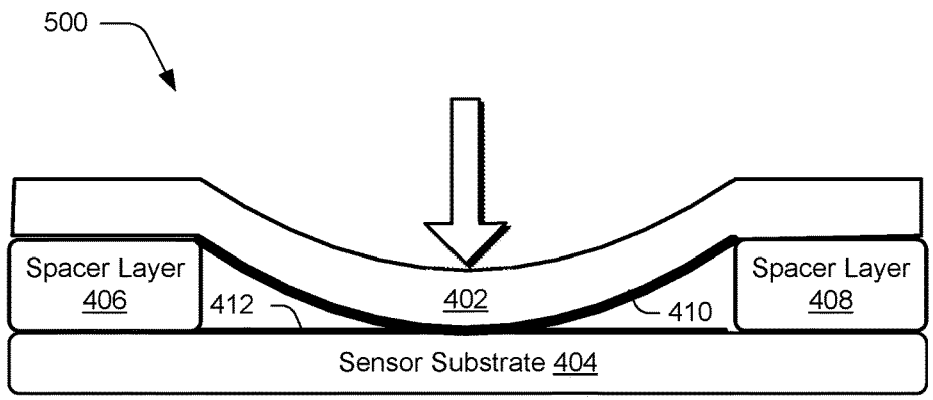
FIG. 5 depicts an example of a pressure sensitive key of FIG. 4 as having pressure applied at a first location of a flexible contact layer to cause contact with a corresponding first location of a sensor substrate.

FIG. 5 depicts an example 500 of the pressure sensitive key 400 of FIG. 4 as having pressure applied at a first location of the flexible contact layer 402 to cause contact of the force sensitive ink 410 with a corresponding first location of the sensor substrate 404. The pressure is illustrated through use of an arrow in FIG. 5 and may be applied in a variety of ways, such as by a finger of a user's hand, stylus, pen, and so on. In this example, the first location at which pressure is applied as indicated by the arrow is located generally near a center region of the flexible contact layer 402 that is disposed between the spacer layers 406, 408. Due to this location, the flexible contact layer 402 may be considered generally flexible and thus responsive to the pressure.

This flexibility permits a relatively large area of the flexible contact layer 402, and thus the force sensitive ink 410, to contact the conductors 412 of the sensor substrate 404. Thus, a relatively strong signal may be generated. Further, because the flexibility of the flexible contact layer 402 is relatively high at this location, a relatively large amount of the force may be transferred through the flexible contact layer 402, thereby applying this pressure to the force sensitive ink 410. As previously described, this increase in pressure may cause a corresponding increase in conductivity of the force sensitive ink and decrease in resistance of the ink. Thus, the relatively high amount of flexibility of the flexible contact layer at the first location may cause a relatively stronger signal to be generated in comparison with other locations of the flexible contact layer 402 that located closer to an edge of the key, an example of which is described in relation to the following figure.

Figure 6:
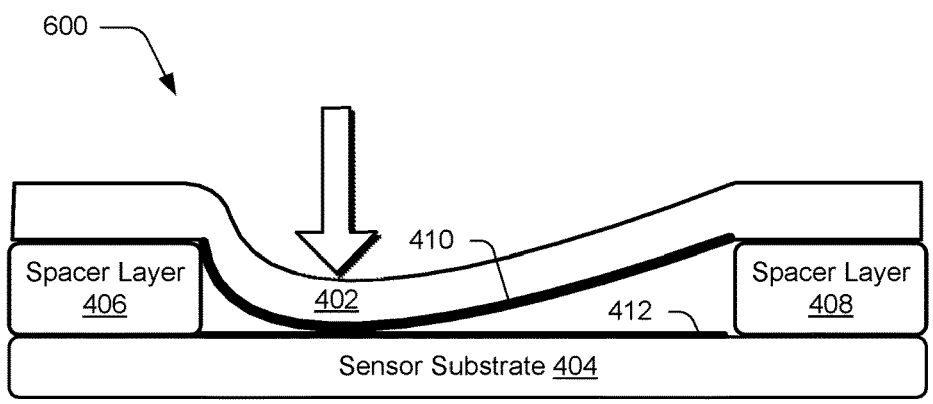
FIG. 6 depicts an example of the pressure sensitive key of FIG. 4 as having pressure applied at a second location of the flexible contact layer to cause contact with a corresponding second location of the sensor substrate.

FIG. 6 depicts an example 600 of the pressure sensitive key 400 of FIG. 4 as having pressure applied at a second location of the flexible contact layer 402 to cause contact with a corresponding second location of the sensor substrate 404. In this example, the second location of FIG. 6 at which pressure is applied is located closer to an edge of the pressure sensitive key (e.g., closer to an edge of the spacer layer 406) than the first location of FIG. 5. Due to this location, the flexible contact layer 402 has reduced flexibility when compared with the first location and thus less responsive to pressure.

This reduced flexibility may cause a reduction in an area of the flexible contact layer 402, and thus the force sensitive ink 410, that contacts the conductors 412 of the sensor substrate 404. Thus, a signal produced at the second location may be weaker than a signal produced at the first location of FIG. 5.

Further, because the flexibility of the flexible contact layer 402 is relatively low at this location, a relatively low amount of the force may be transferred through the flexible contact layer 402, thereby reducing the amount of pressure transmitted to the force sensitive ink 410. As previously described, this decrease in pressure may cause a corresponding decrease in conductivity of the force sensitive ink and increase in resistance of the ink in comparison with the first location of FIG. 5. Thus, the reduced flexibility of the flexible contact layer 402 at the second location in comparison with the first location may cause a relatively weaker signal to be generated. Further, this situation may be exacerbated by a partial hit in which a smaller portion of the user's finger is able to apply pressure at the second location of FIG. 6 in comparison with the first location of FIG. 5.

However, as previously described techniques may be employed to normalize outputs produced by the switch at the first and second locations. This may be performed in a variety of ways, such as through configuration of the flexible contact layer 402 as described in relation to FIG. 7, use of a plurality of sensors as described in relation to FIG. 8, configuration of the sensor substrate 404 as described in relation to FIG. 9, and combinations thereof as further described in relation to the following figures.

Figure 7:
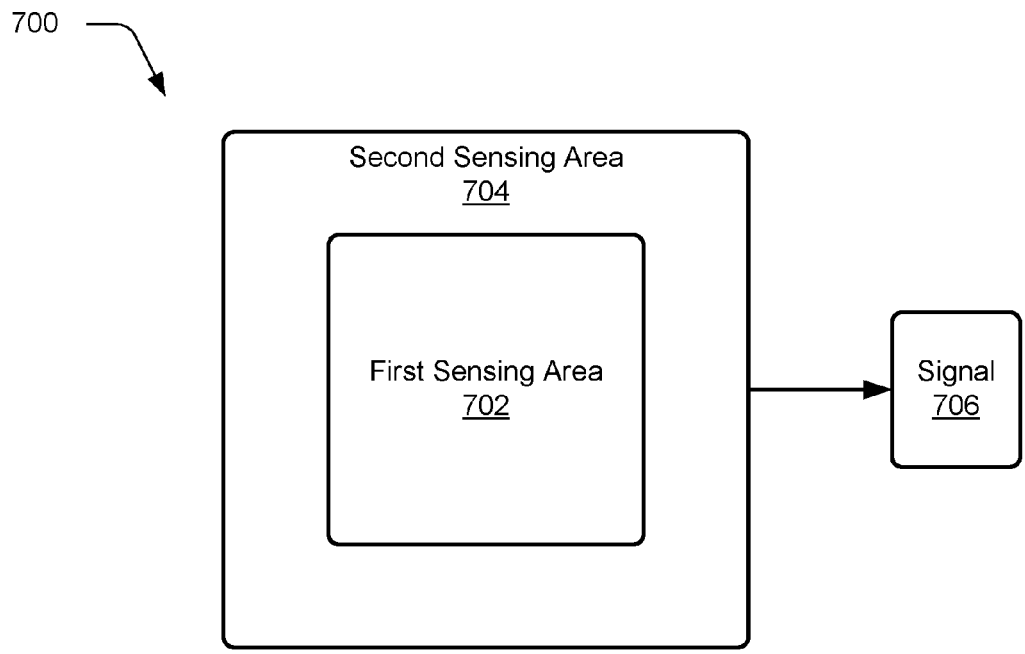
FIG. 7 illustrates an example of the flexible contact layer of a single pressure sensitive key that is configured to normalize outputs generated at a plurality of locations of the switch.

FIG. 7 illustrates an example 700 of the flexible contact layer of a single pressure sensitive key that is configured to normalize outputs generated at a plurality of locations of the switch. In this example, a view of the "bottom" or "underside" of the flexible contact layer 402 of FIG. 4 is shown that is configured to contact the conductors 412 of the sensor substrate 404.

The flexible contact layer 402 is illustrated as having first and second sensing areas 702, 704. The first sensing area 702 in this example corresponds generally to the first location at which pressure was applied in FIG. 5 and the second sensing area 704 corresponds generally to the second location at which pressure was applied in FIG. 6.

As previously described, flexing of the flexible contact layer 402 due to changes in distances from an edge of the switch may cause relatively stronger signals to be generated as distances increase from an edge of the key. Therefore, in this example the first and second sensing areas 702, 704 are configured to normalize the signals 706 generated at the different locations. This may be done in a variety of ways, such as by having a higher conductivity and less resistance at the second sensing area 704 in comparison with the first sensing area 702.

The differences in conductivity and/or resistance may be achieved using a variety of techniques. For example, one or more initial layers of a force sensitive ink may be applied to the flexible contact layer 402 that covers the first and second sensing areas 704, 702, such as through use of a silk screen, printing process, or other process by which the ink may be disposed against the surface. One or more additional layers may then be applied to the second sensing area 704 and not the first sensing area 702.

This causes the second sensing area 704 to have a greater amount (e.g., thickness) of the force sensitive ink than the first sensing area 702 for a given area, which causes a corresponding increase in conductivity and decrease in resistance. Therefore, this technique may serve to at least partially counteract the differences in flexibility of the flexible contact layer 404 at different locations. In this example, an increased height of the force sensitive ink at the second sensing area 704 may also act to reduce an amount of flexing involved in generating contact with the conductors 412 of the sensor substrate 404, which may also help to normalize the signals.

The differences in conductivity and/or resistance at the first and second sensing areas 702, 704 may be achieved in a variety of other ways. For example, a first force sensitive ink may be applied at the first sensing area 702 and a second force sensitive ink having a higher conductivity and/or resistance may be applied at the second sensing area 704. Further, although an arrangement of first and second sensing areas 702, 704 as "nested" is shown in FIG. 7, a variety of other arrangements may also be employed, such as to further increase sensitivity at the corners of the switch, employ more than two sensing areas having different sensitivities to pressure, use of a gradient of conductivities, and so forth. Other examples are also contemplated, such as to support use of a plurality of sensors for a single key, an example of which is described in relation to the following figure.

Figure 8:
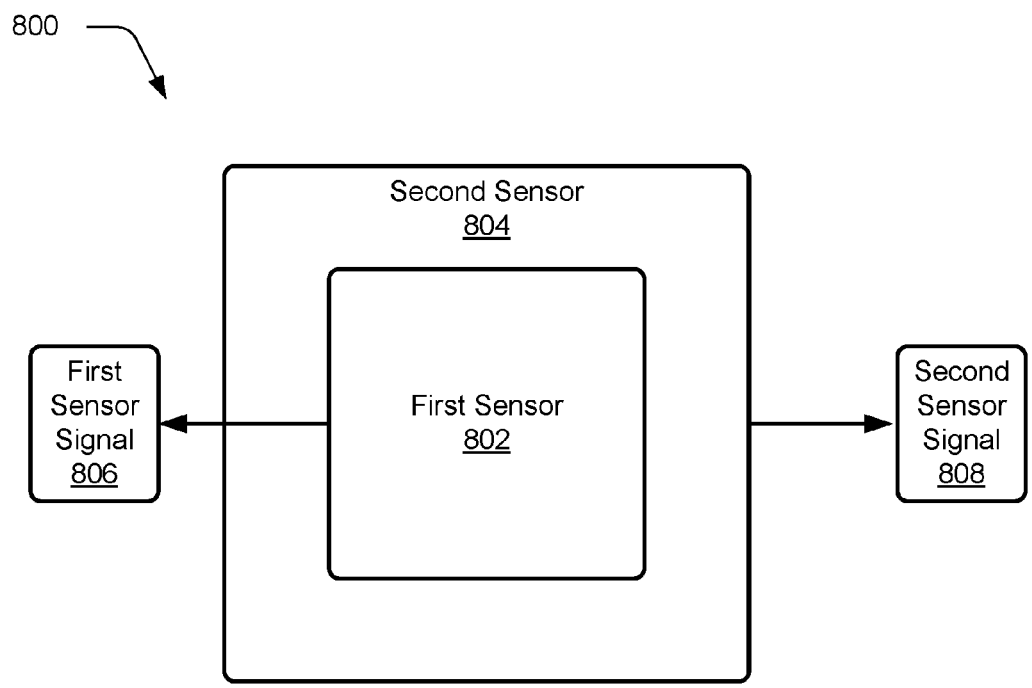
FIG. 8 depicts an example of a pressure sensitive key of FIG. 4 that includes a plurality of sensors to detect pressure at different locations.

FIG. 8 depicts an example 800 of a pressure sensitive key of FIG. 4 that includes a plurality of sensors to detect pressure at different locations. As previously described, miss hits and limitations of flexibility may cause reduced performance at edges of a pressure sensitive key.

Accordingly, in this example a first sensor 802 and a second sensor 804 are employed to provide respective first and second sensor signals 806, 808, respectively. Further, the second sensor 804 is configured to have increased sensitivity (e.g., higher conductivity and/or lower resistance) that the first sensor 802. This may be achieved in a variety of ways, such as through different conductors and configurations of the conductors to act as sensors as part of the sensor substrate 404. Other configurations of the sensor substrate 404 may also be made to normalize 404 signals generated by the pressure sensitive key at different locations of the key, an example of which is described in relation to the discussion of the following figure.

Figure 9:
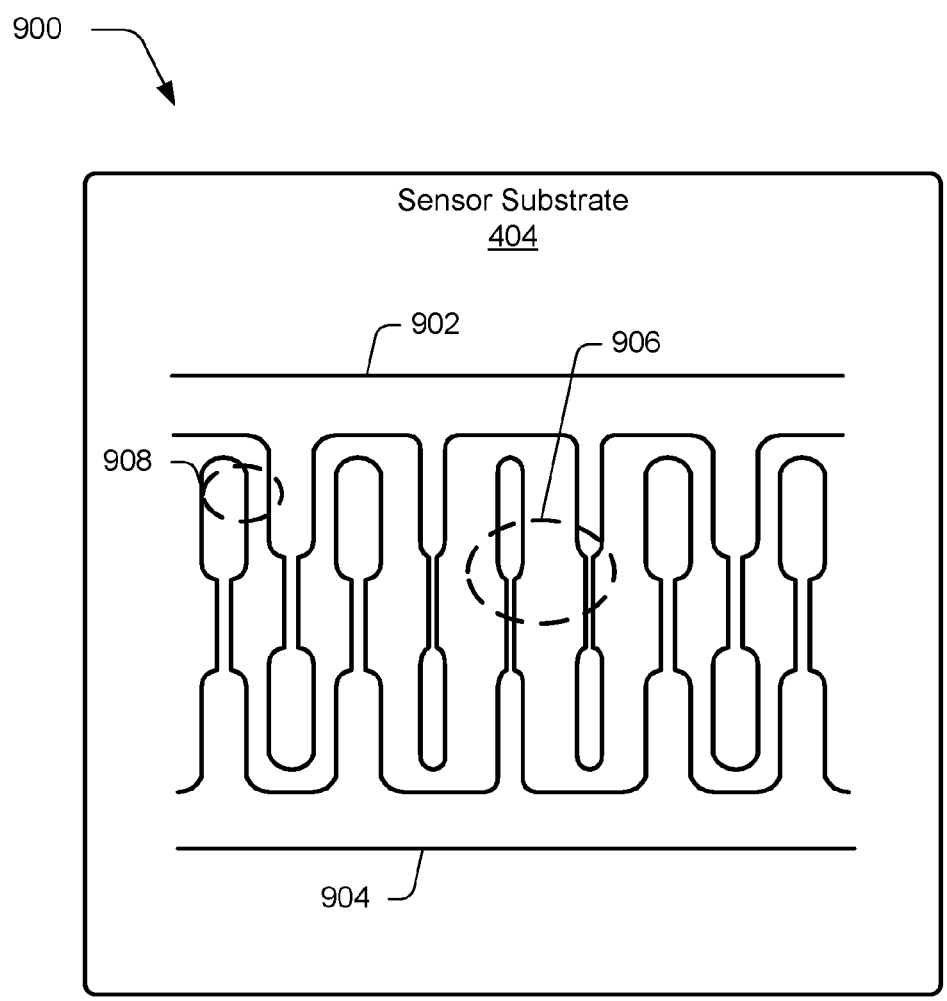
FIG. 9 depicts an example of conductors of a sensor substrate of a pressure sensitive key that is configured to normalize signals generated at different locations of the pressure sensitive key.

FIG. 9 depicts an example of conductors 412 of a sensor substrate 404 that are configured to normalize signals generated at different locations of a pressure sensitive key. In this example, conductors 412 of the sensor substrate 404 are configured in first and second portions 902, 904 of interdigitated trace fingers. Surface area, amount of conductors, and gaps between the conductors are used in this example to adjust sensitivity at different locations of the sensor substrate 404.

For example, pressure may be applied to a first location 906 may cause a relatively larger area of the force sensitive ink 410 of the flexible contact layer 402 to contact the conductors in comparison with a second location 908 of the sensor substrate 404. As shown in the illustrated example, an amount of conductor contacted at the first location 906 is normalized by an amount of conductor contacted at the second portion 906 through use of gap spacing and conductor size. In this way, by using smaller conductors (e.g., thinner fingers) and larger gaps at the center of the key as opposed to the edge of the key specific performance characteristics for the keys may be adjusted to suite typical user input scenarios. Further, these techniques for configuring the sensor substrate 404 may be combined with the techniques described for configuring the flexible contact layer 402 to further promote normalization and desired user input scenarios.

Returning again to FIG. 2, these techniques may also be leveraged to normalize and support desired configuration of different keys, such as to normalize a signal generated by a first key of a keyboard of the input device 104 with a signal generated by a second key of the keyboard. As shown in the QWERTY arrangement of FIG. 3 (although this is equally applicable to other arrangements), users are more likely to apply greater typing pressure to a home row of keys located at a center of the input device 104 than keys located closer to the edges of the device. This may include initiation using fingernails of a user's hand for the shift key row as well as an increased distance to reach for the numbers, different strengths of different fingers (index versus pinky finger), and so on.

Accordingly, the techniques described above may also be applied to normalize signals between these keys, such as to increase sensitivity of number keys in relation to home row keys, increase sensitivity of "pinky" keys (e.g., the letter "a" and semicolon key) as opposed to index finger keys (e.g., the letters "f," "g," "h," and "j"), and so forth. A variety of other examples are also contemplated involving changes to sensitivity, such as to make keys having a smaller surface area (e.g., the delete button in the figure) more sensitive in comparison with larger keys, such as the shift keys, spacebar, and so forth.

Example System and Device

Figure 10:
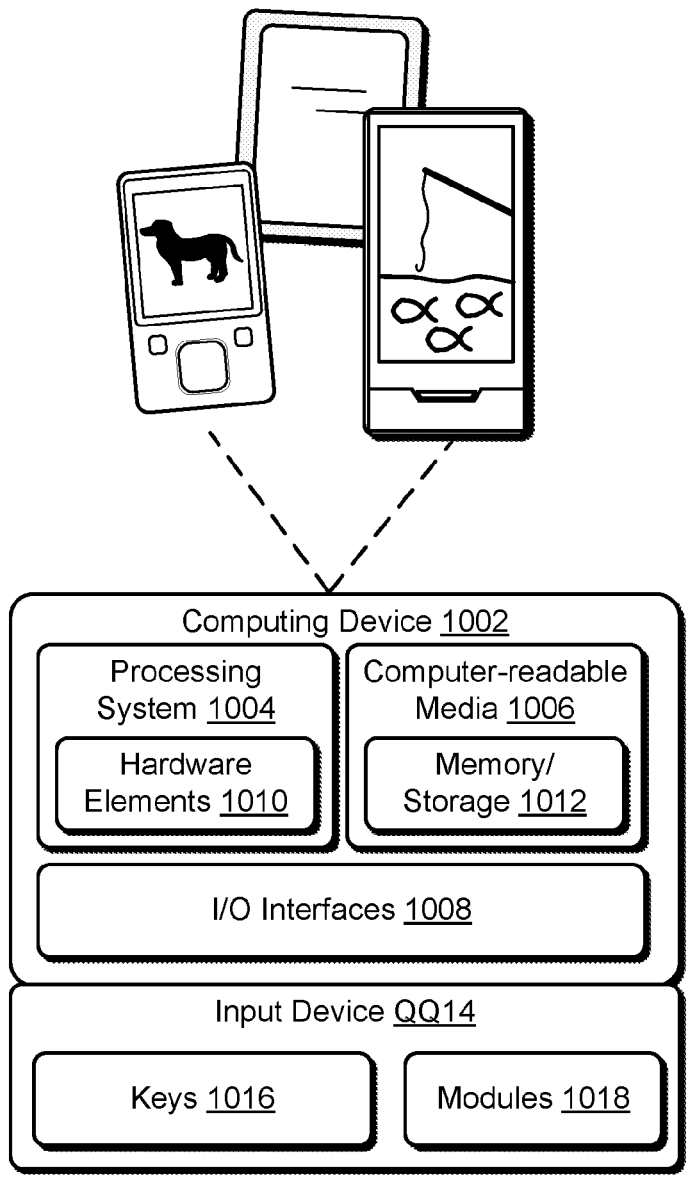
FIG. 10 illustrates an example system including various components of an example device that can be implemented as any type of computing device as described with reference to FIGS. 1-9 to implement embodiments of the techniques described herein.

FIG. 10 illustrates an example system generally at 1000 that includes an example computing device 1002 that is representative of one or more computing systems and/or devices that may implement the various techniques described herein. The computing device 1002 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1002 as illustrated includes a processing system 1004, one or more computer-readable media 1006, and one or more I/O interface 1008 that are communicatively coupled, one to another. Although not shown, the computing device 1002 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1004 is representative of functionality to perform one or more operations using hardware. Accordingly, the processing system 1004 is illustrated as including hardware element 1010 that may be configured as processors, functional blocks, and so forth. This may include implementation in hardware as an application specific integrated circuit or other logic device formed using one or more semiconductors. The hardware elements 1010 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1006 is illustrated as including memory/storage 1012. The memory/storage 1012 represents memory/storage capacity associated with one or more computer-readable media. The memory/storage component 1012 may include volatile media (such as random access memory (RAM)) and/or nonvolatile media (such as read only memory (ROM), Flash memory, optical disks, magnetic disks, and so forth). The memory/storage component 1012 may include fixed media (e.g., RAM, ROM, a fixed hard drive, and so on) as well as removable media (e.g., Flash memory, a removable hard drive, an optical disc, and so forth). The computer-readable media 1006 may be configured in a variety of other ways as further described below.

Input/output interface(s) 1008 are representative of functionality to allow a user to enter commands and information to computing device 1002, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1002 may be configured in a variety of ways to support user interaction.

The computing device 1002 is further illustrated as being communicatively and physically coupled to an input device 1014 that is physically and communicatively removable from the computing device 1002. In this way, a variety of different input devices may be coupled to the computing device 1002 having a wide variety of configurations to support a wide variety of functionality. In this example, the input device 1014 includes one or more keys 1016, which may be configured as pressure sensitive keys, mechanically switched keys, and so forth.

The input device 1014 is further illustrated as include one or more modules 1018 that may be configured to support a variety of functionality. The one or more modules 1018, for instance, may be configured to process analog and/or digital signals received from the keys 1016 to determine whether a keystroke was intended, determine whether an input is indicative of resting pressure, support authentication of the input device 1014 for operation with the computing device 1002, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1002. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1002, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1010 and computer-readable media 1006 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1010. The computing device 1002 may be configured to implement particular instructions and/or functions corresponding to the software and/or hardware modules. Accordingly, implementation of a module that is executable by the computing device 1002 as software may be achieved at least partially in hardware, e.g., through use of computer-readable storage media and/or hardware elements 1010 of the processing system 1004. The instructions and/or functions may be executable/operable by one or more articles of manufacture (for example, one or more computing devices 1002 and/or processing systems 1004) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A pressure sensitive key of a keyboard, the pressure sensitive key comprising:
    a sensor substrate having one or more conductors; and
    a flexible contact layer spaced apart from the sensor substrate and configured to flex in response to an application of pressure to contact the sensor substrate, the flexible contact layer having a force sensitive ink disposed on the underside of the flexible contact layer and having:
        a first sensing area that is configured to contact the sensor substrate using the force sensitive ink; and
        a second sensing area that is configured to contact the sensor substrate using the force sensitive ink, the force sensitive ink in the second sensing area having a higher conductivity than the force sensitive ink in the first sensing area, the first sensing area and the second sensing area being configured to normalize signals generated at the first sensing area and the second sensing area.

2. The pressure sensitive key as recited in claim 1, the force sensitive ink in the second sensing area having less resistance than the force sensitive ink in the first sensing area.

3. The pressure sensitive key as recited in claim 1, the second sensing area surrounding the first sensing area.

4. The pressure sensitive key as recited in claim 1 wherein the sensor substrate includes a plurality of conductors configured to be contacted by the force sensitive ink at corresponding first and second sensing areas.

5. The pressure sensitive key as recited in claim 1, wherein the sensor substrate includes one or more conductors that are configured to be contacted by the force sensitive ink at corresponding first and second sensing areas, the second sensing area of the sensor substrate configured to have increased conductivity in relation to the first sensing area of the sensor substrate through use of smaller conductors in the first sensing area of the sensor substrate than in the second sensing area of the sensor substrate.

6. The pressure sensitive key as recited in claim 1, wherein the sensor substrate includes one or more conductors that are configured to be contacted by the force sensitive ink at corresponding first and second sensing areas, the second sensing area of the sensor substrate configured to have increased conductivity in relation to the first sensing area of the sensor substrate through use of larger gaps between conductors in the first sensing area of the sensor substrate than in the second sensing area of the sensor substrate.

7. The pressure sensitive key as recited in claim 1, wherein an amount of the force sensitive ink applied to the second sensing area is greater than an amount of the force sensitive ink applied to the first sensing area.

8. The pressure sensitive key as recited in claim 7, wherein the amount of the force sensitive ink applied to the second sensing area is applied using at least two layers and the amount of the force sensitive ink applied to the first sensing area is applied using fewer layers than the layers used at the second sensing area.

9. The pressure sensitive key as recited in claim 7, the thickness of the force sensitive ink applied to the second sensing area being greater than the thickness of the force sensitive ink applied to the first sensing area.

10. A method of normalizing pressure inputs to multiple areas of a key of a keyboard, the method comprising:
    receiving a first pressure input applied to a first location of a flexible contact layer of the key resulting in force sensitive ink disposed on the underside of the flexible contact layer in a first area contacting a sensor substrate having one or more conductors; and
    receiving a second pressure input applied to a second location of the flexible contact layer of the key resulting in the force sensitive ink disposed on the underside of the flexible contact layer in a second area contacting the sensor substrate, the second pressure input being less pressure than the first pressure input, the force sensitive ink in the second area having a higher conductivity than the force sensitive ink in the first area the first area and the second area being configured to normalize signals generated at the first area and the second area.

11. The method as recited in claim 10, the force sensitive ink in the second area having less resistance than the force sensitive ink in the first area.

12. The method as recited in claim 10, the second area surrounding the first area.

13. The method as recited in claim 10, wherein an amount of the force sensitive ink applied to the second area is greater than an amount of the force sensitive ink applied to the first area.

14. The method as recited in claim 13, wherein the amount of the force sensitive ink applied to the second area is applied using at least two layers and the amount of the force sensitive ink applied to the first area is applied using fewer layers than the layers used at the second area.

15. The method as recited in claim 13, the thickness of the force sensitive ink applied to the second area being greater than the thickness of the force sensitive ink applied to the first area.

16. A keyboard comprising multiple pressure sensitive keys configured to initiate inputs of a computing device, each of the multiple pressure sensitive keys comprising a flexible contact layer spaced apart from a sensor substrate by a spacer layer and having a force sensitive ink disposed on the underside of the flexible contact layer, the flexible contact layer configured to flex in response to an application of pressure such that the force sensitive ink contacts the sensor substrate to initiate an input, for a computing device, associated with the pressure sensitive key, the sensor substrate having one or more conductors that are configured to be contacted by the force sensitive ink, a first key of multiple keys being configured to contact the sensor substrate using the force sensitive ink and a second key of the multiple keys being configured to contact the sensor substrate using the force sensitive ink, the force sensitive ink at the second key having a higher conductivity than the force sensitive ink at the first key, the force sensitive ink at the first key and the force sensitive ink at the second key being configured to normalize signals generated at the first key and the second key.

17. The keyboard as recited in claim 16, the keyboard having a QWERTY arrangement, the first key comprising an index finger key and the second key comprising a pinky key.

18. The keyboard as recited in claim 16, the keyboard having a QWERTY arrangement, the second key having a smaller surface area than the first key.

19. The keyboard as recited in claim 16, the keyboard having a QWERTY arrangement, the first key comprising an key in a home row of keys and the second key comprising a key closer to an edge of the computing device.

20. The keyboard as recited in claim 16, the first key having a first sensing area that is configured to contact the sensor substrate using the force sensitive ink, and a second sensing area that is configured to contact the sensor substrate using the force sensitive ink, the force sensitive ink in the second sensing area having a higher conductivity than the force sensitive ink in the first sensing area.

* * * * *